United States Patent
Yamazaki et al.

(10) Patent No.: US 8,106,398 B2
(45) Date of Patent: Jan. 31, 2012

(54) MICROCRYSTALLINE SEMICONDUCTOR FILM, THIN FILM TRANSISTOR, AND DISPLAY DEVICE INCLUDING THIN FILM TRANSISTOR

(75) Inventors: Shunpei Yamazaki, Setagaya (JP); Yasuhiro Jinbo, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 309 days.

(21) Appl. No.: 12/255,093

(22) Filed: Oct. 21, 2008

(65) Prior Publication Data
US 2009/0101916 A1      Apr. 23, 2009

(30) Foreign Application Priority Data
Oct. 23, 2007   (JP) ................... 2007-275736

(51) Int. Cl.
*H01L 29/38* (2006.01)
(52) U.S. Cl. .............. 257/66; 257/75; 257/E29.003; 257/E29.292
(58) Field of Classification Search ........... 257/49, 257/66, 72, 75, E29.003, E29.292, E31.045, 257/E31.046
See application file for complete search history.

(56) References Cited

U.S. PATENT DOCUMENTS

| | | | |
|---|---|---|---|
| 4,409,134 A | 10/1983 | Yamazaki | |
| 5,101,242 A | 3/1992 | Ikeda et al. | |
| 5,221,631 A | 6/1993 | Ikeda et al. | |
| 5,313,075 A | 5/1994 | Zhang et al. | |
| RE34,658 E | 7/1994 | Yamazaki et al. | |
| 5,453,858 A | 9/1995 | Yamazaki | |
| 5,514,879 A | 5/1996 | Yamazaki | |
| 5,614,732 A | 3/1997 | Yamazaki | |
| 5,701,167 A | 12/1997 | Yamazaki | |
| 5,726,461 A | 3/1998 | Shimada et al. | |
| 5,843,225 A | 12/1998 | Takayama et al. | |
| 5,849,601 A | 12/1998 | Yamazaki | |
| 5,859,445 A | 1/1999 | Yamazaki | |
| 5,932,302 A | 8/1999 | Yamazaki et al. | |
| 5,989,969 A * | 11/1999 | Watanabe et al. | 438/381 |
| 6,011,277 A | 1/2000 | Yamazaki | |
| 6,023,075 A | 2/2000 | Yamazaki | |
| 6,171,674 B1 | 1/2001 | Yamazaki et al. | |

(Continued)

FOREIGN PATENT DOCUMENTS
EP       1 505 174       2/2005
(Continued)

*Primary Examiner* — Benjamin Sandvik
*Assistant Examiner* — Wensing Kuo
(74) *Attorney, Agent, or Firm* — Eric J. Robinson; Robinson Intellectual Property Law Office, P.C.

(57) ABSTRACT

A thin film transistor with excellent electric characteristics and a display device having the thin film transistor are proposed. The thin film transistor includes a gate insulating film formed over a gate electrode; a microcrystalline semiconductor film including an impurity element which serves as a donor, formed over the gate insulating film; a buffer layer formed over the microcrystalline semiconductor film; a pair of semiconductor films to which an impurity element imparting one conductivity type is added, formed over the buffer layer; and wirings formed over the pair of semiconductor films. The concentration of the impurity element which serves as a donor in the microcrystalline semiconductor film is decreased from the gate insulating film side toward the buffer layer, and the buffer layer does not include the impurity element which serves as a donor at a higher concentration than the detection limit of SIMS.

48 Claims, 43 Drawing Sheets

U.S. PATENT DOCUMENTS

| | | |
|---|---|---|
| 6,183,816 B1 | 2/2001 | Yamazaki et al. |
| 6,218,702 B1 | 4/2001 | Yamazaki et al. |
| 6,252,249 B1 | 6/2001 | Yamazaki |
| 6,281,520 B1 | 8/2001 | Yamazaki |
| 6,306,213 B1 | 10/2001 | Yamazaki |
| 6,468,617 B1 | 10/2002 | Yamazaki et al. |
| 6,589,822 B1 | 7/2003 | Yamazaki et al. |
| 6,610,142 B1 | 8/2003 | Takayama et al. |
| 6,737,676 B2 | 5/2004 | Yamazaki |
| 6,773,969 B2 * | 8/2004 | Lee et al. .................. 438/149 |
| 6,835,523 B1 | 12/2004 | Yamazaki et al. |
| 7,067,844 B2 | 6/2006 | Yamazaki |
| 7,098,479 B1 | 8/2006 | Yamazaki |
| 7,115,902 B1 | 10/2006 | Yamazaki |
| 7,205,171 B2 | 4/2007 | Luo et al. |
| 7,375,372 B2 | 5/2008 | Luo et al. |
| 7,420,209 B2 | 9/2008 | Suzawa et al. |
| 7,576,360 B2 | 8/2009 | Yamazaki |
| 2005/0022864 A1 | 2/2005 | Fujioka et al. |
| 2005/0089648 A1 | 4/2005 | Yamazaki et al. |
| 2006/0238132 A1 | 10/2006 | Kitamura et al. |
| 2007/0018165 A1 | 1/2007 | Yamazaki |
| 2009/0029530 A1 * | 1/2009 | Kunii .................. 438/478 |
| 2009/0057672 A1 | 3/2009 | Kobayashi et al. |
| 2009/0090915 A1 | 4/2009 | Yamazaki et al. |
| 2009/0090916 A1 | 4/2009 | Yamazaki et al. |
| 2009/0114921 A1 | 5/2009 | Yamazaki et al. |
| 2009/0140250 A1 | 6/2009 | Yamazaki et al. |
| 2009/0140256 A1 | 6/2009 | Godo et al. |
| 2009/0140259 A1 | 6/2009 | Yamazaki |
| 2009/0218568 A1 | 9/2009 | Dairiki et al. |

FOREIGN PATENT DOCUMENTS

| | | |
|---|---|---|
| JP | 58-092217 | 6/1983 |
| JP | 60-160170 | 8/1985 |
| JP | 63-258072 | 10/1988 |
| JP | 04-242724 | 8/1992 |
| JP | 06-326312 | 11/1994 |
| JP | 11-121761 | 4/1999 |
| JP | 2005-049832 | 2/2005 |
| JP | 2005-167051 | 6/2005 |

* cited by examiner

MICROCRYSTALLINE SEMICONDUCTOR FILM, THIN FILM TRANSISTOR, AND DISPLAY DEVICE INCLUDING THIN FILM TRANSISTOR

BACKGROUND OF THE INVENTION

1. Field of the Invention

The present invention relates to a microcrystalline semiconductor film, a thin film transistor, and a display device including the thin film transistor at least in a pixel portion.

2. Description of the Related Art

In recent years, technology for forming thin film transistors using a thin semiconductor film (with a thickness of from several tens of nanometers to several hundred nanometers, approximately) formed over a substrate having an insulating surface has been attracting attention. Thin film transistors are applied to a wide range of electronic devices such as ICs or electro-optical devices, and prompt development of thin film transistors that are to be used as switching elements in display devices, in particular, is being pushed.

As a switching element in a display device, a thin film transistor including an amorphous semiconductor film, a thin film transistor including a polycrystalline semiconductor film, or the like is used. As a method for forming a polycrystalline semiconductor film, a technique is known in which a pulsed excimer laser beam is processed into a linear shape with an optical system, and an amorphous silicon film is scanned and irradiated with the linear beam, thereby being crystallized.

As a switching element in a display device, further, a thin film transistor including a microcrystalline semiconductor film is used (see Reference 1: Japanese Published Patent Application No. H4-242724 and Reference 2: Japanese Published Patent Application No. 2005-49832).

SUMMARY OF THE INVENTION

A thin film transistor including a polycrystalline semiconductor film has advantages that the field effect mobility thereof is two or more orders of magnitude higher than that of a thin film transistor including an amorphous semiconductor film, and that a pixel portion and a peripheral driver circuit of a display device can be formed over one substrate. However, the thin film transistor including a polycrystalline semiconductor film requires a more complicated process than the thin film transistor including an amorphous semiconductor film because of crystallization of the semiconductor film. Thus, there are problems such as reduction in yield and increase in cost.

Further, an inverted staggered thin film transistor including a microcrystalline semiconductor film has problems in that the crystallinity of an interface region between a gate insulating film and the microcrystalline semiconductor film is low and electric characteristics of the thin film transistor are poor.

In view of the above problems, it is an object to provide a thin film transistor with excellent electric characteristics, a display device including the thin film transistor, and a method for manufacturing the thin film transistor and the display device.

One aspect of the present invention is a microcrystalline semiconductor film which is formed over an insulating film and includes an impurity element which serves as a donor, and the concentration of the impurity element which serves as a donor is decreased from the insulating film side toward the surface of the microcrystalline semiconductor film.

Another aspect of the present invention is a microcrystalline semiconductor film which is formed over an insulating film and includes an impurity element which serves as a donor, and the concentration of the impurity element which serves as a donor is decreased from the insulating film side toward the surface of the microcrystalline semiconductor film, with a slope of from 5 to 120 nm/dec.

Another aspect of the present invention is a thin film transistor including a gate insulating film which is formed over a gate electrode; a microcrystalline semiconductor film including an impurity element which serves as a donor, which is formed over the gate insulating film; a buffer layer which is formed over the microcrystalline semiconductor film including the impurity element which serves as a donor; a pair of semiconductor films to which an impurity element imparting one conductivity type is added and which are formed over the buffer layer; and wirings which are formed over the pair of semiconductor films to which the impurity element imparting one conductivity type is added, in which the concentration of the impurity element which serves as a donor in the microcrystalline semiconductor film is decreased from the gate insulating film side toward the buffer layer, and the buffer layer does not include the impurity element which serves as a donor at a higher concentration than the detection limit of secondary ion mass spectrometry (SIMS).

Another aspect of the present invention is a thin film transistor including a gate insulating film which is formed over a gate electrode; a microcrystalline semiconductor film including an impurity element which serves as a donor, which is formed over the gate insulating film; a buffer layer which is formed over the microcrystalline semiconductor film including the impurity element which serves as a donor; a pair of semiconductor films to which an impurity element imparting one conductivity type is added and which are formed over the buffer layer; and wirings which are formed over the pair of semiconductor films to which the impurity element imparting one conductivity type is added, in which the concentration of the impurity element which serves as a donor in the microcrystalline semiconductor film is decreased from the gate insulating film side toward the buffer layer with a slope of from 5 to 120 nm/dec, preferably from 10 to 50 nm/dec, more preferably from 15 to 30 nm/dec, and the buffer layer does not include the impurity element which serves as a donor at a higher concentration than the detection limit of SIMS.

The concentration of the impurity element which serves as a donor may have a peak at or around the interface between the gate insulating film and the microcrystalline semiconductor film.

The gate insulating film can also include the impurity element which serves as a donor.

The thin film transistor can further include a microcrystalline semiconductor film not including the impurity element which serves as a donor at a higher concentration than the detection limit of SIMS, between the microcrystalline semiconductor film including the impurity element which serves as a donor and the buffer layer.

Here, the concentration of the impurity element which serves as a donor in the gate insulating film or the microcrystalline semiconductor film is from $6\times10^{15}$ to $3\times10^{18}$ atoms/$cm^3$ inclusive, preferably from $1\times10^{16}$ to $3\times10^{18}$ atoms/$cm^3$ inclusive, more preferably from $3\times10^{16}$ to $3\times10^{17}$ atoms/$cm^3$ inclusive. Further, the concentration of the impurity element which serves as a donor is determined by the concentration of the concentration distribution (concentration profile) which is measured by SIMS.

The impurity element which serves as a donor is phosphorus, arsenic, or antimony.

In formation of a microcrystalline semiconductor film, the crystallinity in the microcrystalline semiconductor film and at the interface between the microcrystalline semiconductor film and a gate insulating film can be improved by any of the following steps: forming a gate insulating film including an impurity element which serves as a donor over a gate electrode, adsorbing an impurity element which serves as a donor onto a gate insulating film, mixing a gas including an impurity element which serves as a donor into a source gas of the microcrystalline semiconductor film, and introducing an impurity element which serves as a donor to a reaction chamber in which the microcrystalline semiconductor film is formed. Accordingly, a thin film transistor can be manufactured in which a microcrystalline semiconductor film having high crystallinity at the interface with a gate insulating film is used for a channel formation region.

Further, by forming a microcrystalline semiconductor film including an impurity element which serves as a donor for a microcrystalline semiconductor film in contact with a gate insulating film, crystallinity of the microcrystalline semiconductor film is improved, and the speed of carrier travel (carrier mobility) in the microcrystalline semiconductor film is increased, so that a thin film transistor with high field effect mobility and high on current can be manufactured.

The peak concentration of the impurity element which serves as a donor in the gate insulating film or the microcrystalline semiconductor film is set to be from $6 \times 10^{15}$ to $3 \times 10^{18}$ atoms/cm$^3$ inclusive, preferably from $1 \times 10^{16}$ to $3 \times 10^{18}$ atoms/cm$^3$ inclusive, more preferably from $3 \times 10^{16}$ to $3 \times 10^{17}$ atoms/cm$^3$ inclusive, so that an accumulation-type thin film transistor (i.e., a thin film transistor in which a channel formation region includes an n-type impurity element at a low concentration) can be manufactured. When the peak concentration of the impurity element which serves as a donor in the gate insulating film or the microcrystalline semiconductor film is lower than $6 \times 10^{15}$ atoms/cm$^3$, the amount of the impurity element which serves as a donor is insufficient, and thus increase in the field effect mobility and the on current of the thin film transistor cannot be expected. Further, when the peak concentration of the impurity element which serves as a donor in the gate insulating film or the microcrystalline semiconductor film is higher than $3 \times 10^{18}$ atoms/cm$^3$, the threshold voltage shifts to the minus side, and the transistor does not function well. Therefore, it is preferable that the concentration of the impurity element which serves as a donor be from $6 \times 10^{15}$ to $3 \times 10^{18}$ atoms/cm$^3$ inclusive, preferably from $1 \times 10^{16}$ to $3 \times 10^{18}$ atoms/cm$^3$ inclusive, more preferably from $3 \times 10^{16}$ to $3 \times 10^{17}$ atoms/cm$^3$ inclusive.

Another aspect of the present invention is a method for forming a microcrystalline semiconductor film, in which a gas including an impurity element which serves as a donor of a semiconductor is introduced to a reaction chamber of a plasma CVD apparatus; then, a non-deposition gas including oxygen or nitrogen and a deposition gas including silicon are introduced, and high-frequency power is applied, whereby an insulating film including the impurity element which serves as a donor is formed over a substrate; and a microcrystalline semiconductor film including the impurity element which serves as a donor is formed over the insulating film by using a deposition gas including silicon or germanium, and hydrogen.

Another aspect of the present invention is a method for forming a microcrystalline semiconductor film, in which a non-deposition gas including oxygen or nitrogen and a deposition gas including silicon are introduced to a reaction chamber of a plasma CVD apparatus, and high-frequency power is applied, whereby an insulating film is formed over a substrate; and after introducing a gas including an impurity element which serves as a donor of a semiconductor, a microcrystalline semiconductor film including the impurity element which serves as a donor is formed over the insulating film by using a deposition gas including silicon or germanium, and hydrogen.

Another aspect of the present invention is a method for forming a microcrystalline semiconductor film, in which a non-deposition gas including oxygen or nitrogen and a deposition gas including silicon are introduced, and high-frequency power is applied, whereby a first insulating film is formed over a substrate; after introducing a gas including an impurity element which serves as a donor of a semiconductor to a reaction chamber of a plasma CVD apparatus, a non-deposition gas including oxygen or nitrogen and a deposition gas including silicon are introduced, and high-frequency power is applied, whereby a second insulating film including the impurity element which serves as a donor is formed over the first insulating film; and a microcrystalline semiconductor film including the impurity element which serves as a donor is formed over the second insulating film by using a deposition gas including silicon or germanium, and hydrogen.

Another aspect of the present invention is a method for forming a microcrystalline semiconductor film, in which a non-deposition gas including oxygen or nitrogen and a deposition gas including silicon are introduced, and high-frequency power is applied, whereby a first insulating film is formed over a substrate; a non-deposition gas including oxygen or nitrogen and a deposition gas including silicon are introduced, and high-frequency power is applied, whereby a second insulating film is formed over the first insulating film; after introducing a gas including an impurity element which serves as a donor of a semiconductor to a reaction chamber of a plasma CVD apparatus, a non-deposition gas including oxygen or nitrogen and a deposition gas including silicon are introduced, and high-frequency power is applied, whereby a third insulating film including the impurity element which serves as a donor is formed over the second insulating film; and a microcrystalline semiconductor film including the impurity element which serves as a donor is formed over the third insulating film by using a deposition gas including silicon or germanium, and hydrogen.

Another aspect of the present invention is a method for forming a microcrystalline semiconductor film, in which a protective film is formed on the inner wall of a reaction chamber of a plasma CVD apparatus by using a gas including an impurity element which serves as a donor, a deposition gas including silicon or germanium, and hydrogen; a substrate is carried into the reaction chamber; an insulating film is formed over the substrate; and a microcrystalline semiconductor film is formed over the insulating film by using a deposition gas including silicon or germanium, and hydrogen.

Further, another aspect of the present invention is a method for manufacturing a thin film transistor including the microcrystalline semiconductor film.

Still another aspect of the present invention is that a pixel electrode connected to the thin film transistor is formed and a display device is manufactured.

Further, thin film transistors (TFT's) are manufactured using the microcrystalline semiconductor film of the present invention, and a display device is manufactured using the thin film transistors for a pixel portion and further for a driver circuit. Since the microcrystalline semiconductor film of the present invention has high crystallinity at the interface with a gate insulating film, a thin film transistor including the microcrystalline semiconductor film has a field effect mobility of from 2.5 to 10 cm$^2$/V·sec, which is 5 to 20 times as high as that of a thin film transistor including an amorphous semiconductor film; thus, a part of the driver circuit or the entire driver circuit can be formed over the same substrate as that of the pixel portion, so that a system-on-panel can be manufactured.

Display devices include light-emitting devices and liquid crystal display devices. A light-emitting device includes a light-emitting element, and a liquid crystal display device includes a liquid crystal element. A light-emitting element includes, in its category, an element whose luminance is controlled with current or voltage; specifically, an organic electroluminescent (EL) element and an inorganic EL element.

In addition, the display devices include a panel in which a display element is sealed, and a module in which an IC and the like including a controller are mounted on the panel. The present invention relates to one mode of an element substrate before the display element is completed in a manufacturing process of the display device, and the element substrate is provided with a means for supplying current to the display element in each of a plurality of pixels. Specifically, the element substrate may be in a state of being provided with only a pixel electrode of the display element, a state after a conductive film to be a pixel electrode is formed and before the conductive film is etched to form the pixel electrode, or any other states.

A display device in this specification means an image display device, a light-emitting device, or a light source (including a lighting device). Further, the display device includes any of the following modules in its category: a module including a connector such as a flexible printed circuit (FPC), tape automated bonding (TAB) tape, or a tape carrier package (TCP); a module having TAB tape or a TCP which is provided with a printed wiring board at the end thereof; and a module having an integrated circuit (IC) which is directly mounted on a display element by a chip on glass (COG) method.

In accordance with the present invention, a microcrystalline semiconductor film which has high crystallinity can be formed from an interface with an insulating film. In addition, a thin film transistor with excellent electric characteristics can be manufactured by forming a microcrystalline semiconductor film which has high crystallinity from an interface with an insulating film and by using the microcrystalline semiconductor film for a channel formation region. Further, a thin film transistor with excellent electric characteristics can be manufactured by forming a microcrystalline semiconductor film which has high crystallinity and by using the microcrystalline semiconductor film for a channel formation region. Furthermore, a display device having the thin film transistor can be manufactured.

DETAILED DESCRIPTION OF THE INVENTION

Figure 1A:
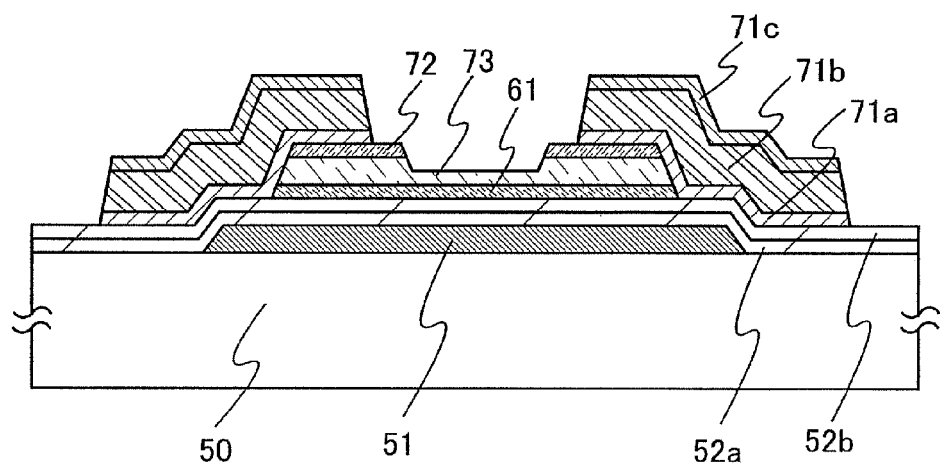
FIG. 1A is a cross-sectional view illustrating a thin film transistor of the present invention.

Hereinafter, embodiment modes and embodiments of the present invention will be described with reference to the drawings. Note that the present invention is not limited to the following description, and it is easily understood by those skilled in the art that the modes and details disclosed herein can be modified in various ways without departing from the spirit and scope of the present invention. Therefore, the present invention should not be interpreted as being limited to the description of the embodiment modes and embodiments to be given below. In the structures of the present invention to be described hereinafter, reference numerals which designate the same parts are used in common in different drawings.

Embodiment Mode 1

Now, structures of thin film transistors will be described with reference to FIGS. 1A to 1C, FIGS. 2A to 2C, FIGS. 3A to 3F, and FIGS. 4A and 4B in which crystallinity of an entire microcrystalline semiconductor film and at an interface between a gate insulating film and the microcrystalline semiconductor film is high, and which have higher field effect mobility and higher on current than a thin film transistor having a conventional microcrystalline semiconductor film in a channel formation region.

In a thin film transistor shown in FIG. 1A, a gate electrode 51 is formed over a substrate 50, gate insulating films 52a and 52b are formed over the gate electrode 51, a microcrystalline semiconductor film 61 including an impurity element which serves as a donor is formed over the gate insulating films 52a and 52b, a buffer layer 73 is formed over the microcrystalline semiconductor film 61, a pair of semiconductor films 72 to which an impurity element imparting one conductivity type is added are formed over the buffer layer 73, and wirings 71a to 71c are formed over the pair of semiconductor films 72 to which the impurity element imparting one conductivity type is added.

Figure 1B:
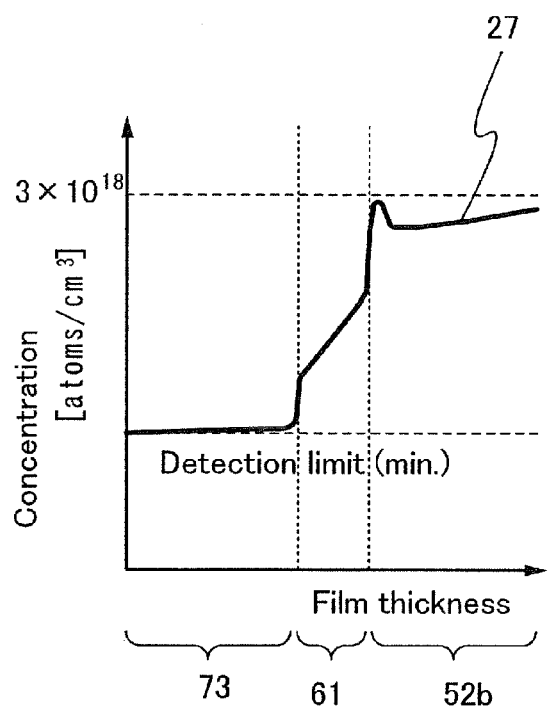
FIGS. 1B and 1C are diagrams each showing a peak concentration of an impurity element in stacked films.
Figure 1C:
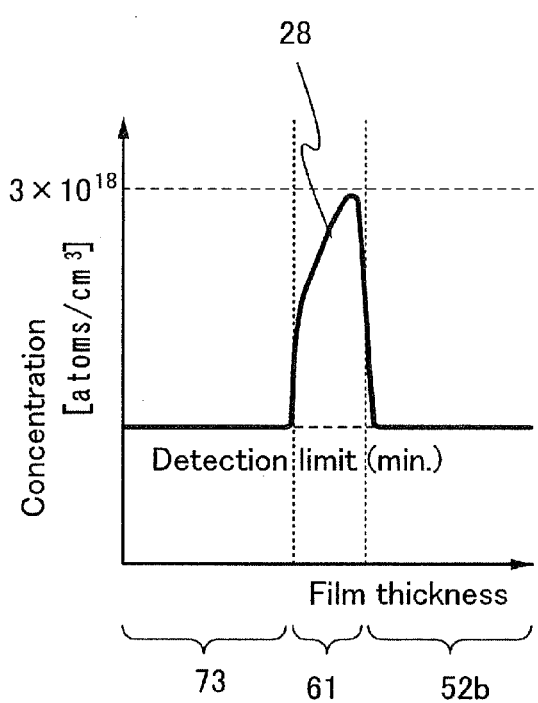

The microcrystalline semiconductor film 61 includes the impurity element which serves as a donor at a peak concentration of from $6\times10^{15}$ to $3\times10^{18}$ atoms/cm$^3$ inclusive, preferably from $1\times10^{16}$ to $3\times10^{18}$ atoms/cm$^3$ inclusive, more preferably from $3\times10^{16}$ to $3\times10^{17}$ atoms/cm$^3$ inclusive. Specifically, the microcrystalline semiconductor film 61 includes the impurity element which serves as a donor at such a concentration as denoted by a curve 27 in FIG. 1B or a curve 28 in FIG. 1C. The concentration of the impurity element which serves as a donor is relatively decreased from the gate insulating film 52b side toward the buffer layer 73. That is, a feature of this mode is that the impurity element which serves as a donor is included at a higher concentration on the gate insulating film 52b side. At the detection limit of SIMS, theoretically, the profile should be flat; practically, however, the profile is not likely to be flat because the signal/noise (S/N) ratio is poor at a low concentration region of ions which are objects to be measured. Therefore, a mean value of the concentrations of ions which are objects to be measured in the low concentration region is set to be the detection limit. Further, as shown in FIG. 1C, the concentration of the impurity element which serves as a donor may have a peak at the interface between the gate insulating film 52b and the microcrystalline semiconductor film 61. The buffer layer 73 does not include the impurity element which serves as a donor at a higher concentration than the detection limit of SIMS. FIGS. 1B and 1C schematically show the concentration of the impurity element which serves as a donor in the gate insulating film 52b, the microcrystalline semiconductor film 61, and the buffer layer 73, and the horizontal axis represents the thickness and the vertical axis represents the concentration of the impurity element which serves as a donor.

Examples of the microcrystalline semiconductor film are a microcrystalline silicon film, a microcrystalline silicon film including germanium, and the like. Further, examples of the impurity element which serves as a donor are phosphorus, arsenic, antimony, and the like.

The concentration of the impurity element which serves as a donor and is included in the microcrystalline semiconductor film is set to be in the above range, whereby the interface between the gate insulating film 52b and the microcrystalline semiconductor film 61 can have improved crystallinity, and the microcrystalline semiconductor film 61 at the interface with the gate insulating film 52b can have lower resistivity; thus, a thin film transistor with high field effect mobility and high on current can be manufactured. When the peak concentration of the impurity element which serves as a donor and is included in the microcrystalline semiconductor film is lower than $6\times10^{15}$ atoms/cm$^3$, the amount of the impurity element which serves as a donor is insufficient, and crystallinity cannot be improved, and thus increase in the field effect mobility and in the on current cannot be expected. Further, when the peak concentration of the impurity element which serves as a donor and is included in the microcrystalline semiconductor film is higher than $3\times10^{18}$ atoms/cm$^3$, the threshold voltage shifts to the minus side of the gate voltage, and the transistor does not function well; therefore, it is preferable that the concentration of the impurity element which serves as a donor be from $6\times10^{15}$ to $3\times10^{18}$ atoms/cm$^3$ inclusive, preferably from $1\times10^{16}$ to $3\times10^{18}$ atoms/cm$^3$ inclusive, more preferably from $3\times10^{16}$ to $3\times10^{17}$ atoms/cm$^3$ inclusive.

The microcrystalline semiconductor film here is a film including a semiconductor having an intermediate structure between amorphous and crystalline structures (including a single crystal and a polycrystal). This semiconductor is in a third state which is stable in free energy, and is a crystalline semiconductor having short-range order and lattice distortion, and columnar or needle-like crystals with a diameter of from 0.5 to 20 nm have grown in a direction of the normal to the surface of the substrate. Further, an amorphous semiconductor is present between a plurality of microcrystalline semiconductors. A Raman spectrum of microcrystalline silicon, which is a typical example of a microcrystalline semiconductor, is located in lower wave numbers than 520 cm$^{-1}$, which represents single crystal silicon. That is to say, the peak of a Raman spectrum of microcrystalline silicon lies between 520 cm$^{-1}$ and 480 cm$^{-1}$, which represent single crystal silicon and amorphous silicon, respectively. Furthermore, the microcrystalline semiconductor film includes hydrogen or halogen of at least 1 at. % in order to terminate a dangling bond. The microcrystalline semiconductor film may further include a rare gas such as helium, argon, krypton, or neon to further promote lattice distortion, so that the stability is enhanced and a favorable microcrystalline semiconductor film can be obtained. Such description about a microcrystalline semiconductor film is disclosed in, for example, U.S. Pat. No. 4,409,134.

The microcrystalline semiconductor film 61 including the impurity element which serves as a donor is formed with a thickness of from 5 to 200 nm inclusive, preferably from 5 to 100 nm inclusive, more preferably from 5 to 50 nm inclusive, still more preferably from 10 to 25 nm inclusive. When the microcrystalline semiconductor film 61 including the impurity element which serves as a donor is formed with a thickness of from 5 to 50 nm inclusive, the thin film transistor can be a complete depletion type.

Further, it is preferable that the concentration of oxygen and the concentration of nitrogen in the microcrystalline semiconductor film 61 including the impurity element which serves as a donor be lower than ten times that of the impurity element which serves as a donor, typically lower than $3\times10^{19}$ atoms/cm$^3$, preferably lower than $3\times10^{18}$ atoms/cm$^3$, and that the concentration of carbon be less than or equal to $3\times10^{18}$ atoms/cm$^3$. Lower concentrations of oxygen, nitrogen, and carbon mixed in the microcrystalline semiconductor film can suppress generation of defects in the microcrystalline semiconductor film. Furthermore, oxygen and nitrogen in the microcrystalline semiconductor film hinder crystallization. Therefore, when the microcrystalline semiconductor film includes oxygen and nitrogen at relatively low concentrations and includes the impurity element which serves as a donor, the crystallinity of the microcrystalline semiconductor film can be improved.

The microcrystalline semiconductor film including the impurity element which serves as a donor of this embodiment mode includes the impurity element which serves as a donor; therefore, by adding an impurity element which serves as an acceptor to the microcrystalline semiconductor film which serves as a channel formation region of the thin film transistor at the same time as or after formation of the microcrystalline semiconductor film, the threshold voltage can be controlled. A typical example of the impurity element which serves as an acceptor is boron, and an impurity gas such as $B_2H_6$ or $BF_3$ is preferably mixed at from 1 to 1000 ppm, preferably from 1 to 100 ppm into silicon hydride. Further, the concentration of boron is preferably set to be approximately one tenth that of the impurity element which serves as a donor, e.g., from $1\times10^{14}$ to $6\times10^{16}$ atoms/cm$^3$.

An amorphous semiconductor film, or an amorphous semiconductor film including nitrogen, or halogen such as fluorine or chlorine is used as the buffer layer 73. The buffer layer 73 has a thickness of from 50 to 200 nm. Examples of the amorphous semiconductor film are an amorphous silicon film, an amorphous silicon film including germanium, and the like.

The buffer layer 73, which is formed of an amorphous semiconductor film, has a larger energy gap and a higher resistivity than the microcrystalline semiconductor film 61 and low mobility which is one fifth to one tenth that of the microcrystalline semiconductor film 61. In the thin film transistor which is formed later, therefore, the buffer layer 73 functions as a high-resistance region and thus can reduce leak current which is generated between the semiconductor films 72 which serve as source and drain regions and the microcrystalline semiconductor film 61. Further, off current can be reduced.

By formation of an amorphous semiconductor film, moreover, an amorphous semiconductor film including hydrogen, nitrogen, or halogen as the buffer layer 73 over the surface of the microcrystalline semiconductor film 61, surfaces of crystal grains included in the microcrystalline semiconductor film 61 can be prevented from being oxidized naturally. In particular, in a region of the microcrystalline semiconductor film where an amorphous semiconductor is in contact with microcrystal grains, a crack is likely to be caused due to local stress. When this crack is exposed to oxygen, the crystal grains are oxidized, whereby silicon oxide is formed. However, by formation of the buffer layer 73 over the surface of the microcrystalline semiconductor film 61, the microcrystal grains can be prevented from being oxidized.

For the substrate 50, an alkali-free glass substrate manufactured by a fusion method or a float method, such as a substrate of barium borosilicate glass, aluminoborosilicate glass, or aluminosilicate glass; a ceramic substrate; a plastic substrate which has high heat resistance enough to withstand a process temperature of the manufacturing process; or the like can be used. Further, a metal (e.g., stainless steel alloy) substrate whose surface is provided with an insulating film may be used. When the substrate 50 is mother glass, the substrate may have any of the following sizes: the first generation (320 mm×400 mm), the second generation (400 mm×500 mm), the third generation (550 mm×650 mm), the fourth generation (680 mm×880 mm, or 730 mm×920 mm), the fifth generation (1000 mm×1200 mm, or 1100 mm×1250 mm), the sixth generation (1500 mm×1800 mm), the seventh generation (1900 mm×2200 mm), the eighth generation (2160 mm×2460 mm), the ninth generation (2400 mm×2800 mm, or 2450 mm×3050 mm), the tenth generation (2950 mm×3400 mm), and the like.

The gate electrode 51 is formed of a metal material. As a metal material, aluminum, chromium, titanium, tantalum, molybdenum, copper, or the like is used. The gate electrode 51 is preferably formed of aluminum or a stacked-layer structure of aluminum and a barrier metal. As a barrier metal, a metal with a high melting point, such as titanium, molybdenum, or chromium, is used. A barrier metal is preferably provided in order to prevent hillocks and oxidation of aluminum.

The gate electrode 51 is formed with a thickness of from 50 to 300 nm inclusive. The thickness of from 50 to 100 nm inclusive of the gate electrode 51 can prevent a disconnection of a semiconductor film and a wiring, which are formed later. Further, the thickness of from 150 to 300 nm inclusive of the gate electrode 51 can lower the resistance of the gate electrode 51.

Since the semiconductor film and the wiring are formed over the gate electrode 51, the gate electrode 51 is preferably processed to have tapered end portions so that the semiconductor film and the wiring thereover are not disconnected. Further, although not illustrated, a wiring or a capacitor wiring which is connected to the gate electrode can also be formed in this step, at the same time.

The gate insulating films 52a and 52b can each be formed using a silicon oxide film, a silicon nitride film, a silicon oxynitride film, or a silicon nitride oxide film with a thickness of from 50 to 150 nm. This mode shows an example in which a silicon nitride film or a silicon nitride oxide film is formed as the gate insulating film 52a, and a silicon oxide film or a silicon oxynitride film is formed as the gate insulating film 52b to form a stacked-layer structure. Instead of a two-layer structure, the gate insulating film can be formed using a single layer of a silicon oxide film, a silicon nitride film, a silicon oxynitride film, or a silicon nitride oxide film.

By forming the gate insulating film 52a using a silicon nitride film or a silicon nitride oxide film, adhesion between the substrate 50 and the gate insulating film 52a is increased, and further, an impurity from the substrate 50 can be prevented from diffusing into the microcrystalline semiconductor film 61 including the impurity element which serves as a donor when a glass substrate is used for the substrate 50. Furthermore, oxidation of the gate electrode 51 can be prevented. That is to say, film peeling can be prevented, and electric characteristics of the thin film transistor which is formed later can be improved. Further, the gate insulating films 52a and 52b each having a thickness of greater than or equal to 50 nm are preferable because the gate insulating films 52a and 52b having the above thickness can alleviate reduction in coverage which is caused by unevenness due to the gate electrode 51.

Note that a silicon oxynitride film means a film that includes more oxygen than nitrogen, and includes oxygen, nitrogen, silicon, and hydrogen at concentrations ranging from 55 to 65 at. %, 1 to 20 at. %, 25 to 35 at. %, and 0.1 to 10 at. %, respectively. Further, a silicon nitride oxide film means a film that includes more nitrogen than oxygen, and includes oxygen, nitrogen, silicon, and hydrogen at concentrations ranging from 15 to 30 at. %, 20 to 35 at. %, 25 to 35 at. %, and 15 to 25 at. %, respectively.

If an n-channel thin film transistor is formed, the semiconductor films 72 to which the impurity element imparting one conductivity type is added may be doped with phosphorus, which is a typical impurity element; for example, an impurity gas such as $PH_3$ may be added to silicon hydride. If a p-channel thin film transistor is formed, the semiconductor films 72 to which the impurity element imparting one conductivity type is added may be doped with boron, which is a typical impurity element; for example, an impurity gas such as $B_2H_6$ may be added to silicon hydride. The semiconductor films 72 to which the impurity element imparting one conductivity type is added include phosphorus or boron at a concentration of from $1 \times 10^{19}$ to $1 \times 10^{21}$ atoms/cm$^3$, thereby having ohmic contact with the wirings 71a to 71c, and the semiconductor films 72 to which the impurity element imparting one conductivity type is added function as the source and drain regions. The semiconductor films 72 to which the impurity element imparting one conductivity type is added can be formed using a microcrystalline semiconductor or an amorphous semiconductor The semiconductor films 72 to which the impurity element imparting one conductivity type is added are formed with a thickness of from 2 to 50 nm inclusive. Reduction in the thickness of the semiconductor film to which the impurity element imparting one conductivity type is added can improve the throughput.

The wirings 71a to 71c are preferably formed with a single layer or stacked layers using aluminum; copper; or an aluminum alloy to which an element for preventing hillocks or an element for improving a heat resistance property, such as silicon, titanium, neodymium, scandium, or molybdenum, is added. Alternatively, a film in contact with the semiconductor film to which the impurity element imparting one conductivity type is added may be formed of titanium, tantalum, molybdenum, or tungsten, or a nitride of such an element; and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or a nitride thereof to form a stacked-layer structure. This embodiment mode shows the conductive film having a three-layer structure of the wirings 71a to 71c, and a stacked-layer structure in which the wirings 71a and 71c are formed using molybdenum films and the wiring 71b is formed using an aluminum film, or a stacked-layer structure in which the wirings 71a and 71c are formed using titanium films and the wiring 71b is formed using an aluminum film is formed.

The operation mechanism of the thin film transistor in which the microcrystalline semiconductor film including the impurity element which serves as a donor and the buffer layer are stacked over the gate insulating films as shown in FIG. 1A is described below. In the following description, phosphorus is used as the impurity element which serves as a donor, a microcrystalline silicon film is used as the microcrystalline semiconductor film, and an amorphous silicon film is used as the buffer layer.

Figure 2A:
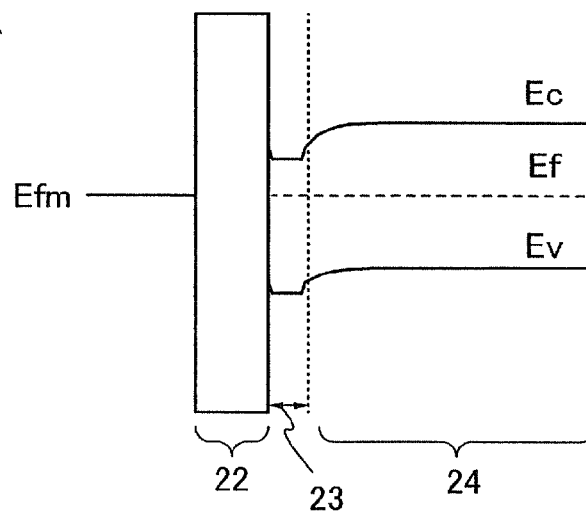
FIGS. 2A to 2C are energy band diagrams of a thin film transistor of the present invention.
Figure 2B:
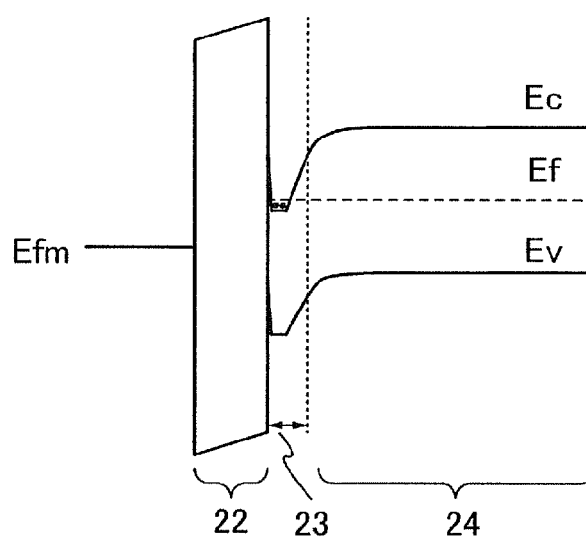
Figure 2C:
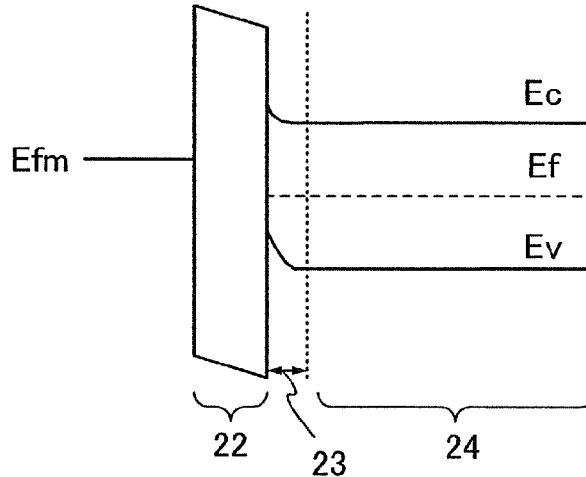
Figure 3A:
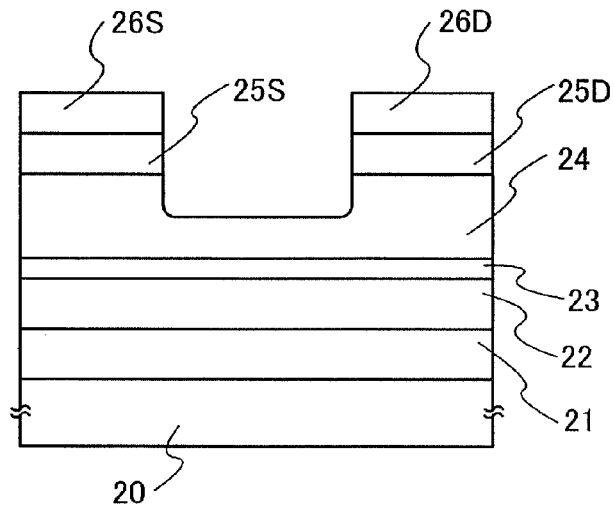
FIGS. 3A, 3C, and 3E are cross-sectional views illustrating a thin film transistor of the present invention.
Figure 3B:
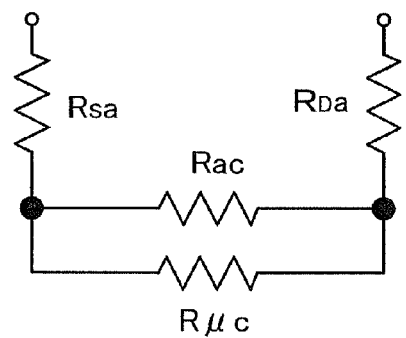
FIGS. 3B, 3D, and 3F are equivalent circuit diagrams.
Figure 3C:
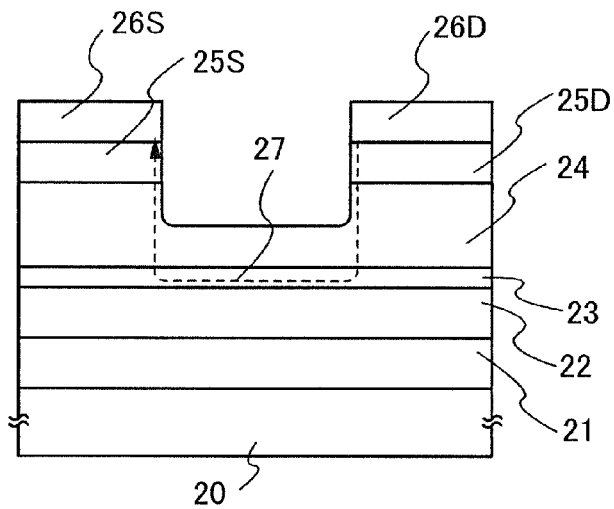
Figure 3D:
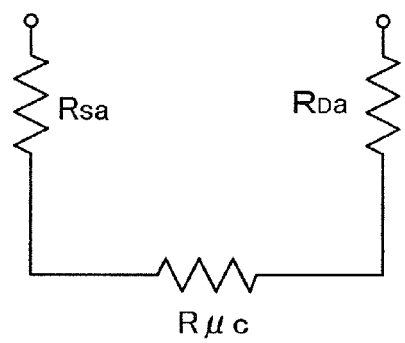
Figure 3E:
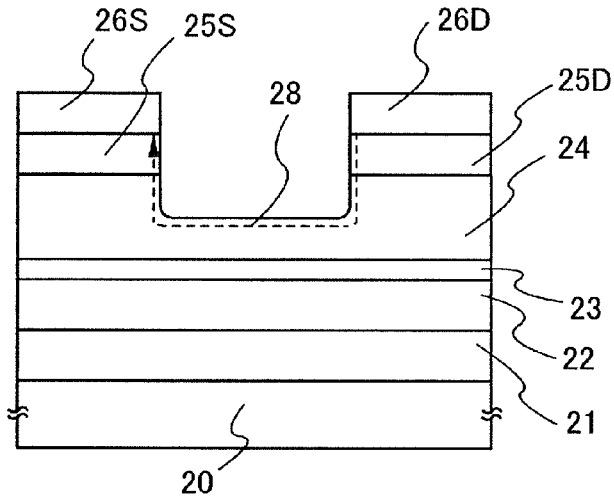
Figure 3F:
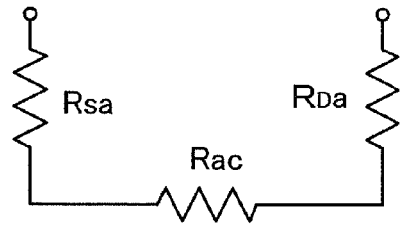

FIGS. 2A to 2C are energy band diagrams of the thin film transistor of the present invention, FIGS. 3A, 3C, and 3E are cross-sectional views of the thin film transistor, and FIGS. 3B, 3D, and 3F are equivalent circuit diagrams.

FIG. 3A illustrates a thin film transistor in which a substrate 20, a gate electrode 21, a gate insulating film 22, a microcrystalline silicon film 23, an amorphous silicon film 24 which is a buffer layer, a source region 25S, a drain region 25D, a source electrode 26S, and a drain electrode 26D are stacked.

FIG. 3B shows an equivalent circuit of the thin film transistor in FIG. 3A. Resistance $R_{Sa}$ mainly represents a value of resistance of the source region 25S and the amorphous silicon film 24, resistance $R_{Da}$ mainly represents a value of resistance of the drain region 25D and the amorphous silicon film 24, resistance $R_{ac}$ mainly represents a value of resistance of the amorphous silicon film 24, and resistance $R_{\mu c}$ mainly represents a value of resistance of the microcrystalline silicon film 23.

FIG. 2A is a band diagram of the thin film transistor in FIG. 3A in a state in which voltage is not applied to the gate electrode 21. In this case, a Fermi level Ef of the microcrystalline silicon film 23 and the amorphous silicon film 24 and a Fermi level Efm of the gate electrode 21 are equal to each other.

The microcrystalline silicon film 23 of the present invention is an n-type semiconductor because it includes phosphorus which is one of impurity elements which serve as a donor; thus, Fermi energy Ef is close to conduction band energy Ec in the microcrystalline silicon film 23. In addition, the microcrystalline silicon film 23 is of n-type, and the amorphous silicon film 24 is of i-type. Further, for example, a band gap (an energy difference between the bottom Ec of the conduction band and the top Ev of the valence band) of the microcrystalline silicon film 23 is set to be 1.4 eV and a band gap of the amorphous silicon film 24 is set to be 1.7 eV, so that an n-i junction is formed at the interface between the microcrystalline silicon film 23 and the amorphous silicon film 24. Thus, the energy band around the interface between the microcrystalline silicon film 23 and the amorphous silicon film 24 curves, and the bottom Ec of the conduction band of the microcrystalline silicon film 23 is below that of the amorphous silicon film 24.

The gate electrode 21 is supplied with positive voltage, the source electrode 26S is grounded to have ground potential, and the drain electrode 26D is supplied with positive voltage. A pathway of drain current at this time is shown in FIG. 3C. The pathway of drain current flowing between the drain electrode 26D and the source electrode 26S is denoted by a dashed line 27. As denoted by the dashed line 27 in FIG. 3C, drain current flow through the drain electrode 26D, the drain region 25D, the amorphous silicon film 24, the vicinity of the interface between the microcrystalline silicon film 23 and the gate insulating film 22, the amorphous silicon film 24, the source region 25S, and the source electrode 26S. In other words, a pathway of carriers flowing between the drain electrode 26D and the source electrode 26S is formed in the source electrode 26S, the source region 25S, the amorphous silicon film 24, the vicinity of the interface between the microcrystalline silicon film 23 and the gate insulating film 22, the amorphous silicon film 24, the drain region 25D, and the drain electrode 26D.

FIG. 3D shows an equivalent circuit of the thin film transistor shown in FIG. 3C. Forward bias is applied at the interface between the source region 25S and the amorphous silicon film 24, so that the resistance $R_{Sa}$ represents a value of resistance of the source region 25S and the amorphous silicon film 24 in forward connection, which is low. In addition, at the interface between the drain region 25D and the amorphous silicon film 24, reverse bias is applied and a depletion layer is formed, so that the resistance $R_{Da}$ is high. The resistance $R_{\mu c}$ represents a resistance value of the microcrystalline silicon film 23 which is inverted. The microcrystalline silicon film 23 which is inverted means the microcrystalline silicon film 23 in which conduction electrons are induced to the interface with the gate insulating film 22 by applying potential to the gate electrode 21. The resistance $R_{Sa}$ is considered much lower than the resistance $R_{Da}$ and the resistance $R_{\mu c}$.

FIG. 2B is a band diagram of the thin film transistor shown in FIG. 3C in a state in which positive voltage, typically, positive voltage which is high enough to form an inversion layer, is applied to the gate electrode 21. By application of positive voltage to the gate electrode 21, an energy band in the microcrystalline silicon film 23 curves, and a region where the bottom Ec of the conduction band is lower than the Fermi level Ef, i.e., an inversion layer, is formed, and electrons are induced to a region of the microcrystalline silicon film 23 around the interface with the gate insulating film 22 so as to enhance the density of conduction electrons, and thus, a channel is formed. A positive voltage at which the inversion layer begins to be formed substantially equals to the threshold voltage Vth.

In an actual device structure, typically, the resistance $R_{Da}$ is formed in the amorphous silicon film 24 with a thickness of from 0.1 to 0.3 μm approximately. On the other hand, the resistance $R_{\mu c}$ is typically formed in the microcrystalline silicon film 23 with a thickness of from 3 to 6 μm approximately. Therefore, the travel distance of carriers in the channel is 10 to 30 times as long as that in the amorphous silicon film 24. By making the resistance $R_{\mu c}$ of the microcrystalline silicon film 23 much smaller than the resistance $R_{ac}$ of the amorphous silicon film 24, on current and field effect mobility of the thin film transistor can be increased. Therefore, by adding the impurity element which serves as a donor, here, phosphorus to the microcrystalline silicon film 23, the carrier concentration can be increased, and thus, electric conductivity of the microcrystalline silicon film 23 can be improved.

On the other hand, the gate electrode 21 is supplied with negative voltage, the source electrode 26S is grounded to have ground potential, and the drain electrode 26D is supplied with positive voltage. A pathway of drain current at this time is shown in FIG. 3E. A pathway of drain current flowing between the drain electrode 26D and the source electrode 26S is denoted by a dashed line 28. As denoted by the dashed line 28 in FIG. 3E, drain current flow through the drain electrode 26D, the drain region 25D, the vicinity of the surface of the amorphous silicon film 24, the source region 25S, and the source electrode 26S. In other words, a pathway of carriers flowing between the drain electrode 26D and the source electrode 26S is formed in the source electrode 26S, the source region 25S, the vicinity of the surface of the amorphous silicon film 24, the drain region 25D, and the drain electrode 26D.

FIG. 3F shows an equivalent circuit of the thin film transistor shown in FIG. 3E. Forward bias is applied at the interface between the source region 25S and the amorphous silicon film 24, so that the resistance $R_{Sa}$ represents a value of resistance of the source region 25S and the amorphous silicon film 24 in forward connection, which is low. In addition, at the interface between the drain region 25D and the amorphous silicon film 24, reverse bias is applied and a depletion layer is formed, so that the resistance $R_{Da}$ is high. The resistance $R_{ac}$ represents a resistance value of the amorphous silicon film 24. The resistance $R_{Sa}$ is considered much lower than the resistance $R_{Da}$ and the resistance $R_{ac}$.

FIG. 2C is a band diagram of the thin film transistor shown in FIG. 3E in a state in which negative voltage is applied to the gate electrode 21. By applying negative voltage to the gate electrode 21, electrons are removed from a region around the interface between the gate insulating film 22 and the microcrystalline silicon film 23. As a result, the electron density is depleted, and a depletion layer is formed. In this condition, conduction electrons are removed from the conduction band, and at the interface between the microcrystalline silicon film 23 and the gate insulating film 22, the bottom Ec of the conduction band of the microcrystalline silicon film 23 to which the impurity element imparting one conductivity type is added is still higher than the Fermi level Ef, and the surface of the microcrystalline silicon film 23 has resistance higher than that of the amorphous silicon film 24. Accordingly, when negative voltage is applied to the gate electrode 21, electrons travel through the amorphous silicon film 24, so that current flows therethrough. Around the interface between the amorphous silicon film 24 and the drain region 25D, reverse bias is applied, and a depletion layer is formed, so that the resistance $R_{Da}$ is increased. However, when the amorphous silicon film 24 has defects, impurities, or recombination centers, the defects, the impurities, or the recombination centers serve as a leak path, resulting in that a depletion layer does not spread and off current flows. Therefore, an amorphous silicon film which forms perfect bonding at the interface with the drain region 25D and has less impurities, less defects, and less recombination centers is used for the amorphous silicon film 24. That is, by forming the amorphous silicon film 24 whose photoelectric current is high and whose dark current is low, leak current of the thin film transistor can be reduced.

As described in this mode, when positive voltage is applied to the gate electrode 21, the microcrystalline semiconductor film with high conductivity is used as a travel region for carriers, and when negative voltage is applied to the gate electrode, the amorphous semiconductor film with low conductivity is used as a travel region for carriers, whereby a thin film transistor with a high ON/OFF ratio can be obtained. That is, a thin film transistor which has high on current and high field effect mobility and which can suppress off current can be manufactured.

Figure 4A:
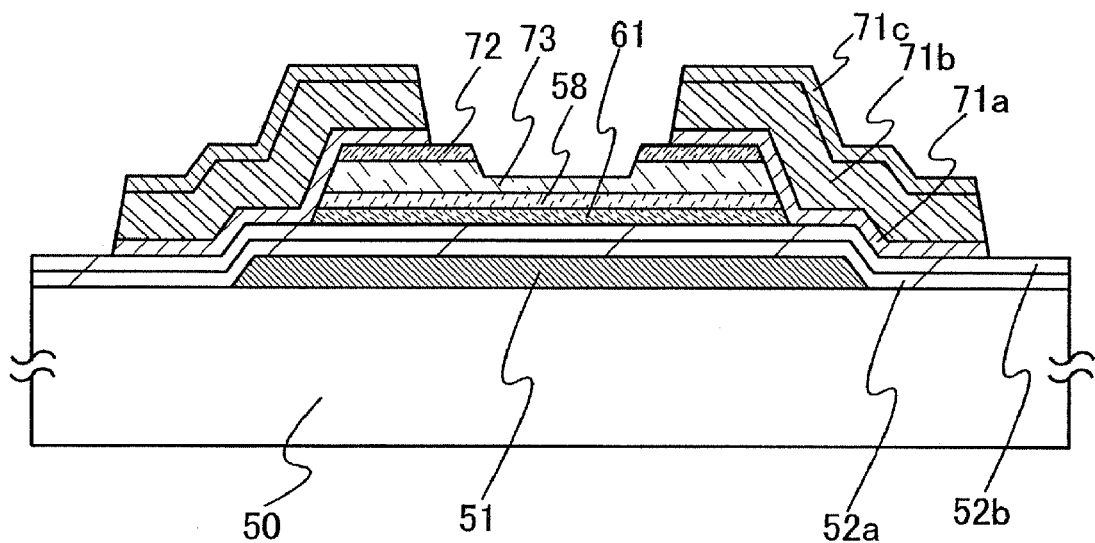
FIG. 4A is a cross-sectional view illustrating a thin film transistor of the present invention.
Figure 4B:
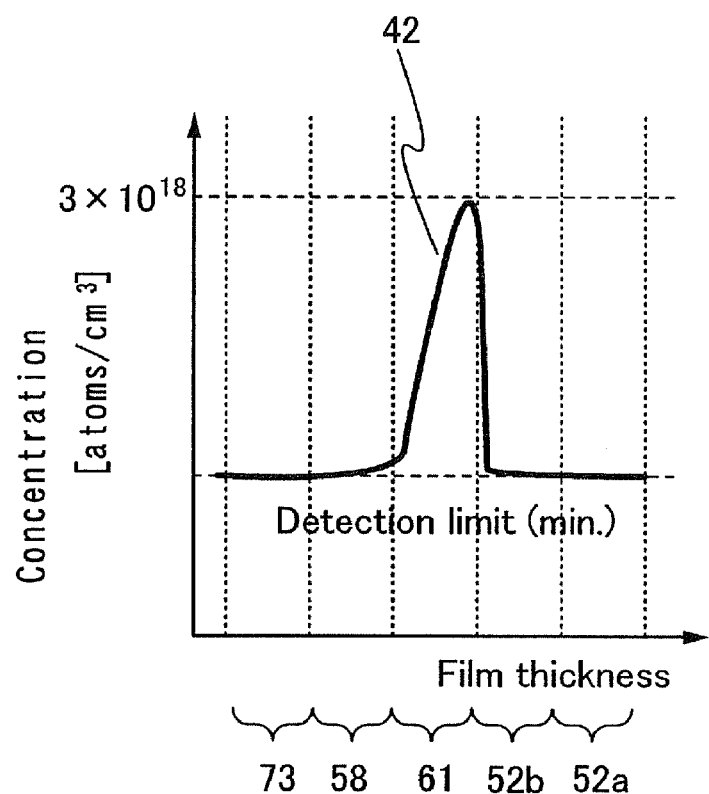
FIG. 4B is a diagram showing a peak concentration of an impurity element in stacked films.

FIGS. 4A and 4B show a structure of a thin film transistor different from the thin film transistor shown in FIG. 1A.

In a thin film transistor shown in FIG. 4A, a gate electrode 51 is formed over a substrate 50, gate insulating films 52a and 52b are formed over the gate electrode 51, a microcrystalline semiconductor film 61 including an impurity element which serves as a donor is formed over the gate insulating films 52a and 52b, a microcrystalline semiconductor film 58 not including the impurity element which serves as a donor at a higher concentration than the detection limit of SIMS is formed over the microcrystalline semiconductor film 61 including the impurity element which serves as a donor, a buffer layer 73 is formed over the microcrystalline semiconductor film 58, a pair of semiconductor films 72 to which an impurity element imparting one conductivity type is added are formed over the buffer layer 73, and wirings 71a to 71c are formed over the pair of semiconductor films 72 to which the impurity element imparting one conductivity type is added.

Next, concentration distribution of the impurity element which serves as a donor in a stacked-layer portion including the gate insulating films 52a and 52b, the microcrystalline semiconductor film 61 including the impurity element which serves as a donor, the microcrystalline semiconductor film 58 not including the impurity element which serves as a donor at a higher concentration than the detection limit of SIMS, and the buffer layer 73 is schematically shown with SIMS by a curve 42 in FIG. 4B.

As in the concentration distribution of the impurity element which serves as a donor which is shown by the curve 42 in FIG. 4B, the peak of the concentration distribution of the impurity element which serves as a donor is located at or around the interface between the gate insulating film 52b and the microcrystalline semiconductor film 61 including the impurity element which serves as a donor, and the concentration is decreased toward the microcrystalline semiconductor film 58.

Forming the microcrystalline semiconductor film 58 not including the impurity element which serves as a donor at a higher concentration than the detection limit of SIMS over the microcrystalline semiconductor film 61 including the impurity element which serves as a donor can prevent the impurity element which serves as a donor in the microcrystalline semiconductor film 61 from being diffused into the buffer layer 73. If the impurity element which serves as a donor is diffused into the buffer layer 73, which is a high-resistance region, resistance of the buffer layer 73 decreases and leak current flows between the microcrystalline semiconductor film 61 including the impurity element which serves as a donor and the semiconductor films 72 which serve as source and drain regions, thereby degrading switching characteristics. Therefore, it is preferable to form the microcrystalline semiconductor film 58 not including the impurity element which serves as a donor at a higher concentration than the detection limit of SIMS between the microcrystalline semiconductor film 61 including the impurity element which serves as a donor and the buffer layer 73. The thickness of a stacked-layer structure including the microcrystalline semiconductor film 61 including the impurity element which serves as a donor and the microcrystalline semiconductor film 58 not including the impurity element which serves as a donor at a higher concentration than the detection limit of SIMS is set to be from 5 to 50 nm, preferably from 5 to 25 nm, and the activation rate of the impurity element which serves as a donor is increased, whereby this region serves as a channel formation region and resistance can be lowered, and furthermore, on current and field effect mobility of the thin film transistor can be increased.

A thin film transistor in which a gate insulating film has a different structure from that of the above thin film transistor is described with reference to FIG. 5.

Figure 5:
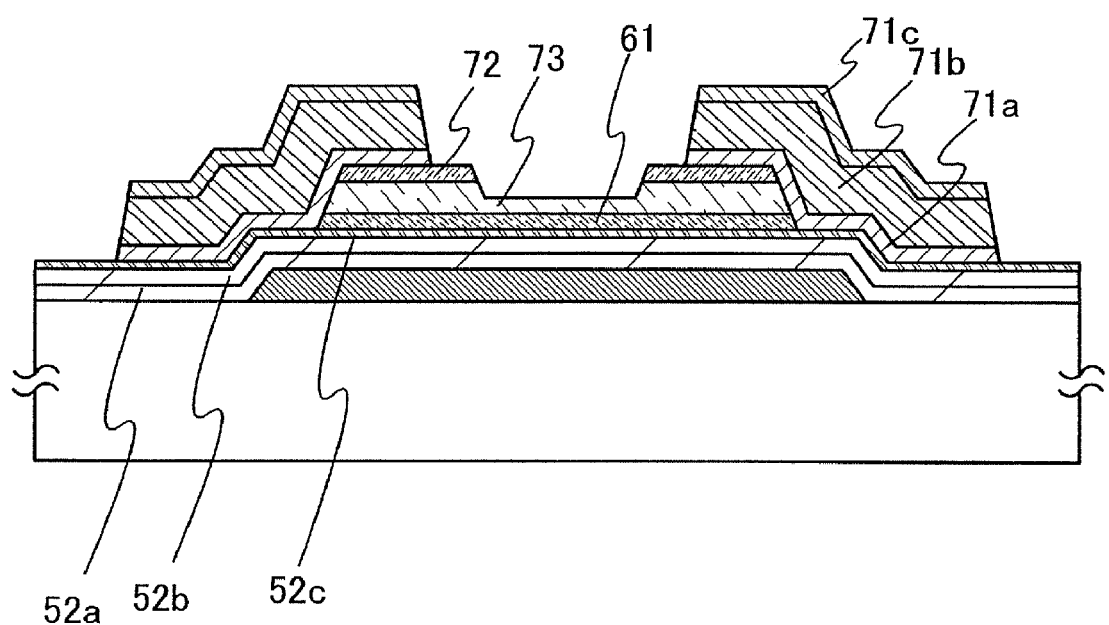
FIG. 5 is a cross-sectional view illustrating a thin film transistor of the present invention.

Instead of the gate insulating films 52a and 52b of the thin film transistor shown in FIG. 1A, three gate insulating films 52a, 52b, and 52c may be formed as shown in FIG. 5. As the gate insulating film 52c, which is a third layer, a silicon nitride film or a silicon nitride oxide film with a thickness of from 1 to 5 nm approximately can be formed.

When a silicon nitride film or a silicon nitride oxide film with a thickness of from 1 to 5 nm approximately is formed as the gate insulating film 52c which is the third layer, a plasma CVD method can be employed. Further, it is also possible to have the gate insulating film 52b undergo a nitridation treatment with high-density plasma to form a silicon nitride layer over the surface of the gate insulating film 52b. By high-density plasma nitridation, a silicon nitride layer that includes nitrogen at a higher concentration can be obtained. The high-density plasma is generated by use of high-frequency microwaves, for example, microwaves with a frequency of 2.45 GHz. With high-density plasma, which has the characteristic of having low electron temperature, a layer can be formed with less plasma damage and fewer defects compared to a layer formed by a conventional plasma treatment because the kinetic energy of an active species is low. In addition, carrier mobility can be increased because the level of roughness of the surface of the gate insulating film 52b can be reduced.

In a microcrystalline semiconductor film, an amorphous semiconductor and a crystalline semiconductor are mixed. Thus, when the amorphous semiconductor comes to be in contact with silicon oxide or silicon oxynitride, hydrogen in the amorphous semiconductor tends to react with the silicon oxide or the silicon oxynitride, so that hydrogen concentration in the microcrystalline semiconductor film decreases and the interface between the gate insulating film and the microcrystalline semiconductor film deteriorates. Therefore, a silicon nitride film or a silicon nitride oxide film with a small thickness that is formed as a base film for the microcrystalline semiconductor film can serve as a blocking film for preventing hydrogen from diffusing, so that deterioration of the interface between the gate insulating film and the microcrystalline semiconductor film can be reduced.

Next, a different mode from the above is described with reference to FIGS. 6A and 6B.

Figure 6A:
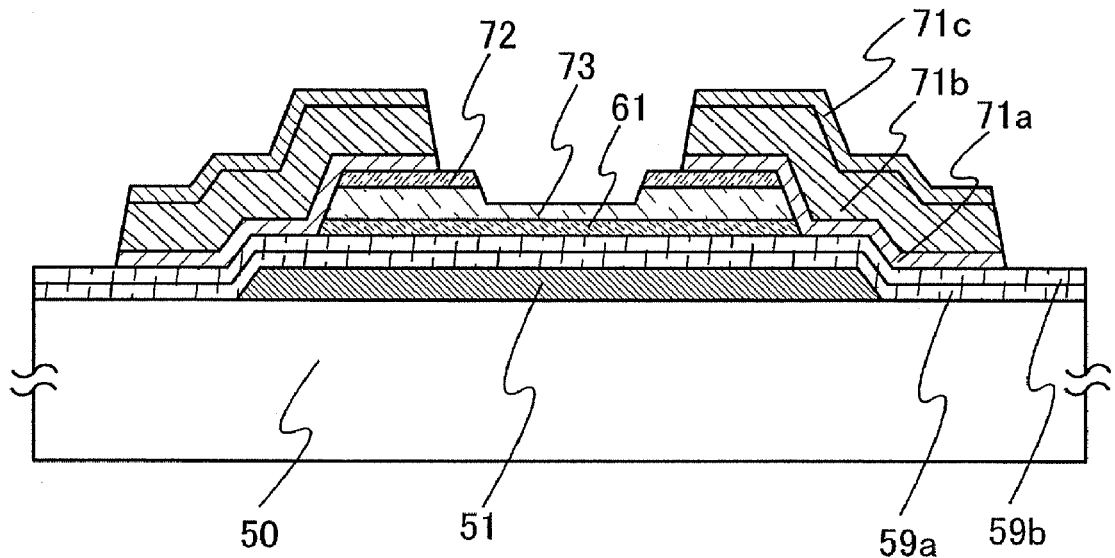
FIG. 6A is a cross-sectional view illustrating a thin film transistor of the present invention.

FIG. 6A shows a cross section of a thin film transistor of this embodiment mode.

In the thin film transistor shown in FIG. 6A, a gate electrode 51 is formed over a substrate 50, a gate insulating film 59a including an impurity element which serves as a donor is formed over the gate electrode 51, a microcrystalline semiconductor film 61 including the impurity element which serves as a donor is formed over a gate insulating film 59b including the impurity element which serves as a donor, a buffer layer 73 is formed over the microcrystalline semiconductor film 61 including the impurity element which serves as a donor, a pair of semiconductor films 72 to which an impurity element imparting one conductivity type is added are formed over the buffer layer 73, and wirings 71a to 71c are formed over the pair of semiconductor films 72 to which the impurity element imparting one conductivity type is added.

It is preferable that the peak concentration of the impurity element which serves as a donor in the gate insulating films 59a and 59b and the microcrystalline semiconductor film 61 each including the impurity element which serves as a donor be from $6 \times 10^{15}$ to $3 \times 10^{18}$ atoms/cm$^3$ inclusive, preferably from $1 \times 10^{16}$ to $3 \times 10^{18}$ atoms/cm$^3$ inclusive, more preferably from $3 \times 10^{16}$ to $3 \times 10^{17}$ atoms/cm$^3$ inclusive.

Figure 6B:
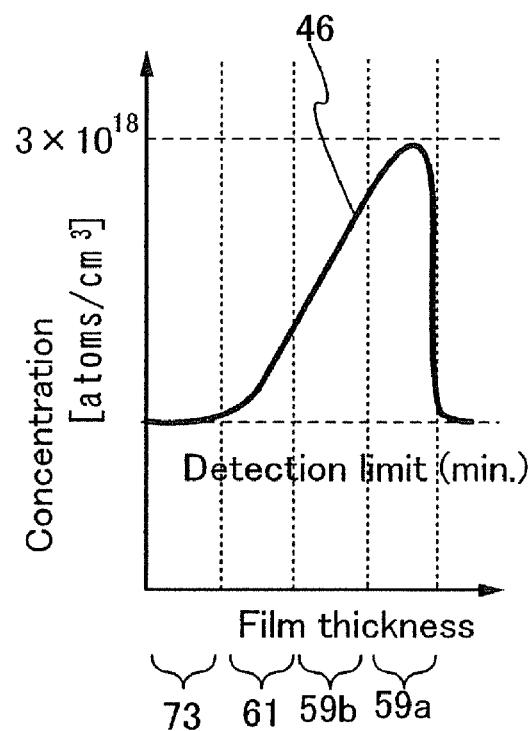
FIG. 6B is a diagram showing a peak concentration of an impurity element in stacked films.

Next, concentration distribution of the impurity element which serves as a donor in a stacked-layer portion including the gate insulating films 59a and 59b including the impurity element which serves as a donor, the microcrystalline semiconductor film 61 including the impurity element which serves as a donor, and the buffer layer 73 is schematically shown with SIMS by a curve 46 in FIG. 6B.

As shown in FIG. 6B, the concentration of the impurity element which serves as a donor in the thin film transistor shown in FIG. 6A satisfies the above concentration range in the gate insulating films 59a and 59b and the microcrystalline semiconductor film 61, and has a peak therein. The peak is located at or around the interface between the gate electrode 51 and the gate insulating film 59a. The shape of the curve 46, which shows the concentration distribution of the impurity element which serves as a donor, is not limited to that shown in FIG. 6B, and the concentration may have a peak in or around the center of the gate insulating film 59a including the impurity element which serves as a donor, in or around the center of the gate insulating film 59b including the impurity element which serves as a donor, or at or around the interface between the gate insulating films 59a and 59b including the impurity element which serves as a donor. Alternatively, the concentration may have a peak at or around the interface between the gate insulating film 59b including the impurity element which serves as a donor and the microcrystalline semiconductor film 61 including the impurity element which serves as a donor.

Next, a different mode from the above is described with reference to FIGS. 7A and 7B.

Figure 7A:
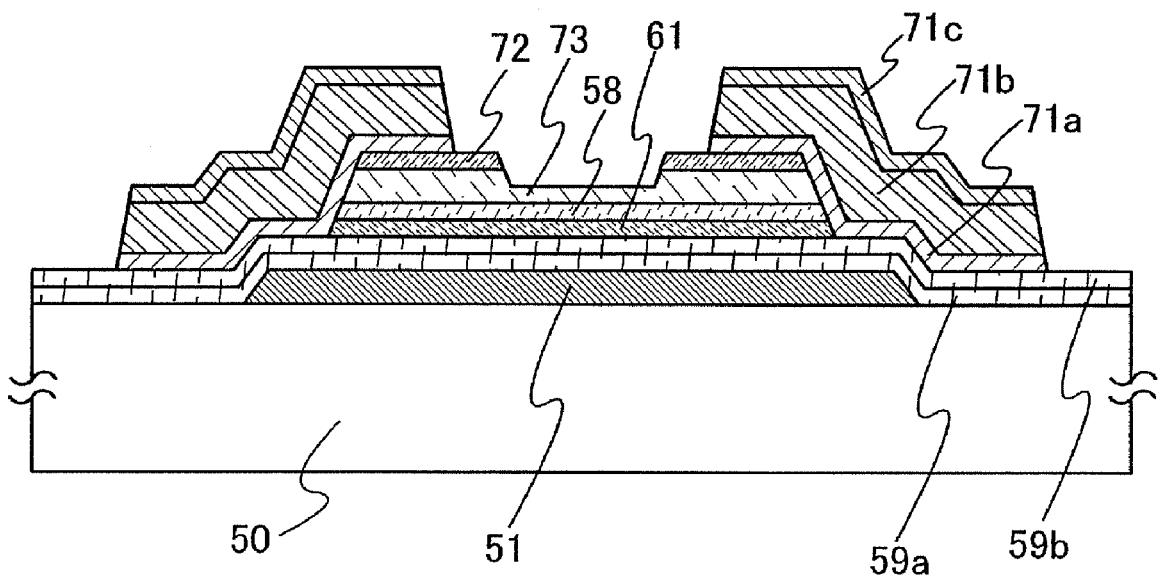
FIG. 7A is a cross-sectional view illustrating a thin film transistor of the present invention.

In a thin film transistor shown in FIG. 7A, a gate electrode 51 is formed over a substrate 50, gate insulating films 59a and 59b including an impurity element which serves as a donor are formed over the gate electrode 51, a microcrystalline semiconductor film 61 including the impurity element which serves as a donor is formed over the gate insulating films 59a and 59b including the impurity element which serves as a donor, a microcrystalline semiconductor film 58 not including the impurity element which serves as a donor at a higher concentration than the detection limit of SIMS is formed over the microcrystalline semiconductor film 61 including the impurity element which serves as a donor, a buffer layer 73 is formed over the microcrystalline semiconductor film 58, a pair of semiconductor films 72 to which an impurity element imparting one conductivity type is added are formed over the buffer layer 73, and wirings 71a to 71c are formed over the pair of semiconductor films 72 to which the impurity element imparting one conductivity type is added.

Figure 7B:
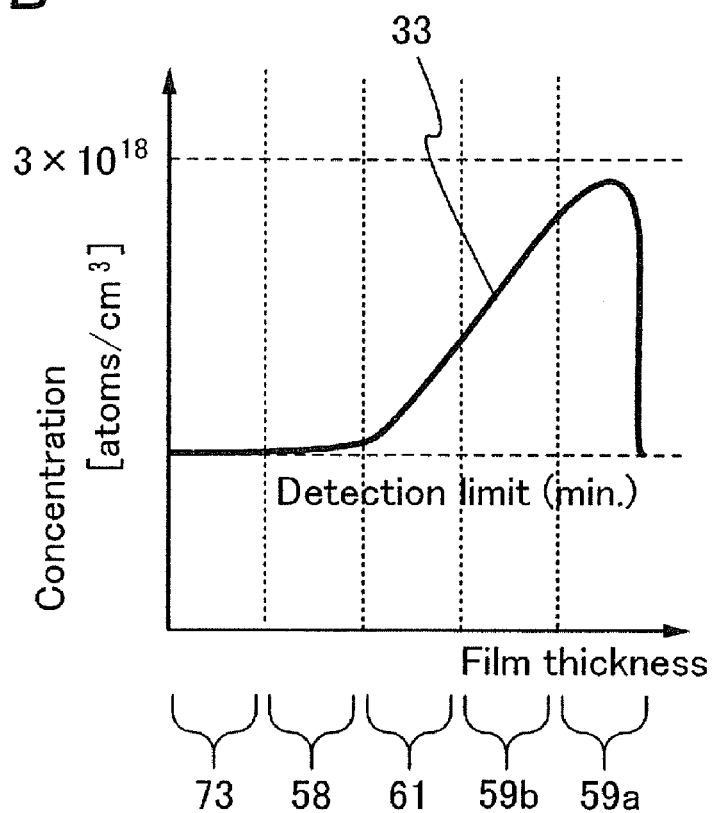
FIG. 7B is a diagram showing a peak concentration of an impurity element in stacked films.

Next, concentration distribution of the impurity element which serves as a donor in a stacked-layer portion including the gate insulating films 59a and 59b including the impurity element which serves as a donor, the microcrystalline semiconductor film 61 including the impurity element which serves as a donor, the microcrystalline semiconductor film 58 not including the impurity element which serves as a donor at a higher concentration than the detection limit of SIMS, and the buffer layer 73 is schematically shown with SIMS by a curve 33 in FIG. 7B.

As shown in FIG. 7B, the concentration of the impurity element which serves as a donor in the thin film transistor shown in FIG. 7A has a peak in the gate insulating film 59a including the impurity element which serves as a donor. Further, the concentration of the impurity element which serves as a donor is relatively decreased from the gate insulating film side toward the microcrystalline semiconductor film 58. That is, the impurity element which serves as a donor is included at a higher concentration on the gate insulating film 59a side. Furthermore, the shape of the curve 33 that shows the concentration distribution of the impurity element which serves as a donor is not limited to that shown in FIG. 7B, and the concentration may have a peak in or around the center the gate insulating film 59a including the impurity element which serves as a donor, in or around the center the gate insulating film 59b including the impurity element which serves as a donor, or at or around the interface between the gate insulating films 59a and 59b including the impurity element which serves as a donor. Alternatively, the concentration may have a peak at or around the interface between the gate insulating film 59b including the impurity element which serves as a donor and the microcrystalline semiconductor film 61 including the impurity element which serves as a donor.

Forming the microcrystalline semiconductor film 58 not including the impurity element which serves as a donor at a higher concentration than the detection limit of SIMS over the microcrystalline semiconductor film 61 including the impurity element which serves as a donor can prevent the impurity element which serves as a donor in the microcrystalline semiconductor film 61 from being diffused into the buffer layer 73. If the impurity element which serves as a donor is diffused into the buffer layer 73, which is a high-resistance region, resistance of the buffer layer 73 decreases and leak current flows between the microcrystalline semiconductor film 61 including the impurity element which serves as a donor and the semiconductor films 72 which serve as source and drain regions, thereby degrading switching characteristics. Therefore, it is preferable to form the microcrystalline semiconductor film 58 not including the impurity element which serves as a donor at a higher concentration than the detection limit of SIMS between the microcrystalline semiconductor film 61 including the impurity element which serves as a donor and the buffer layer 73.

Figure 8A:
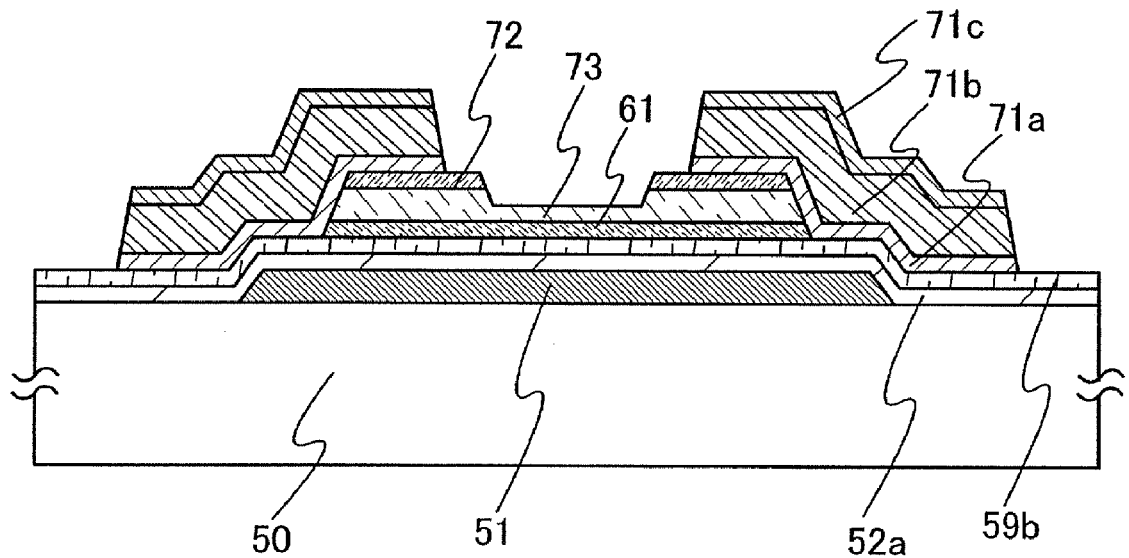
FIG. 8A is a cross-sectional view illustrating a thin film transistor of the present invention.

Instead of the gate insulating films 59a and 59b including the impurity element which serves as a donor in the thin film transistor shown in FIG. 6A, a stacked-layer structure including a gate insulating film 52a and a gate insulating film 59b including an impurity element which serves as a donor may be formed as shown in FIG. 8A. Specifically, the gate insulating film 59b including the impurity element which serves as a donor is formed over the gate insulating film 52a, a microcrystalline semiconductor film 61 including the impurity element which serves as a donor is formed over the gate insulating film 59b, and a buffer layer 73 is formed over the microcrystalline semiconductor film 61, whereby a thin film transistor can be manufactured.

Figure 8B:
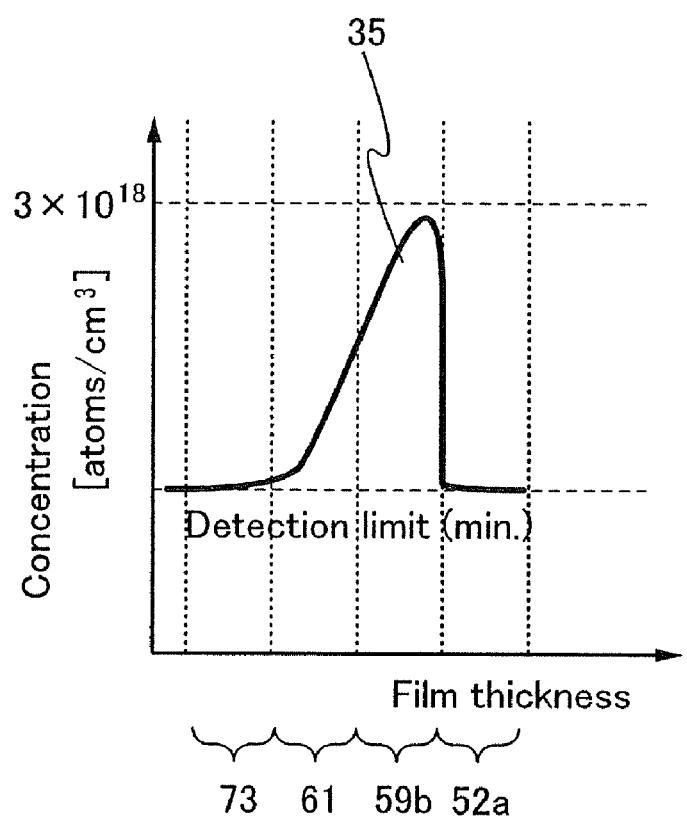
FIG. 8B is a diagram showing a peak concentration of an impurity element in stacked films.

Next, concentration distribution of the impurity element which serves as a donor in a stacked-layer portion including the gate insulating film 52a, the gate insulating film 59b including the impurity element which serves as a donor, the microcrystalline semiconductor film 61 including the impurity element which serves as a donor, and the buffer layer 73 is schematically shown with SIMS by a curve 35 in FIG. 8B.

As shown in FIG. 8B, the concentration of the impurity element which serves as a donor in the thin film transistor shown in FIG. 8A has a peak in the gate insulating film 59b including the impurity element which serves as a donor. The peak is present at or around the interface between the gate insulating film 52a and the gate insulating film 59b including the impurity element which serves as a donor. The shape of the curve, which shows the concentration distribution of the impurity element which serves as a donor, is not limited to that shown in FIG. 8B, and the concentration may have a peak in or around the center of the gate insulating film 59b including the impurity element which serves as a donor, or at or around the interface between the gate insulating film 59b including the impurity element which serves as a donor and the microcrystalline semiconductor film 61 including the impurity element which serves as a donor.

Figure 9A:
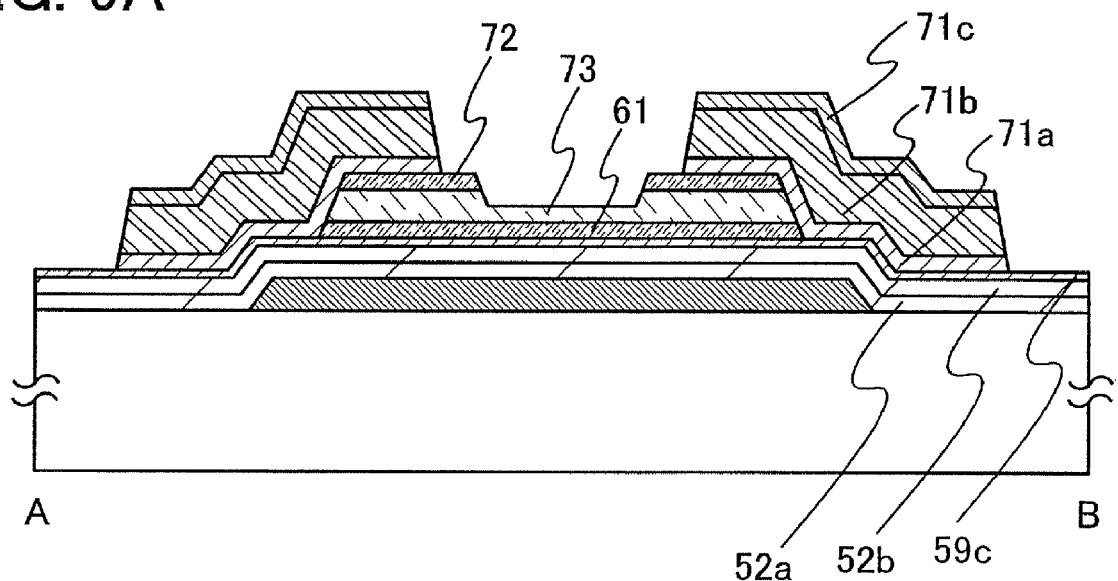
FIG. 9A is a cross-sectional view illustrating a thin film transistor of the present invention.

Further, instead of the two gate insulating films in the thin film transistor shown in FIG. 6A, a thin film transistor can include three gate insulating films as shown in FIG. 9A. Specifically, gate insulating films 52a and 52b and a gate insulating film 59c including an impurity element which serves as a donor are formed over a substrate 50 and a gate electrode 51, and a microcrystalline semiconductor film 61 including the impurity element which serves as a donor is formed over the gate insulating film 59c including the impurity element which serves as a donor.

As the gate insulating films 52a and 52b, which are first and second layers, a silicon nitride film, a silicon nitride oxide film, a silicon oxide film, or a silicon oxynitride film can be formed by a plasma CVD method or a sputtering method. As the gate insulating film 59c including the impurity element which serves as a donor, which is a third layer, a silicon nitride film or a silicon nitride oxide film with a thickness of from 1 to 5 nm approximately which includes phosphorus, arsenic, or antimony can be formed.

Figure 9B:
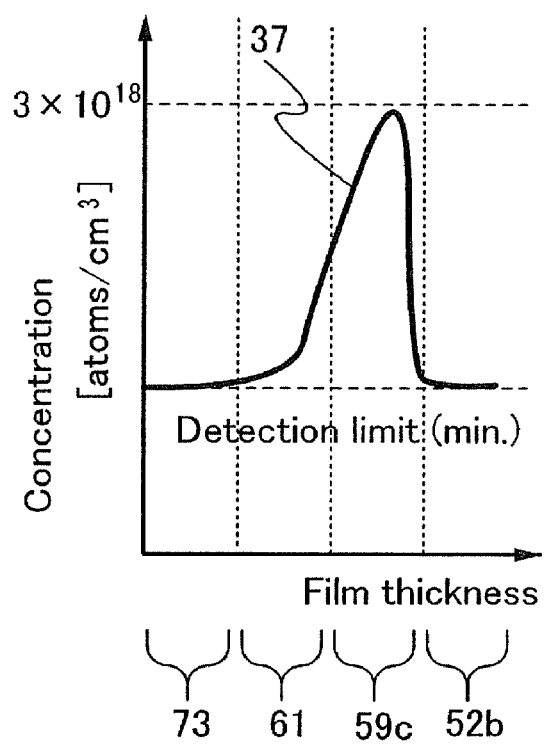
FIG. 9B is a diagram showing a peak concentration of an impurity element in stacked films.

Next, concentration distribution of the impurity element which serves as a donor in a stacked-layer portion including the gate insulating film 52b, the gate insulating film 59c including the impurity element which serves as a donor, the microcrystalline semiconductor film 61 including the impurity element which serves as a donor, and the buffer layer 73 is schematically shown with SIMS by a curve 37 in FIG. 9B.

As shown in FIG. 9B, the concentration of the impurity element which serves as a donor in the thin film transistor shown in FIG. 9A has a peak in the gate insulating film 59c including the impurity element which serves as a donor. The peak is present at or around the interface between the gate insulating film 52b and the gate insulating film 59c including the impurity element which serves as a donor. Further, the concentration of the impurity element which serves as a donor is relatively decreased from the gate insulating film side toward the surface on the side on which the buffer layer 73 is formed. That is, the impurity element which serves as a donor is included at a higher concentration on the gate insulating film 59c side. Furthermore, the shape of the curve that shows the concentration distribution of the impurity element which serves as a donor is not limited to that shown in FIG. 9B, and the concentration may have a peak in or around the center of the gate insulating film 59c including the impurity element which serves as a donor, or at or around the interface between the gate insulating film 59c including the impurity element which serves as a donor and the microcrystalline semiconductor film 61 including the impurity element which serves as a donor.

By forming the microcrystalline semiconductor film 61 including the impurity element which serves as a donor over the gate insulating film 59c including the impurity element which serves as a donor, crystallinity of the microcrystalline semiconductor film 61 can be increased in starting deposition of the microcrystalline semiconductor film 61, and in addition, resistivity of the microcrystalline semiconductor film can be reduced further because the impurity element which serves as a donor is included also in the microcrystalline semiconductor film 61, which functions as a channel. Thus, a thin film transistor with high on current and high field effect mobility can be manufactured.

In the above manner, by forming the accumulation-type thin film transistor in which the microcrystalline semiconductor film and/or the gate insulating film includes the impurity element which servers as a donor, crystallinity can be increased at the interface between the gate insulating film and the microcrystalline semiconductor film and in the entire microcrystalline semiconductor film, and resistivity of the channel formation region can be reduced; thus, a thin film transistor with high field effect mobility and high on current can be manufactured.

Further, forming a channel formation region with a microcrystalline semiconductor film suppresses variation in threshold voltage, improves field effect mobility, and lowers sub-threshold swing (S value); thus, a thin film transistor can achieve high performance. Accordingly, a driving frequency of a display device can be increased, whereby the panel size can be increased and high density of pixels can be achieved. Furthermore, the thin film transistor as described above can be manufactured over a large-area substrate.

Embodiment Mode 2

In this embodiment mode, a method for forming a microcrystalline semiconductor film whose crystallinity in the entire film and at the interface with an insulating film is high will be described. Further, a process for manufacturing the thin film transistors described in Embodiment Mode 1 will be described, in which crystallinity of an entire microcrystalline semiconductor film and at the interface between a gate insulating film and the microcrystalline semiconductor film is high and field effect mobility and on current are higher than those of a thin film transistor including a conventional microcrystalline semiconductor film in a channel formation region.

A thin film transistor having a microcrystalline semiconductor film, which is of an n-type, is more suitable for use in a driver circuit than that of a p-type because the n-type thin film transistor has higher field effect mobility. It is desired that all thin film transistors formed over the same substrate have the same polarity, in order to reduce the number of manufacturing steps. Here, description is made using an n-channel thin film transistor.

First, a manufacturing process of the thin film transistor shown in FIG. 4A is described below.

Figure 11A:
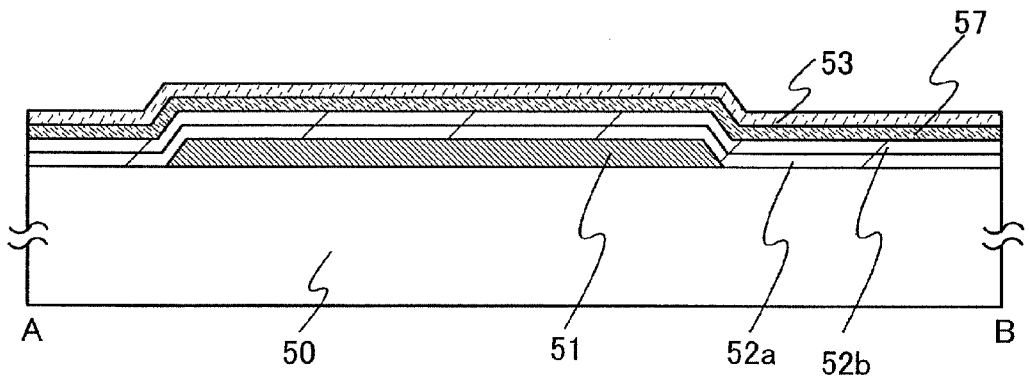
FIGS. 11A to 11C are cross-sectional views illustrating a method for manufacturing a display device of the present invention.

As shown in FIG. 11A, a gate electrode 51 is formed over a substrate 50, and gate insulating films 52a and 52b are formed over the gate electrode 51.

The gate electrode 51 is formed by a sputtering method, a CVD method, a plating method, a printing method, a droplet discharge method, or the like using any of the metal materials described in Embodiment Mode 1. In this embodiment mode, a molybdenum film is formed as a conductive film over the substrate 50 by a sputtering method and is etched by use of a resist mask which is formed using a first photomask, whereby the gate electrode 51 is formed.

Each of the gate insulating films 52a and 52b can be formed by a CVD method, a sputtering method, or the like using a silicon oxide film, a silicon nitride film, a silicon oxynitride film, or a silicon nitride oxide film.

Next, after an impurity element which serves as a donor is adsorbed onto the gate insulating film 52b, a microcrystalline semiconductor film is deposited by a plasma CVD method using a deposition gas including silicon or germanium, and hydrogen, whereby a microcrystalline semiconductor film 57 including the impurity element which serves as a donor is formed.

As a typical example of a method for forming the gate insulating films 52a and 52b and the microcrystalline semiconductor film 57 including the impurity element which serves as a donor, steps of forming a silicon nitride film, a silicon oxynitride film, and a microcrystalline silicon film including phosphorus will be described in chronological order with reference to FIG. 10.

Figure 10:
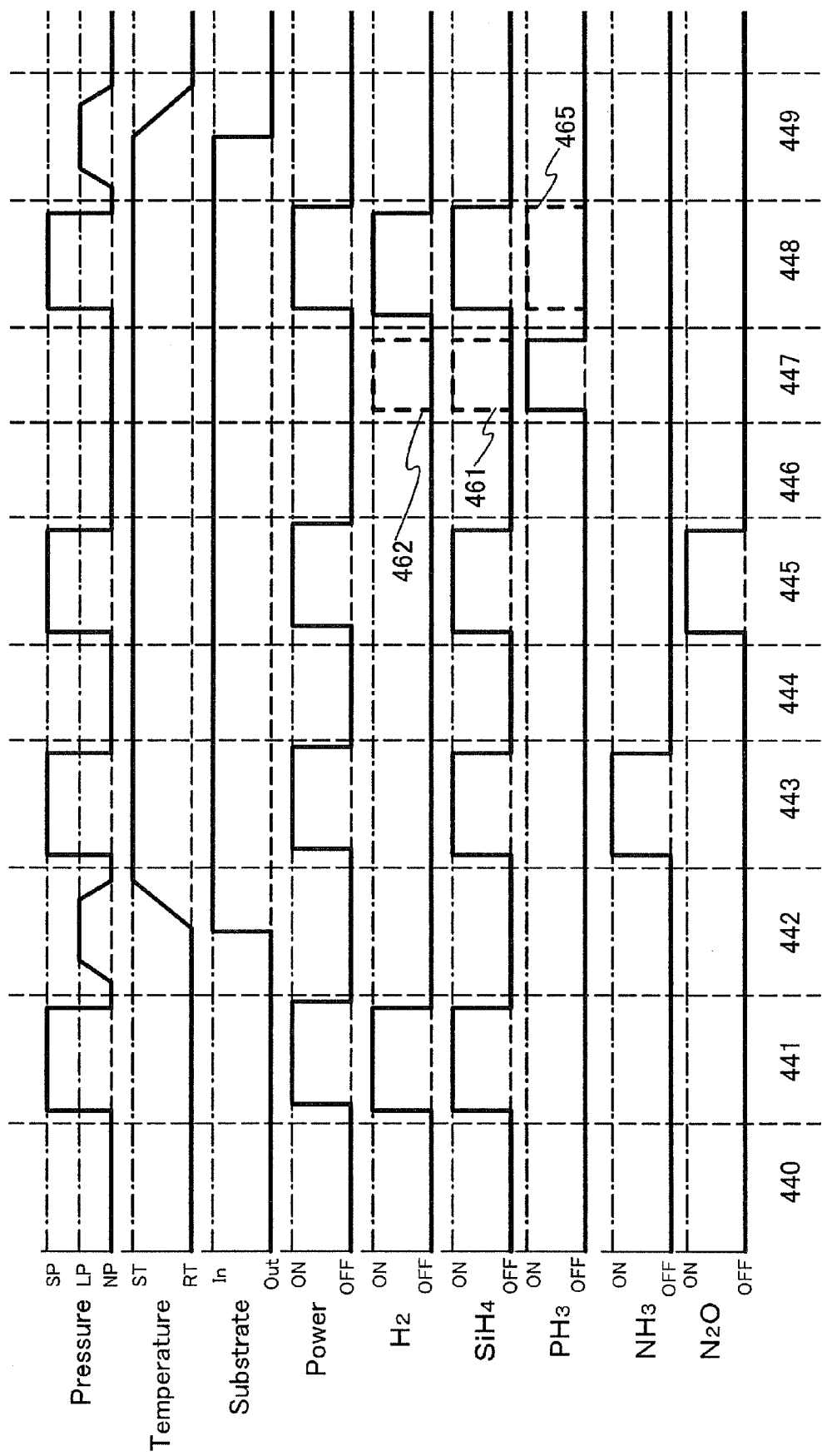
FIG. 10 is an example of a timing chart illustrating a process for forming gate insulating films and a microcrystalline semiconductor film.

FIG. 10 is a typical example of a timing chart for describing steps of forming the gate insulating films 52a and 52b and the microcrystalline semiconductor film 57 including the impurity element which serves as a donor FIG. 10 shows a procedure starting from a step of vacuum evacuation 440 from atmospheric pressure in a reaction chamber of a plasma CVD apparatus. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 445 for forming the gate insulating film 52b, a vacuum evacuation treatment 446, a flush treatment 447, a film formation treatment (3) 448 for forming the microcrystalline semiconductor film 57 including the impurity element which serves as a donor, and substrate carrying-out 449.

First, vacuum evacuation 440 is performed in a reaction chamber to a predetermined degree of vacuum. In the case of high vacuum evacuation, vacuum evacuation is performed by using a turbo molecular pump or the like to obtain a pressure lower than $10^{-1}$ Pa as a degree of vacuum. Alternatively, vacuum evacuation may be performed by using a cryopump to reduce a pressure in the reaction chamber to be lower than $10^{-5}$ Pa, i.e., to an ultra-high vacuum (hereinafter, such a pressure is called NP: normal pressure). In addition, preferably, a heat treatment is performed to the reaction chamber so as to degas the inner wall of the reaction chamber. Further, the temperature is stabilized by operating a heater for heating the substrate (hereinafter, such a temperature is called ST: Setting Temperature). The substrate heating temperature is from 100 to 300° C., preferably from 120 to 220° C.

In the precoating treatment 441, the inner wall of the reaction chamber of the plasma CVD apparatus is precoated with a film having a composition that is the same as or similar to the gate insulating film. Accordingly, it is possible to prevent a metal used to form the reaction chamber from entering the gate insulating film as an impurity. In other words, by covering the inner wall of the reaction chamber with the film having a composition that is the same as or similar to the gate insulating film, the inner wall of the reaction chamber can be prevented from being etched by plasma, and the concentration of the impurity which has entered the gate insulating film from the reaction chamber can be reduced.

In the substrate carrying-in 442, the substrate is carried into the reaction chamber from a load lock chamber connected to the reaction chamber. The pressure in the reaction chamber at this time is the same as that in the load lock chamber (hereinafter, such a pressure is called LP: Load Lock Pressure).

In the film formation treatment (1) 443 for forming the gate insulating film 52a, a source gas, here, hydrogen, silane, and ammonia are introduced and mixed, and a silicon nitride film is formed by glow discharge plasma which is generated by application of high-frequency power (hereinafter, such a pressure is called SP: Setting Pressure). Note that nitrogen may also be introduced to the reaction chamber in addition to the above source gas. After formation of the gate insulating film 52a, introduction of the above source gas is stopped, the power is turned off, and then, generation of plasma is stopped.

In the vacuum evacuation treatment 444, vacuum evacuation is performed in the reaction chamber to a predetermined degree of vacuum.

In the film formation treatment (2) 445 for forming the gate insulating film 52b, a source gas, here, hydrogen, silane, and dinitrogen monoxide are introduced and mixed, and a silicon oxynitride film is formed by glow discharge plasma which is generated by application of high-frequency power. After formation of the gate insulating film 52b, introduction of the above source gas is stopped, the power is turned off, and then, generation of plasma is stopped.

In the vacuum evacuation treatment 446, vacuum evacuation is performed in the reaction chamber to a predetermined degree of vacuum.

In the flush treatment 447, a gas including the impurity element which serves as a donor is introduced to the reaction chamber, and the impurity element which serves as a donor is adsorbed onto the surface of the gate insulating film 52b, furthermore, onto the inner wall of the reaction chamber. In this mode, 0.001 to 1% phosphine (diluted with hydrogen or silane) is introduced to the reaction chamber. Note that phosphine is not necessarily diluted with hydrogen or silane. In addition to the gas including the impurity element which serves as a donor, a deposition gas including silicon or germanium may be introduced as denoted by a dashed line 461 or hydrogen may be introduced as denoted by a dashed line 462, to the reaction chamber. By introducing the deposition gas including silicon or germanium to the reaction chamber, an impurity such as oxygen, nitrogen, or fluorine in the reaction chamber can be discharged from the reaction chamber, so that contamination of a film to be formed can be prevented.

In the film formation treatment (3) 448 for forming the microcrystalline semiconductor film 57 including the impurity element which serves as a donor, a deposition gas including silicon or germanium, which is silane here, hydrogen, and/or a rare gas are introduced and mixed in the reaction chamber, and a microcrystalline silicon film is formed by glow discharge plasma which is generated by application of high-frequency power. Silane is diluted with hydrogen and/or a rare gas to be 10 to 2000 times thinner. Therefore, a large amount of hydrogen and/or a rare gas is needed. The substrate heating temperature is from 100 to 300° C., preferably from 120 to 220° C. It is preferable that the film be formed at temperatures of from 120 to 220° C. so that a growing surface of the microcrystalline silicon film is inactivated with hydrogen, and growth of microcrystalline silicon is promoted. At this time, the microcrystalline silicon grows using the impurity element which serves as a donor and is adsorbed onto the surface of the gate insulating film 52b, here, phosphorus, as a crystal nucleus. Thus, an amorphous semiconductor is not formed in an early stage of deposition of the semiconductor film, and crystals grow in a normal direction with respect to the gate insulating film 52b, so that a microcrystalline semiconductor film with high crystallinity in which columnar-like microcrystalline semiconductors are arranged can be formed. In addition, the impurity element which serves as a donor and is adsorbed onto the surface of the gate insulating film 52b is included in the microcrystalline semiconductor film, so that a highly conductive microcrystalline semiconductor film including the impurity element which serves as a donor can be formed.

As a deposition gas including silicon or germanium, SiH$_4$, Si$_2$H$_6$, SiH$_2$Cl$_2$, SiHCl$_3$, SiCl$_4$, SiF$_4$, GeH$_4$, Ge$_2$H$_6$, GeH$_2$Cl$_2$, GeHCl$_3$, GeCl$_4$, GeF$_4$, or used as appropriate. Further, an energy band width may be adjusted to be from 0.9 to 1.1 eV by mixing germanium hydride or germanium fluoride such as GeH$_4$ or GeF$_4$ into a gas such as silane. By adding germanium to silicon, the temperature characteristic of a thin film transistor can be changed.

In the substrate carrying-out 449, the substrate is taken out of the reaction chamber and carried into the load lock chamber connected to the reaction chamber The pressure in the reaction chamber at this time is the same as that in the load lock chamber.

The film formation treatment (3) 448 for forming the microcrystalline semiconductor film 57 including the impurity element which serves as a donor is carried out after the flush treatment 447 here. However, instead of these treatments, the microcrystalline semiconductor film 57 including the impurity element which serves as a donor can be formed without the flush treatment 447 as follows: as denoted by a dashed line 465, a deposition gas including silicon or germanium, hydrogen, and/or a rare gas, and a gas including an impurity element which serves as a donor are mixed, and the microcrystalline semiconductor film 57 including the impurity element which serves as a donor is formed by glow discharge plasma.

In a conventional method for forming a microcrystalline semiconductor film, an amorphous semiconductor layer is formed in an early stage of deposition due to an impurity, lattice mismatch, or the like. In an inverted staggered thin film transistor, carriers flow in a region of a microcrystalline semiconductor film around a gate insulating film. Thus, when an amorphous semiconductor layer is formed at the interface between the gate insulating film and the microcrystalline semiconductor film, the mobility is decreased, and further, the amount of current is reduced, so that electric characteristics of the thin film transistor are lowered.

However, if the impurity element which serves as a donor is present in the reaction chamber in formation of the microcrystalline semiconductor film including the impurity element which serves as a donor by a plasma CVD method, silicon and the impurity element which serves as a donor are likely to react with each other in plasma to form a crystal nucleus. When crystal nuclei are deposited over the gate insulating film, crystals grow from the crystal nuclei, so that formation of an amorphous semiconductor film at the interface between the gate insulating film and the microcrystalline semiconductor film can be reduced. In addition, the microcrystalline semiconductor film is deposited while taking in the impurity element which serves a donor and remains in the reaction chamber, whereby microcrystallization can be promoted.

Further, in the case that the microcrystalline semiconductor film including the impurity element which serves as a donor is formed by a plasma CVD method, by dilution with a large amount of hydrogen which can easily etch an amorphous semiconductor film selectively or by use of a fluoride of hydrogen, silicon, germanium, or the like having an etching effect, an amorphous semiconductor film which is formed in formation of the microcrystalline semiconductor film can be selectively etched, and the microcrystallization rate can be enhanced, so that crystallinity at the interface between the microcrystalline semiconductor film and the gate insulating film can be improved. As a fluoride of hydrogen, silicon, germanium, or the like having an etching effect, HF, SiF$_4$, SiHF$_3$, SiH$_2$F$_2$, SiH$_3$F, Si$_2$F$_6$, GeF$_4$, GeHF$_3$, GeH$_2$F, Ge$_2$F$_6$, or the like can be given.

As a result, by forming the microcrystalline semiconductor film including the impurity element which serves as a donor over the gate insulating film as in this mode, crystallinity in a film thickness direction can be improved, and crystallinity at the interface between the gate insulating film and the microcrystalline semiconductor film can be improved.

Next, as shown in FIG. 11A, a microcrystalline semiconductor film 53 not including the impurity element which serves as a donor at a higher concentration than the detection limit of SIMS is formed over the microcrystalline semiconductor film 57 including the impurity element which serves as a donor. The microcrystalline semiconductor film 53 not including the impurity element which serves as a donor at a higher concentration than the detection limit of SIMS is formed as follows: a deposition gas including silicon or germanium, which is silane here, hydrogen, and/or a rare gas are mixed in a reaction chamber, and a microcrystalline semiconductor film is formed by glow discharge plasma. Silane is diluted with hydrogen and/or a rare gas to be 10 to 2000 times thinner. Therefore, a large amount of hydrogen and/or a rare gas is needed. The substrate heating temperature is from 100 to 300° C., preferably from 120 to 220° C. It is preferable that the film be formed at temperatures of from 120 to 220° C. so that a growing surface of the microcrystalline silicon film is inactivated with hydrogen, and growth of microcrystalline silicon is promoted. By forming the microcrystalline semiconductor film 53 in a reaction chamber different from that for forming the microcrystalline semiconductor film 57 including the impurity element which serves as a donor, the microcrystalline semiconductor film 53 not including the impurity element which serves as a donor at a higher concentration than the detection limit of SIMS can be formed. Also by forming the microcrystalline semiconductor film 53 successively without the substrate carrying-out 449 shown in FIG. 10, the microcrystalline semiconductor film 53 not including the impurity element which serves as a donor at a higher concentration than the detection limit of SIMS can be formed; in this case, in the flush treatment 447, it is preferable to reduce the concentration of the impurity element which serves as a donor and is adsorbed onto the gate insulating film 52$b$ and the inner wall of the reaction chamber.

Figure 11B:
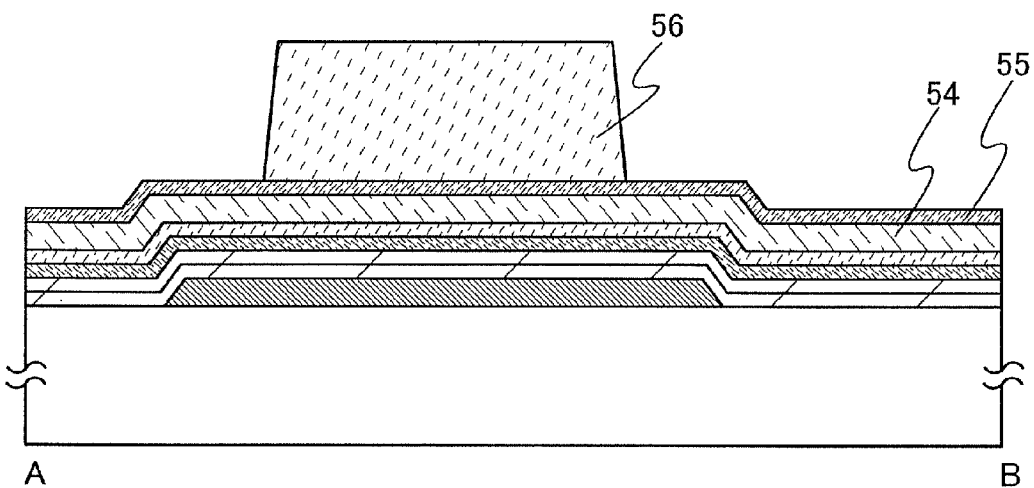

Next, as shown in FIG. 11B, a buffer layer 54 and a semiconductor film 55 to which an impurity element imparting one conductivity type is added are formed over the microcrystalline semiconductor film 53 not including the impurity element which serves as a donor at a higher concentration than the detection limit of SIMS. Then, a resist mask 56 is formed over the semiconductor film 55 to which the impurity element imparting one conductivity type is added.

As the buffer layer 54, an amorphous semiconductor film can be formed by a plasma CVD method using a deposition gas including silicon or germanium. Alternatively, by dilution of a deposition gas including silicon or germanium with one or plural kinds of rare gases selected from helium, argon, krypton, and neon, an amorphous semiconductor film can be formed. Furthermore, an amorphous semiconductor film including hydrogen can be formed using hydrogen with a flow rate of 1 to 5 times as high as that of a deposition gas including silicon or germanium. In addition, nitrogen, or halogen such as fluorine or chlorine may be added to the above hydrogenated semiconductor film.

Also, as the buffer layer 54, an amorphous semiconductor film can be formed by sputtering with hydrogen or a rare gas, using a semiconductor such as silicon or germanium as a target.

The buffer layer 54 is preferably formed using an amorphous semiconductor film which does not include crystal grains. Therefore, in the case that the buffer layer 54 is formed by a high-frequency plasma CVD method with a frequency of several tens of MHz to several hundred MHz or a microwave plasma CVD method, film formation conditions are preferably controlled such that the amorphous semiconductor film does not include crystal grains.

In some cases, the buffer layer 54 is partly etched in a later step for forming source and drain regions. Thus, the buffer layer 54 is preferably formed with such a thickness that a part thereof is left at that time. Typically, it is preferable to form the buffer layer 54 with a thickness of from 30 to 500 nm inclusive, preferably from 50 to 200 nm inclusive. In a display device including a thin film transistor to which a high voltage (e.g., about 15 V) is applied, typically, in a liquid crystal display device, if the buffer layer 54 is formed thickly, withstand voltage is increased, so that deterioration of the thin film transistor can be prevented even if a high voltage is applied to the thin film transistor.

Formation of an amorphous semiconductor film or an amorphous semiconductor film including hydrogen, nitrogen, or halogen as the buffer layer 54 over the surface of the microcrystalline semiconductor film 53 not including the impurity element which serves as a donor at a higher concentration than the detection limit of SIMS can prevent a surface of a crystal grain included in the microcrystalline semiconductor film 53 from being naturally oxidized. In particular, in a region where an amorphous semiconductor is in contact with microcrystal grains, a crack is likely to be caused due to local stress. When this crack is exposed to oxygen, the crystal grains are oxidized, whereby silicon oxide is formed. However, by formation of the buffer layer 54 over the surface of the microcrystalline semiconductor film 53 not including the impurity element which serves as a donor at a higher concentration than the detection limit of SIMS, the microcrystal grains can be prevented from being oxidized.

Since the buffer layer 54 is formed using an amorphous semiconductor film or an amorphous semiconductor film including hydrogen, nitrogen, or halogen, the buffer layer 54 has a larger energy gap and higher resistivity than the microcrystalline semiconductor film 53 and low mobility which is one fifth to one tenth that of the microcrystalline semiconductor film 53. Therefore, in a thin film transistor to be formed later, the buffer layer 54 formed between source and drain regions and the microcrystalline semiconductor film 53 not including the impurity element which serves as a donor at a higher concentration than the detection limit of SIMIS functions as a high-resistance region and the microcrystalline semiconductor film 57 functions as a channel formation region. Accordingly, off current of the thin film transistor can be reduced. In addition, when the thin film transistor is used as a switching element of a display device, the display device can have an improved contrast.

The buffer layer 54 can also be formed at temperatures of from 300 to 400° C. by a plasma CVD method after forming the microcrystalline semiconductor film 53 not including the impurity element which serves as a donor at a higher concentration than the detection limit of SIMS. By this treatment, hydrogen is supplied to the microcrystalline semiconductor film 53, and the same effect as hydrogenizing the microcrystalline semiconductor film 53 not including the impurity element which serves as a donor at a higher concentration than the detection limit of SIMS can be obtained. In other words, by depositing the buffer layer 54 over the microcrystalline semiconductor film 53, hydrogen is diffused into the microcrystalline semiconductor film 53 not including the impurity element which serves as a donor at a higher concentration than the detection limit of SIMS, and a dangling bond can be terminated.

After forming the microcrystalline semiconductor film 57 including the impurity element which serves as a donor, by forming the buffer layer 54 without forming the microcrystalline semiconductor film 53 not including the impurity element which serves as a donor at a higher concentration than the detection limit of SIMS, the thin film transistor as shown in FIG. 1A can be manufactured.

In the case that an n-channel thin film transistor is to be formed, phosphorus may be added as a typical impurity element to the semiconductor film 55 to which the impurity element imparting one conductivity type is added, and an impurity gas such as $PH_3$ may be added to silicon hydride. When a p-channel thin film transistor is to be formed, boron may be added as a typical impurity element; for example, an impurity gas such as $B_2H_6$ may be added to silicon hydride. The semiconductor film 55 to which the impurity element imparting one conductivity type is added can be formed of a microcrystalline semiconductor or an amorphous semiconductor. The semiconductor film 55 to which the impurity element imparting one conductivity type is added is formed with a thickness of from 2 to 50 nm inclusive. By formation of the semiconductor film to which the impurity element imparting one conductivity type is added with a small thickness, throughput can be improved.

Then, the resist mask 56 is formed over the semiconductor film 55 to which the impurity element imparting one conductivity type is added.

The resist mask 56 is formed by a photolithography technique. Here, using a second photomask, the resist mask 56 is formed by exposing a resist that is applied on the semiconductor film 55 to which the impurity element imparting one conductivity type is added to light and developing the resist.

Figure 11C:
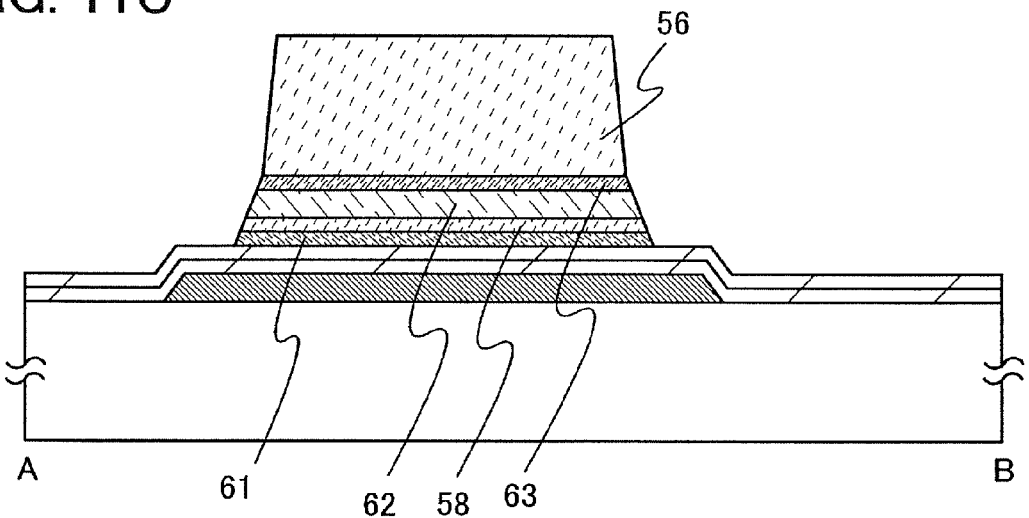
Figure 14A:
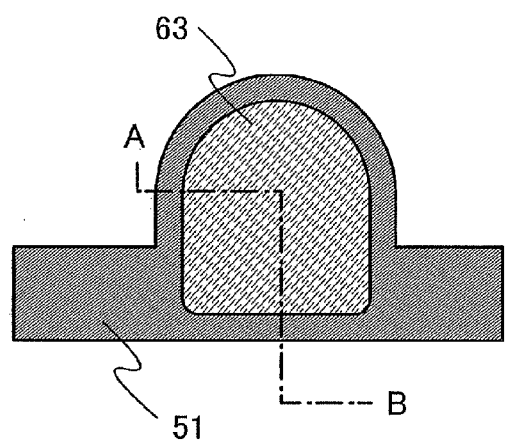
FIGS. 14A to 14C are top views illustrating a method for manufacturing a display device of the present invention.

Next, the microcrystalline semiconductor film 57 including the impurity element which serves as a donor, the microcrystalline semiconductor film 53 not including the impurity element which serves as a donor at a higher concentration than the detection limit of SIMS, the buffer layer 54, and the semiconductor film 55 to which the impurity element imparting one conductivity is added are etched using the resist mask 56, whereby a microcrystalline semiconductor film 61 including the impurity element which serves as a donor, a microcrystalline semiconductor film 58 not including the impurity element which serves as a donor at a higher concentration than the detection limit of SIMS, a buffer layer 62, and a semiconductor film 63 to which the impurity element imparting one conductivity type is added are formed as shown in FIG. 11C. After that, the resist mask 56 is removed. FIG. 11C shows a cross section taken along a line A-B in FIG. 14A (except for the resist mask 56).

With side surfaces of end portions of the microcrystalline semiconductor film 61 including the impurity element which serves as a donor, the microcrystalline semiconductor film 58 not including the impurity element which serves as a donor at a higher concentration than the detection limit of SIMS, and the buffer layer 62 having inclines, the microcrystalline semiconductor film 58 and source and drain regions have a larger distance therebetween, so that leak current between the microcrystalline semiconductor film 61 and the source and drain regions formed over the buffer layer 62 can be prevented. In addition, leak current between wirings and the microcrystalline semiconductor film 61 can also be prevented. The inclination angle of the side surfaces of the end portions of the microcrystalline semiconductor film 61, the microcrystalline semiconductor film 58, and the buffer layer 62 is from 30° to 90°, preferably from 45° to 80°. With such an angle, disconnection of the wirings due to a step shape can be prevented.

Figure 12A:
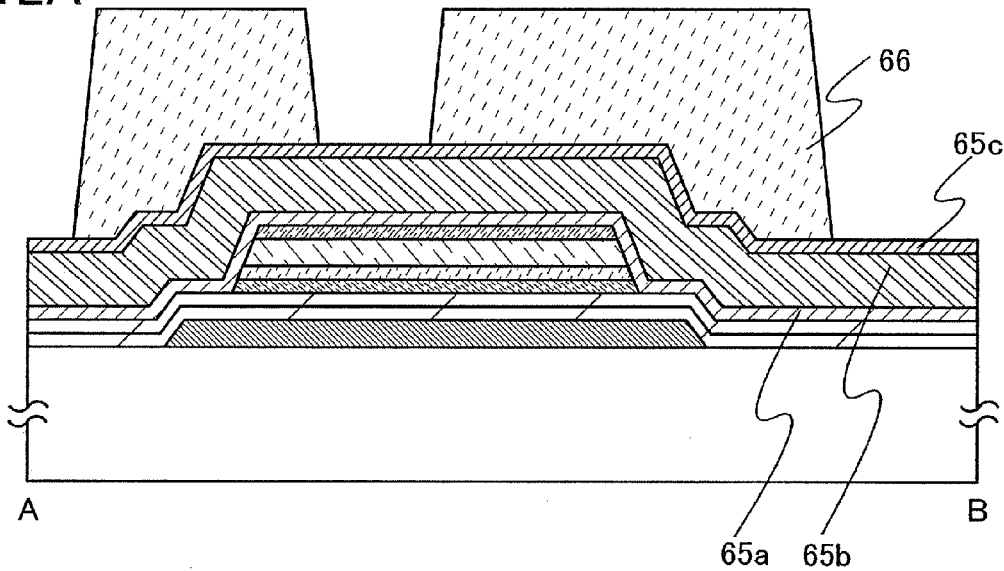
FIGS. 12A to 12C are cross-sectional views illustrating a method for manufacturing a display device of the present invention.

Next as shown in FIG. 12A, conductive films 65a to 65c are formed over the semiconductor film 63 to which the impurity element imparting one conductivity type is added and the gate insulating film 52b, and then, a resist mask 66 is formed over the conductive films 65a to 65c. The conductive films 65a to 65c are formed by a sputtering method, a CVD method, a printing method, a droplet discharge method, an evaporation method, or the like. Here, as the conductive film, a conductive film having a three-layer structure in which the conductive films 65a to 65c are stacked is shown, and a molybdenum film may be used for each of the conductive films 65a and 65c and an aluminum film may be used for the conductive film 65b, or a titanium film may be used for each of the conductive films 65a and 65c and an aluminum film may be used for the conductive film 65b. The conductive films 65a to 65c are formed by a sputtering method or a vacuum evaporation method.

The resist mask 66 can be formed in a manner similar to the resist mask 56.

Figure 12B:
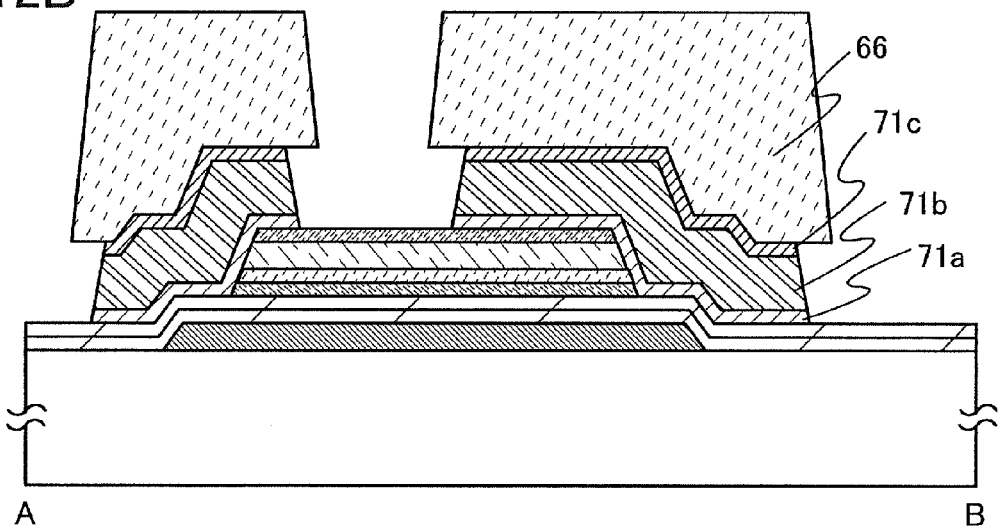

Next, as shown in FIG. 12B, the conductive films 65a to 65c are partly etched to form pairs of wirings 71a to 71c (functioning as source and drain electrodes). Here, the conductive films 65a to 65c are etched by wet etching using the resist mask 66 that is formed by a photolithography process using a third photomask, so that the conductive films 65a to 65c are selectively etched. Consequently, since the conductive films 65a to 65c are etched isotropically, the wirings 71a to 71c, which have smaller areas than the resist mask 66, can be formed.

Figure 12C:
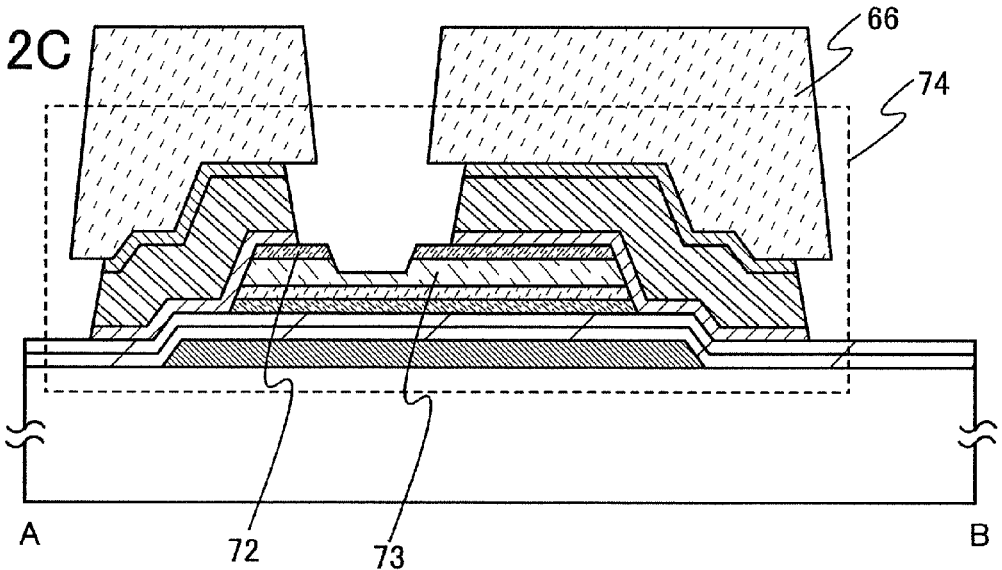

Then, the semiconductor film 63 to which the impurity element imparting one conductivity type is added is etched to be separated using the resist mask 66. As a result, a pair of semiconductor films 72 which serve as source and drain regions can be formed as shown in FIG. 12C. In this etching process, the buffer layer 62 is also partly etched. The buffer layer which is etched partly and has a recessed portion is referred to as a buffer layer 73. The source and drain regions and the recessed portion of the buffer layer can be formed in the same process. The depth of the recessed portion in the buffer layer is set to be half to one third the thickness of the thickest region in the buffer layer, so that the source region and the drain region can have a distance therebetween. Accordingly, leak current between the source region and the drain region can be reduced. After that, the resist mask 66 is removed.

Next, dry etching is performed under such a condition that the buffer layer which is exposed is not damaged and an etching rate with respect to the buffer layer is low. Through this dry etching step, an etching residue on the buffer layer between the source region and the drain region, a residue of the resist mask, and a contamination source in the apparatus used for removal of the resist mask can be removed, whereby the source region and the drain region can be certainly insulated. As a result, leak current of the thin film transistor can be reduced, so that a thin film transistor with small off current and high withstand voltage can be manufactured. A chlorine gas can be used for an etching gas, for example.

Figure 14B:
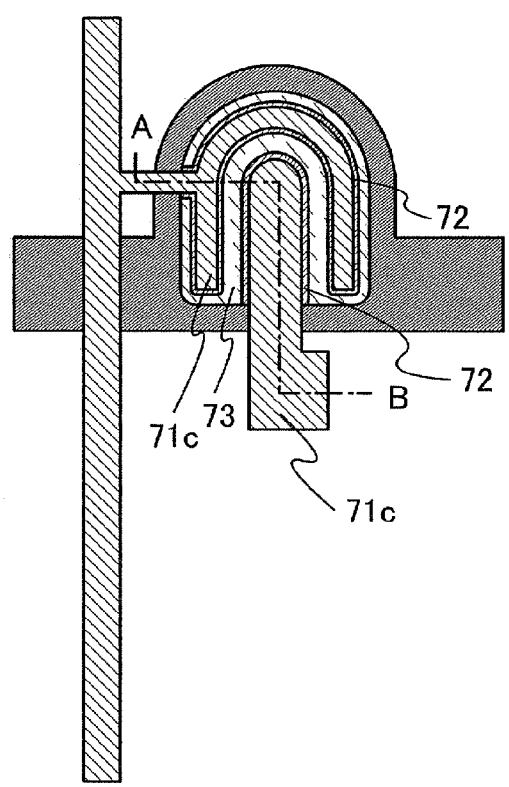

FIG. 12C shows a cross section taken along a line A-B in FIG. 14B (except for the resist mask 66). As shown in FIG. 14B, end portions of the semiconductor films 72 which serve as source and drain regions are located outside those of the wirings 71c. Further, end portions of the buffer layer 73 are located outside those of the wirings 71c and those of the semiconductor films 72 which serve as source and drain regions. Furthermore, one of the wirings surrounds the other (specifically, the former wiring is in a U-shape or a C-shape). Thus, an area of a region in which carriers travel can be increased, and thus, the amount of current can be increased and an area of a thin film transistor can be reduced. Over the gate electrode, the microcrystalline semiconductor film and the wirings are overlapped, and thus, an influence by unevenness due to the gate electrode is small and reduction in coverage and generation of leak current can be suppressed.

Through the above-described process, a channel-etched thin film transistor 74 can be formed.

Figure 13A:
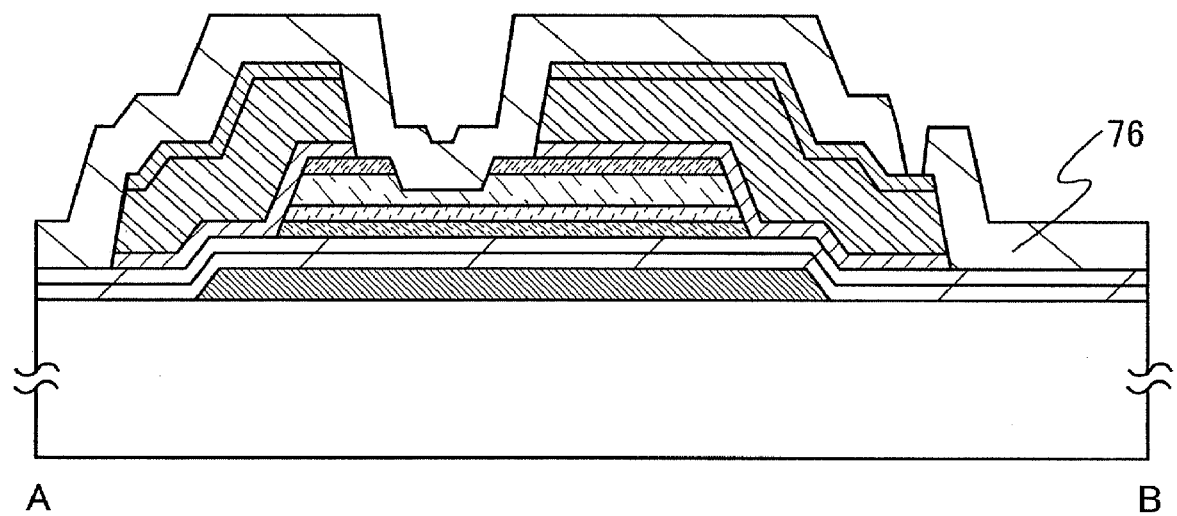
FIGS. 13A and 13B are cross-sectional views illustrating a method for manufacturing a display device of the present invention.

Next, as shown in FIG. 13A, a protective insulating film 76 is formed over the wirings 71a to 71c, the semiconductor films 72 which serve as source and drain regions, the buffer layer 73, and the gate insulating film 52b. The protective insulating film 76 can be formed in a similar manner to the gate insulating films 52a and 52b. The protective insulating film 76 prevents intrusion of a contaminating impurity such as an organic matter, a metal, or water vapor included in the air; thus, a dense film is preferably used for the protective insulating film 76. Further, by using a silicon nitride film as the protective insulating film 76, the oxygen concentration in the buffer layer 73 can be set at less than or equal to $5\times10^{19}$ atoms/cm$^3$, preferably less than or equal to $1\times10^{19}$ atoms/cm$^3$, so that the buffer layer 73 can be prevented from being oxidized.

Figure 13B:
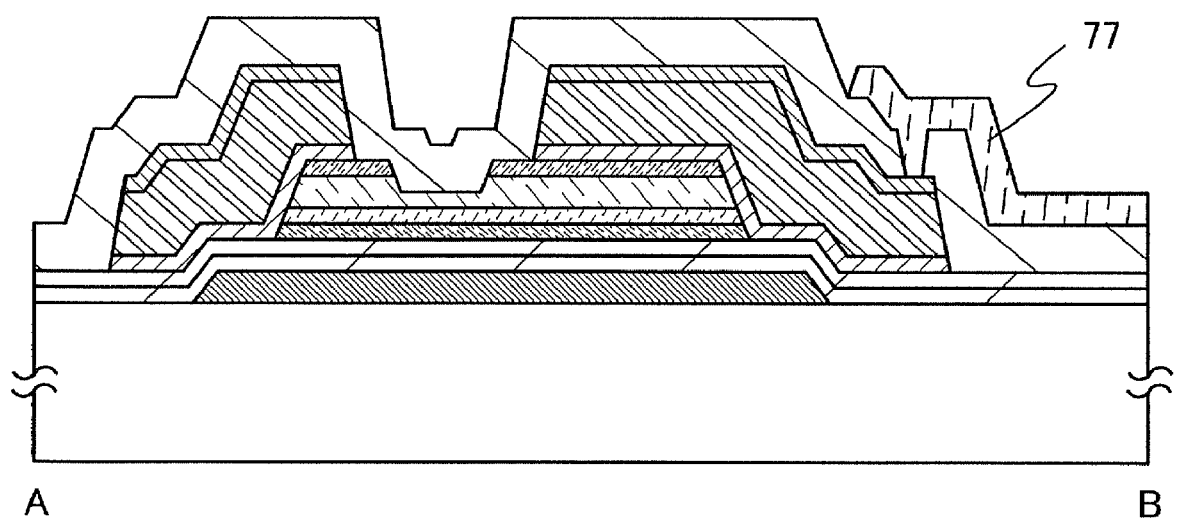
Figure 14C:
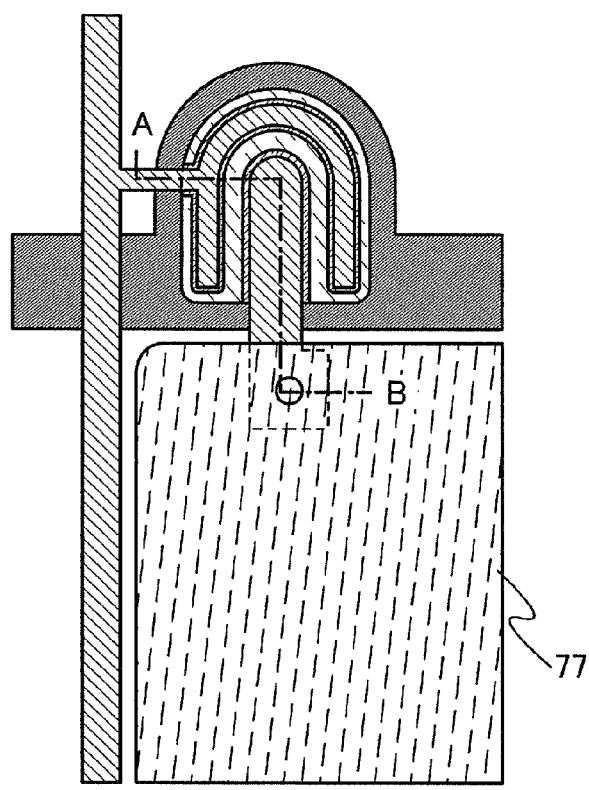

Next, as shown in FIG. 13B, a contact hole is formed in the protective insulating film 76 by partly etching the protective insulating film 76 using a resist mask formed using a fourth photomask. Then, a pixel electrode 77 that is in contact with the wiring 71c in the contact hole is formed. FIG. 13B shows a cross section taken along a line A-B in FIG. 14C.

The pixel electrode 77 can be formed of a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

The pixel electrode 77 can be formed using a conductive composition including a conductive high-molecular compound (also referred to as a conductive polymer). It is preferable that a pixel electrode formed using a conductive composition have sheet resistance of less than or equal to 10000 Ω/square, and light transmittance of greater than or equal to 70% at a wavelength of 550 nm. In addition, the resistivity of the conductive high-molecular compound which is included in the conductive composition is desirably less than or equal to 0.1 Ω·cm.

As the conductive high-molecular compound, a so-called n electron conjugated conductive high-molecular compound can be used. Examples thereof include polyaniline and its derivatives, polypyrrole and its derivatives, polythiophene and its derivatives, and copolymers of two or more kinds of them.

Here, the pixel electrode 77 is formed as follows: an ITO film is formed by a sputtering method, a resist is applied on the ITO film and exposed to light and developed using a fifth photomask, thereby forming a resist mask, and then, the ITO film is etched using the resist mask.

Accordingly, a thin film transistor and an element substrate that can be used for a display device can be formed.

Next, a manufacturing process of the thin film transistor shown in FIG. 8A will be described below.

As in the step shown in FIG. 11A, a gate electrode 51 is formed over a substrate 50, and a gate insulating film 52a is formed over the gate electrode 51.

Figure 19:
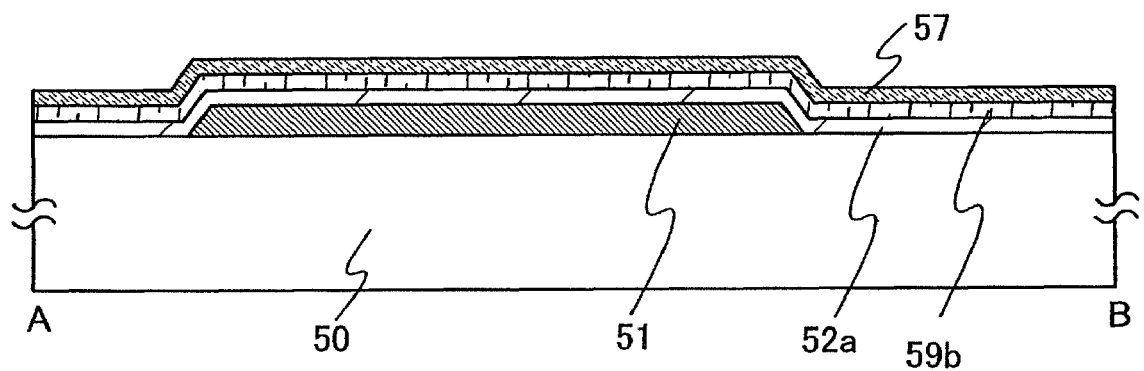
FIG. 19 is a cross-sectional view illustrating a method for manufacturing a display device of the present invention.

Next, as shown in FIG. 19, a gate insulating film 59b including an impurity element which serves as a donor is formed over the gate insulating film 52a, and a microcrystalline semiconductor film 57 including the impurity element which serves as a donor is formed by a plasma CVD method using a deposition gas including silicon or germanium, and hydrogen over the gate insulating film 59b.

Next, a manufacturing process of the thin film transistor shown in FIG. 6A will be described below.

As in the step shown in FIG. 11A, a gate electrode 51 is formed over a substrate 50.

Figure 16:
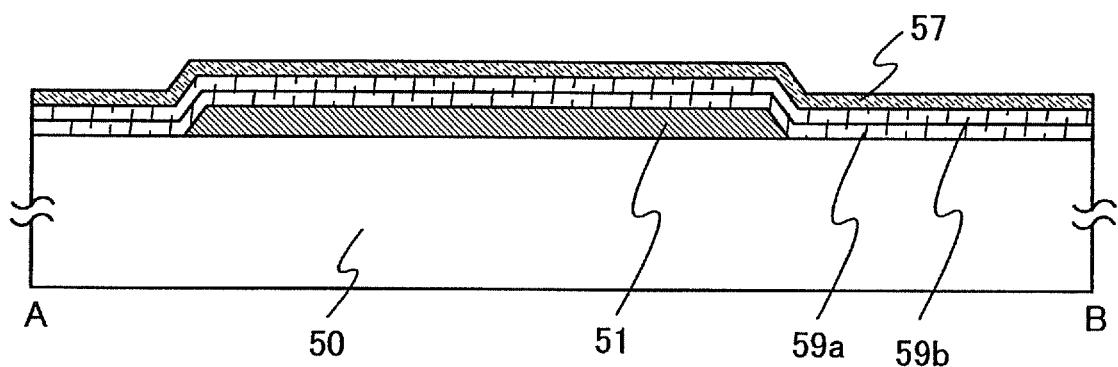
FIG. 16 is a cross-sectional view illustrating a method for manufacturing a display device of the present invention.

Next, after a film including an impurity element which serves as a donor is formed as a protective film on the inner wall of a reaction chamber of a plasma CVD apparatus, the substrate 50 is carried into the reaction chamber, and then, gate insulating films 59a and 59b including the impurity element which serves as a donor and a microcrystalline semiconductor film 57 including the impurity element which serves as a donor are deposited over the gate electrode 51 as shown in FIG. 16. In this case, by making the inside of the reaction chamber vacuum and by generating plasma, the impurity element which serves as a donor is released from the protective film formed on the inner wall of the reaction chamber to the inside of the reaction chamber. The gate insulating films and the microcrystalline semiconductor film are formed while taking in the impurity element which serves as a donor and is released from the protective film, so that the gate insulating films each including the impurity element which serves as a donor and the microcrystalline semiconductor film including the impurity element which serves as a donor can be formed over the gate electrode.

As a typical example of a method for forming the gate insulating films 59a and 59b including the impurity element which serves as a donor and the microcrystalline semiconductor film 57 including the impurity element which serves as a donor, steps of forming a silicon nitride film including phosphorus, a silicon oxynitride film including phosphorus, and a microcrystalline silicon film including phosphorus will be described in chronological order with reference to FIG. 15.

Figure 15:
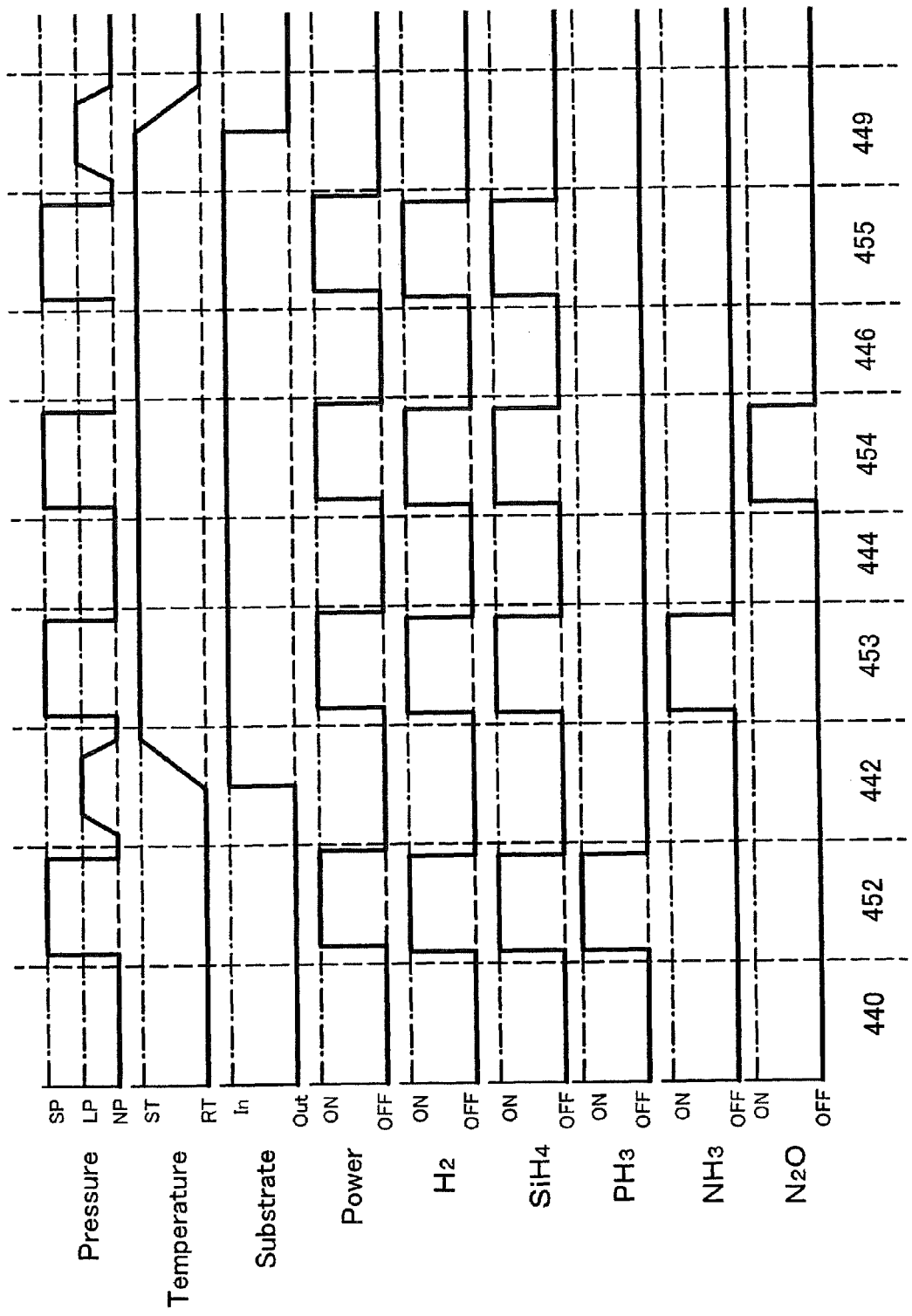
FIG. 15 is an example of a timing chart illustrating a process for forming gate insulating films and a microcrystalline semiconductor film.

FIG. 15 is a typical example of a timing chart for describing steps of forming the gate insulating films 59a and 59b including the impurity element which serves as a donor and the microcrystalline semiconductor film 57 including the impurity element which serves as a donor. FIG. 15 shows a procedure starting from a step of vacuum evacuation 440 from atmospheric pressure in a reaction chamber. Then, the following treatments, which are carried out after the vacuum evacuation 440, are shown in chronological order: a precoating treatment 452, substrate carrying-in 442, a film formation treatment (1) 453 for forming the gate insulating film 59a including the impurity element which serves as a donor, a vacuum evacuation treatment 444, a film formation treatment (2) 454 for forming the gate insulating film 59b including the impurity element which serves as a donor, a vacuum evacuation treatment 446, a film formation treatment (3) 455 for forming the microcrystalline semiconductor film 57 including the impurity element which serves as a donor, and substrate carrying-out 449.

In the precoating treatment 452, the inner wall of the reaction chamber of a plasma CVD apparatus is precoated with, as a protective film, a film having a composition that is the same as or similar to the gate insulating film including the impurity element which serves as a donor. In this mode, 0.001 to 1% phosphine (diluted with hydrogen or silane), a deposition gas including silicon or germanium, which is silane here, hydrogen, and at least one of ammonia, dinitrogen monoxide, and nitrogen are introduced and mixed in the reaction chamber. Then, by glow discharge plasma which is generated by application of high-frequency power, a silicon oxynitride film including phosphorus, a silicon oxide film including phosphorus, a silicon nitride film including phosphorus, or a silicon nitride oxide film including phosphorus is formed. Accordingly, it is possible to prevent a metal used to form the reaction chamber from entering the gate insulating films as an impurity and to add the impurity element which serves as a donor to the gate insulating films, the microcrystalline semiconductor film, and the like which are formed later.

In the substrate carrying-in 442, the substrate is carried into the reaction chamber from a load lock chamber connected to the reaction chamber. Before and after the substrate carrying-in, the pressure in the reaction chamber is reduced for performing vacuum evacuation. At that time, the impurity element which serves as a donor is released from the precoating protective film formed on the inner wall of the reaction chamber into the inside of the reaction chamber.

In the film formation treatment (1) 453 for forming the gate insulating film 59a including the impurity element which serves as a donor, a source gas, here, hydrogen, silane, and ammonia are mixed. Then, a silicon nitride film is deposited by glow discharge plasma, while taking in the impurity element which serves as a donor and is released into the inside of the reaction chamber, which is phosphorus here. When glow discharge plasma spreads to the inner wall of the reaction chamber, the impurity element which serves as a donor, here, phosphorus, is released from the precoating protective film formed on the inner wall of the reaction chamber, in addition to the above source gas. Accordingly, a silicon nitride film including phosphorus can be formed. Note that nitrogen may also be introduced to the reaction chamber in addition to the above source gas. After formation of the gate insulating film 59a including the impurity element which serves as a donor, introduction of the above source gas is stopped, the power is turned off, and then, generation of plasma is stopped.

In the vacuum evacuation treatment 444, vacuum evacuation is performed in the reaction chamber to a predetermined degree of vacuum.

In the film formation treatment (2) 454 for forming the gate insulating film 59b including the impurity element which serves as a donor, a source gas, here, hydrogen, silane, and dinitrogen monoxide are introduced and mixed. Then, a silicon oxynitride film is formed by glow discharge plasma which is generated by application of high-frequency power, while taking in the impurity element which serves as a donor and is released into the inside of the reaction chamber, which is phosphorus here. After formation of the gate insulating film 59b including the impurity element which serves as a donor, introduction of the above source gas is stopped, the power is turned off, and then, generation of plasma is stopped.

In the vacuum evacuation treatment 446, vacuum evacuation is performed in the reaction chamber to a predetermined degree of vacuum.

In the film formation treatment (3) 455 for forming the microcrystalline semiconductor film 57 including the impurity element which serves as a donor, a deposition gas including silicon or germanium, which is silane here, hydrogen, and/or a rare gas are introduced and mixed in the reaction chamber, and a microcrystalline silicon film is formed by glow discharge plasma which is generated by application of high-frequency power. Silane is diluted with hydrogen and/or a rare gas to be 10 to 2000 times thinner. Therefore, a large amount of hydrogen and/or a rare gas is needed. The substrate heating temperature is from 100 to 300° C., preferably from 120 to 220° C. At this time, when glow discharge plasma spreads to the inner wall of the reaction chamber, the impurity element which serves as a donor, here, phosphorus, is released from the precoating protective film formed on the inner wall of the reaction chamber, in addition to the above source gas. The microcrystalline semiconductor film is deposited while taking in the impurity element which serves as a donor and is released into the inside of the reaction chamber, and thus, a microcrystalline semiconductor film including phosphorus can be formed. Therefore, an amorphous semiconductor is not formed in an early stage of deposition of the semiconductor film, crystals grow in a normal direction with respect to the gate insulating film 59b, and a microcrystalline semiconductor film with high crystallinity in which columnar-like microcrystalline semiconductors are arranged can be formed. Further, a highly conductive microcrystalline semiconductor film including the impurity element which serves as a donor can be formed. Furthermore, by use of a fluoride of hydrogen, silicon, germanium, or the like, or fluorine having an etching effect as a part of a source gas, an amorphous semiconductor which is formed in formation of the microcrystalline semiconductor film can be selectively etched, and the microcrystallization rate can be enhanced, whereby crystallinity at the interface between the gate insulating film and the microcrystalline semiconductor film can be improved.

A feature of this mode is that the gate insulating films 59a and 59b including the impurity element which serves as a donor and the microcrystalline semiconductor film 57 including the impurity element which serves as a donor are formed. The peak concentration of the impurity element which serves as a donor is from $6\times10^{15}$ to $3\times10^{18}$ atoms/cm$^3$ inclusive, preferably from $1\times10^{16}$ to $3\times10^{18}$ atoms/cm$^3$ inclusive, more preferably from $3\times10^{16}$ to $3\times10^{17}$ atoms/cm$^3$ inclusive.

In the substrate carrying-out 449, the substrate is taken out of the reaction chamber and carried into the load lock chamber connected to the reaction chamber The pressure in the reaction chamber at this time is the same as that in the load lock chamber.

Next, as shown in FIG. 11B, a buffer layer 54 and a semiconductor film 55 to which an impurity element imparting one conductivity type is added are formed over the microcrystalline semiconductor film 57 including the impurity element which serves as a donor. Then, through the steps shown in FIG. 11C and FIGS. 12A to 12C, the thin film transistor as shown in FIG. 6A can be manufactured. In addition, through the steps shown in FIGS. 13A and 13B, an element substrate which can be used for a display device can be formed.

Further, after formation of a microcrystalline semiconductor film not including the impurity element which serves as a donor at a higher concentration than the detection limit of SIMS between the microcrystalline semiconductor film 57 including the impurity element which serves as a donor and the buffer layer 54, through the steps shown in FIGS. 11B and 11C and FIGS. 12A to 12C, a thin film transistor can be manufactured. In addition, through the steps shown in FIGS. 13A and 13B, an element substrate which can be used for a display device can be formed.

Next, another manufacturing process of the thin film transistor shown in FIG. 6A will be described below.

Figure 17:
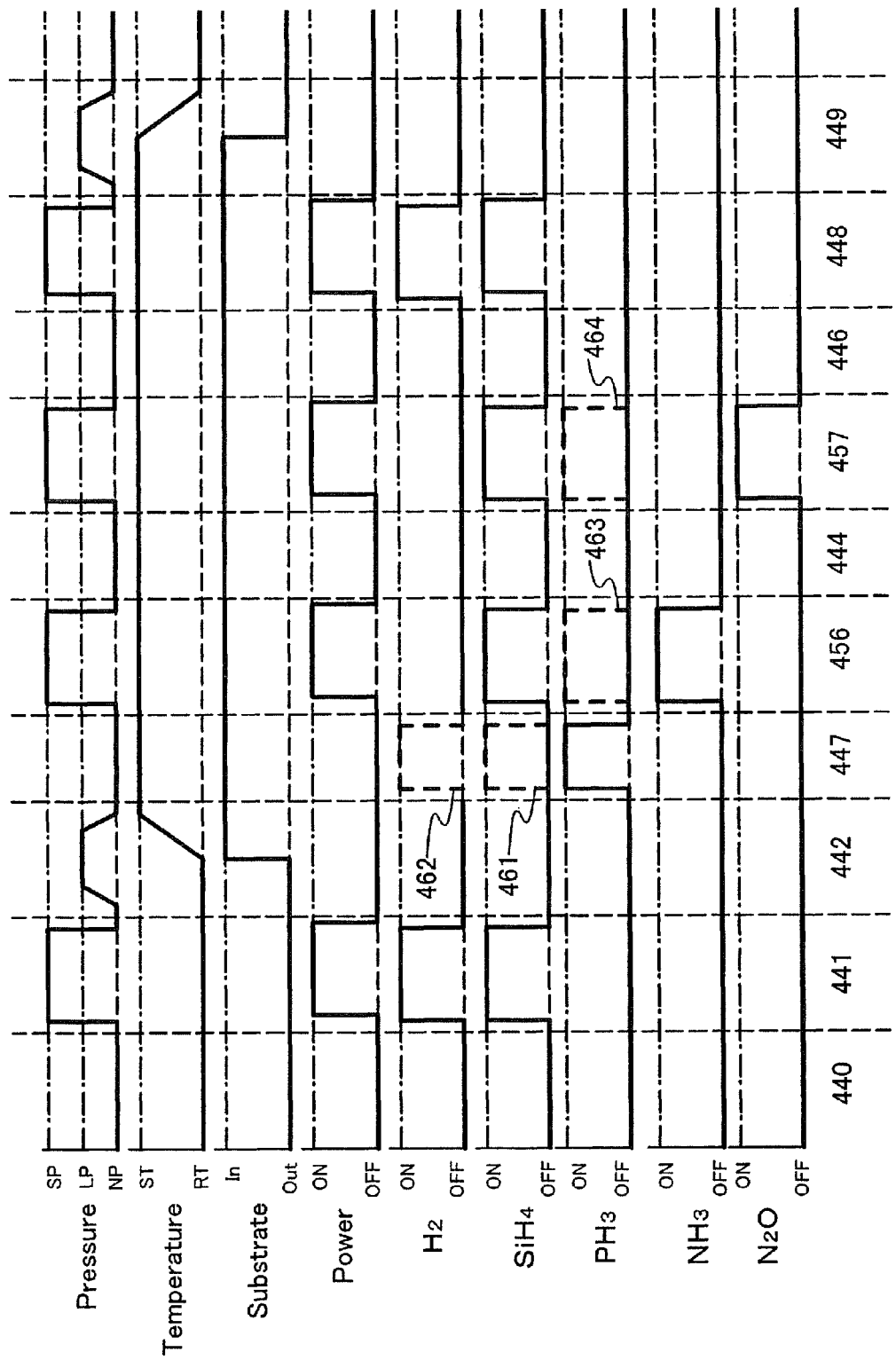
FIG. 17 is an example of a timing chart illustrating a process for forming gate insulating films and a microcrystalline semiconductor film.

FIG. 17 is a typical example of a timing chart for describing steps of forming the gate insulating films 59a and 59b including the impurity element which serves as a donor and the microcrystalline semiconductor film 57 including the impurity element which serves as a donor. FIG. 17 shows a procedure starting from a step of vacuum evacuation 440 from atmospheric pressure in a reaction chamber of a plasma CVD apparatus. Then, the following treatments, which are carried out after the vacuum evacuation 440, are shown in chronological order: a precoating treatment 441, substrate carrying-in 442, a flush treatment 447, a film formation treatment (1) 456 for forming the gate insulating film 59a including the impurity element which serves as a donor, a vacuum evacuation treatment 444, a film formation treatment (2) 457 for forming the gate insulating film 59b including the impurity element which serves as a donor, a vacuum evacuation treatment 446, a film formation treatment (3) 448 for forming the microcrystalline semiconductor film 57 including the impurity element which serves as a donor, and substrate carrying-out 449.

Note that the precoating treatment 441, the substrate carrying-in 442, the vacuum evacuation treatment 444, the vacuum evacuation treatment 446, the film formation treatment (3) 448 for forming the microcrystalline semiconductor film 57 including the impurity element which serves as a donor, and the substrate carrying-out 449 are the same as in FIG. 10, and the flush treatment 447, the film formation treatment (1) 456 for forming the gate insulating film 59a including the impurity element which serves as a donor, the vacuum evacuation treatment 444, and the film formation treatment (2) 457 for forming the gate insulating film 59b including the impurity element which serves as a donor are carried out between the substrate carrying-in 442 and the vacuum evacuation treatment 446.

In the flush treatment 447, a gas including the impurity element which serves as a donor is introduced to the reaction chamber, and the impurity element which serves as a donor is adsorbed onto the substrate 50, the surface of the gate electrode 51, and furthermore, onto the inner wall of the reaction chamber. In this mode, 0.001 to 1% phosphine (diluted with hydrogen or silane) is introduced to the reaction chamber. In addition to the gas including the impurity element which serves as a donor, hydrogen may be introduced as denoted by a dashed line 462, or a deposition gas including silicon or germanium may be introduced as denoted by a dashed line 461, to the reaction chamber. By introducing the deposition gas including silicon or germanium to the reaction chamber, an impurity such as oxygen, nitrogen, or fluorine in the reaction chamber can be discharged from the reaction chamber, so that a film to be formed can be prevented from being contaminated.

In the film formation treatment (1) 456 for forming the gate insulating film 59a including the impurity element which serves as a donor, a source gas, here, hydrogen, silane, and ammonia are mixed, and a silicon nitride film is formed by glow discharge plasma which is generated by application of high-frequency power. Note that nitrogen may also be introduced to the reaction chamber in addition to the above source gas. At this time, the silicon nitride film is deposited while taking in the impurity element which serves as a donor and is adsorbed onto the substrate 50, the gate electrode 51, and furthermore, the surface of the inner wall of the reaction chamber, which is phosphorus here. Thus, a silicon nitride film including phosphorus can be formed. After formation of the gate insulating film 59a including the impurity element which serves as a donor, introduction of the above source gas is stopped, the power is turned off, and then, generation of plasma is stopped.

In the vacuum evacuation treatment 444, vacuum evacuation is performed in the reaction chamber to a predetermined degree of vacuum.

In the film formation treatment (2) 457 for forming the gate insulating film 59b including the impurity element which serves as a donor, a source gas, here, hydrogen, silane, and dinitrogen monoxide are mixed, and a silicon oxynitride film is formed by glow discharge plasma which is generated by application of high-frequency power. At this time, the silicon oxynitride film is deposited while taking in the impurity element which serves as a donor and is deposited over the surface of the gate insulating film 59a and adsorbed onto the surface of the inner wall of the reaction chamber, which is phosphorus here. Thus, a silicon oxynitride film including phosphorus can be formed as the gate insulating film 59b including the impurity element which serves as a donor. After formation of the gate insulating film 59b, introduction of the above source gas is stopped, the power is turned off, and then, generation of plasma is stopped.

In the vacuum evacuation treatment 446, vacuum evacuation is performed in the reaction chamber to a predetermined degree of vacuum.

The film formation treatment (1) 456 for forming the gate insulating film 59a including the impurity element which serves as a donor is carried out after the flush treatment 447 here. However, instead of these treatments, the gate insulating films 59a and 59b including the impurity element which serves as a donor can be formed without the flush treatment 447 as follows: as denoted by dashed lines 463 and 464 in FIG. 17, a gas including the impurity element which serves as a donor is introduced and mixed in addition to a deposition gas including silicon or germanium, and ammonia, and the gate insulating films 59a and 59b including the impurity element which serves as a donor are formed by glow discharge plasma which is generated by application of high-frequency power.

Then, the microcrystalline semiconductor film 57 including the impurity element which serves as a donor is formed as shown in FIG. 16, and the buffer layer and the semiconductor film to which the impurity element imparting one conductivity type is added are formed over the microcrystalline semiconductor film 57 including the impurity element which serves as a donor as shown in FIG. 11B. Further, at this time, by use of a fluoride of hydrogen, silicon, germanium, or the like, or fluorine having an etching effect as a part of a source gas, an amorphous semiconductor which is formed in formation of the microcrystalline semiconductor film can be selectively etched, and the microcrystallization rate can be enhanced, whereby crystallinity at the interface between the gate insulating film and the microcrystalline semiconductor film can be improved.

A feature of this mode is that the gate insulating films 59a and 59b including the impurity element which serves as a donor and the microcrystalline semiconductor film 57 including the impurity element which serves as a donor are formed. The peak concentration of the impurity element which serves as a donor is from $6\times10^{15}$ to $3\times10^{18}$ atoms/cm$^3$ inclusive, preferably from $1\times10^{16}$ to $3\times10^{18}$ atoms/cm$^3$ inclusive, more preferably from $3\times10^{16}$ to $3\times10^{17}$ atoms/cm$^3$ inclusive.

Then, through the steps shown in FIG. 11C and FIGS. 12A to 12C, the thin film transistor as shown in FIG. 6A can be manufactured. In addition, through the steps shown in FIGS. 13A and 13B, an element substrate which can be used for a display device can be formed.

Further, after formation of a microcrystalline semiconductor film not including the impurity element which serves as a donor at a higher concentration than the detection limit of SIMS between the microcrystalline semiconductor film 57 including the impurity element which serves as a donor and the buffer layer 54, through the steps shown in FIGS. 11B and 11C and FIGS. 12A to 12C, a thin film transistor can be manufactured. In addition, through the steps shown in FIGS. 13A and 13B, an element substrate which can be used for a display device can be formed.

Next, a manufacturing process of the thin film transistor shown in FIG. 8A will be described below.

As a typical example of a method for forming the gate insulating film 52a, the gate insulating film 59b including the impurity element which serves as a donor, and the microcrystalline semiconductor film 57 including the impurity element which serves as a donor, steps of forming a silicon nitride film, a silicon oxynitride film including phosphorus, and a microcrystalline silicon film including phosphorus will be described in chronological order with reference to FIG. 18.

Figure 18:
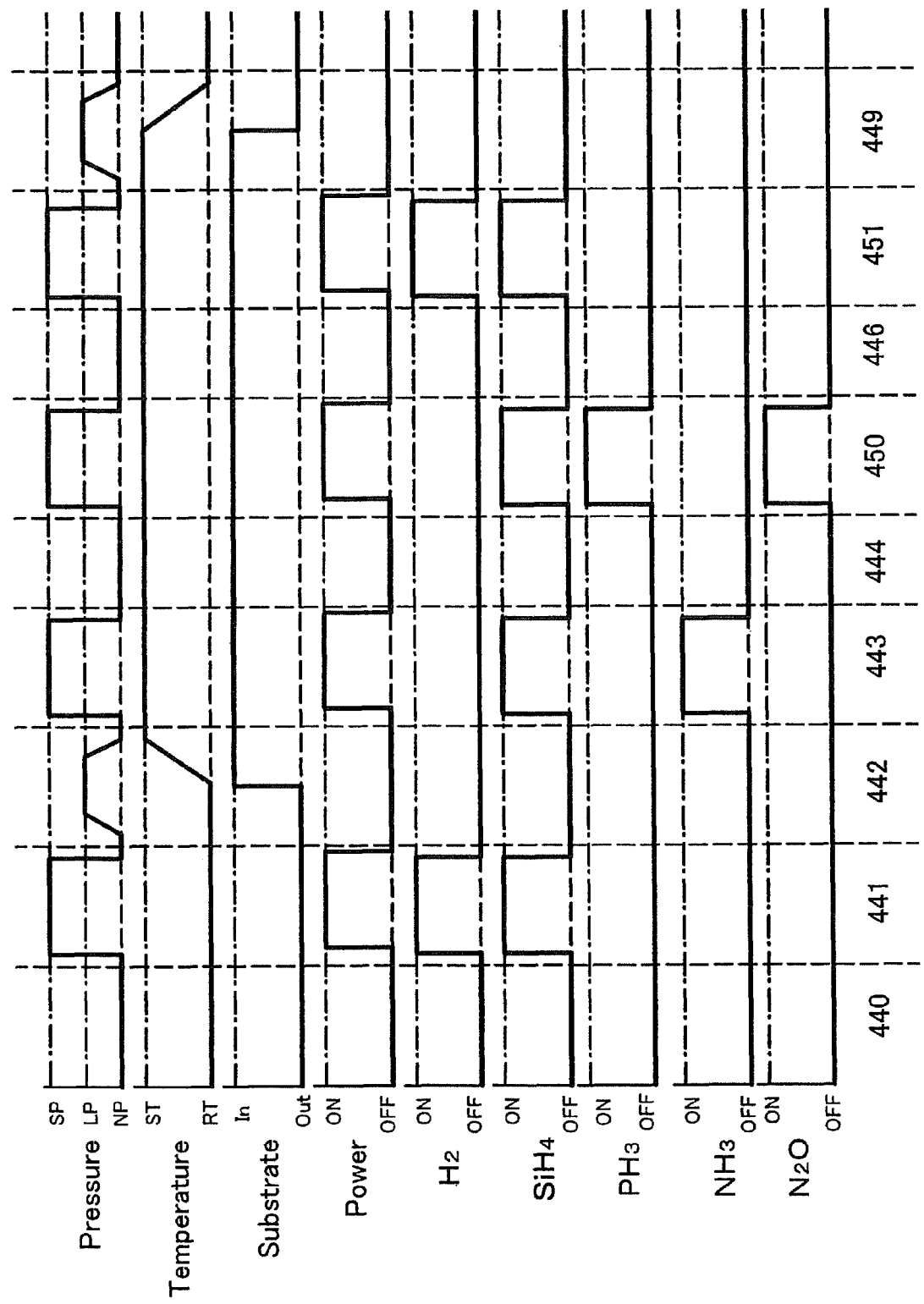
FIG. 18 is an example of a timing chart illustrating a process for forming gate insulating films and a microcrystalline semiconductor film.

FIG. 18 is a typical example of a timing chart for describing steps of forming the gate insulating film 52a, the gate insulating film 59b including the impurity element which serves as a donor, and the microcrystalline semiconductor film 57 including the impurity element which serves as a donor FIG. 18 shows a procedure starting from a step of vacuum evacuation 440 from atmospheric pressure in a reaction chamber Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 450 for forming the gate insulating film 59b including the impurity element which serves as a donor, a vacuum evacuation treatment 446, a film formation treatment (3) 451 for forming the microcrystalline semiconductor film 57 including the impurity element which serves as a donor, and substrate carrying-out 449.

Note that the precoating treatment 441, the substrate carrying-in 442, the film formation treatment (1) 443 for forming the gate insulating film 52a, the vacuum evacuation treatment 444, and the substrate carrying-out 449 are the same as in FIG. 10, and the film formation treatment (2) 450 for forming the gate insulating film 59b including the impurity element which serves as a donor, the vacuum evacuation treatment 446, and the film formation treatment (3) 451 for forming the microcrystalline semiconductor film 57 including the impurity element which serves as a donor are carried out between the vacuum evacuation treatment 444 and the substrate carrying-out 449.

In the film formation treatment (2) 450 for forming the gate insulating film 59b including the impurity element which serves as a donor, a gas including the impurity element which serves as a donor is introduced to a source gas for forming the gate insulating film. In this mode, silane, dinitrogen monoxide, and 0.001 to 1% phosphine (diluted with hydrogen or silane) are introduced and mixed in the reaction chamber, and a silicon oxynitride film including phosphorus is formed by glow discharge plasma which is generated by application of high-frequency power. After formation of the gate insulating film 59b including the impurity element which serves as a donor, introduction of the above source gas is stopped, the power is turned off, and then, generation of plasma is stopped.

In the film formation treatment (3) 451 for forming the microcrystalline semiconductor film 57 including the impurity element which serves as a donor, a deposition gas including silicon or germanium, which is silane here, hydrogen, and/or a rare gas are mixed in the reaction chamber, and a microcrystalline silicon film is formed by glow discharge plasma. Silane is diluted with hydrogen and/or a rare gas to be 10 to 2000 times thinner. Therefore, a large amount of hydrogen and/or a rare gas is needed. The substrate heating temperature is from 100 to 300° C., preferably from 120 to 220° C. After formation of the microcrystalline semiconductor film 57, introduction of the above source gas is stopped, the power is turned off, and then, generation of plasma is stopped.

After forming the gate insulating film 59*b* including the impurity element which serves as a donor, a microcrystalline semiconductor film including the impurity element which serves as a donor is deposited under the condition of forming the microcrystalline semiconductor film 57, with the impurity element which serves as a donor remaining in the reaction chamber. Further, by use of a gas having an etching effect such as a fluoride of hydrogen, silicon, germanium, or the like, or fluorine as a part of a source gas, an amorphous semiconductor which is formed in formation of the microcrystalline semiconductor film can be selectively etched, and the microcrystallization rate can be enhanced, whereby crystallinity at the interface between the gate insulating film and the microcrystalline semiconductor film can be improved.

Next, after formation of the buffer layer, through the steps as shown in FIGS. 11B and 11C and FIGS. 12A to 12C, the thin film transistor as shown in FIG. 8A can be manufactured in which the gate insulating film 52*a* and the gate insulating film 59*b* including the impurity element which serves as a donor are formed over the gate electrode 51, the microcrystalline semiconductor film 61 including the impurity element which serves as a donor is formed over the gate insulating film 59*b*, and the buffer layer is formed over the microcrystalline semiconductor film 61. Then, through the steps shown in FIGS. 13A and 13B, an element substrate which can be used for a display device can be formed.

Further, after formation of a microcrystalline semiconductor film not including the impurity element which serves as a donor at a higher concentration than the detection limit of SIMS between the microcrystalline semiconductor film 57 including the impurity element which serves as a donor and the buffer layer 54, through the steps shown in FIGS. 11B and 11C and FIGS. 12A to 12C, a thin film transistor can be manufactured. After that, through the steps shown in FIGS. 13A and 13B, an element substrate which can be used for a display device can be formed.

Then, a manufacturing process of a thin film transistor different from the thin film transistor described above is described below.

As shown in FIG. 11A, a gate electrode 51 is formed over a substrate 50, and a gate insulating film 52*a* is formed over the gate electrode 51.

Next, as shown in FIG. 19, a gate insulating film 59*b* including an impurity element which serves as a donor is formed over the gate insulating film 52*a*, and a microcrystalline semiconductor film 57 including the impurity element which serves as a donor is formed by a plasma CVD method using a deposition gas including silicon or germanium, and hydrogen over the gate insulating film 59*b*.

As a typical example of a method for forming the gate insulating film 52*a*, the gate insulating film 59*b* including the impurity element which serves as a donor, and the microcrystalline semiconductor film 57 including the impurity element which serves as donor, steps of forming a silicon nitride film, a silicon oxynitride film including phosphorus, and a microcrystalline silicon film including phosphorus will be described in chronological order with reference to FIG. 20.

Figure 20:
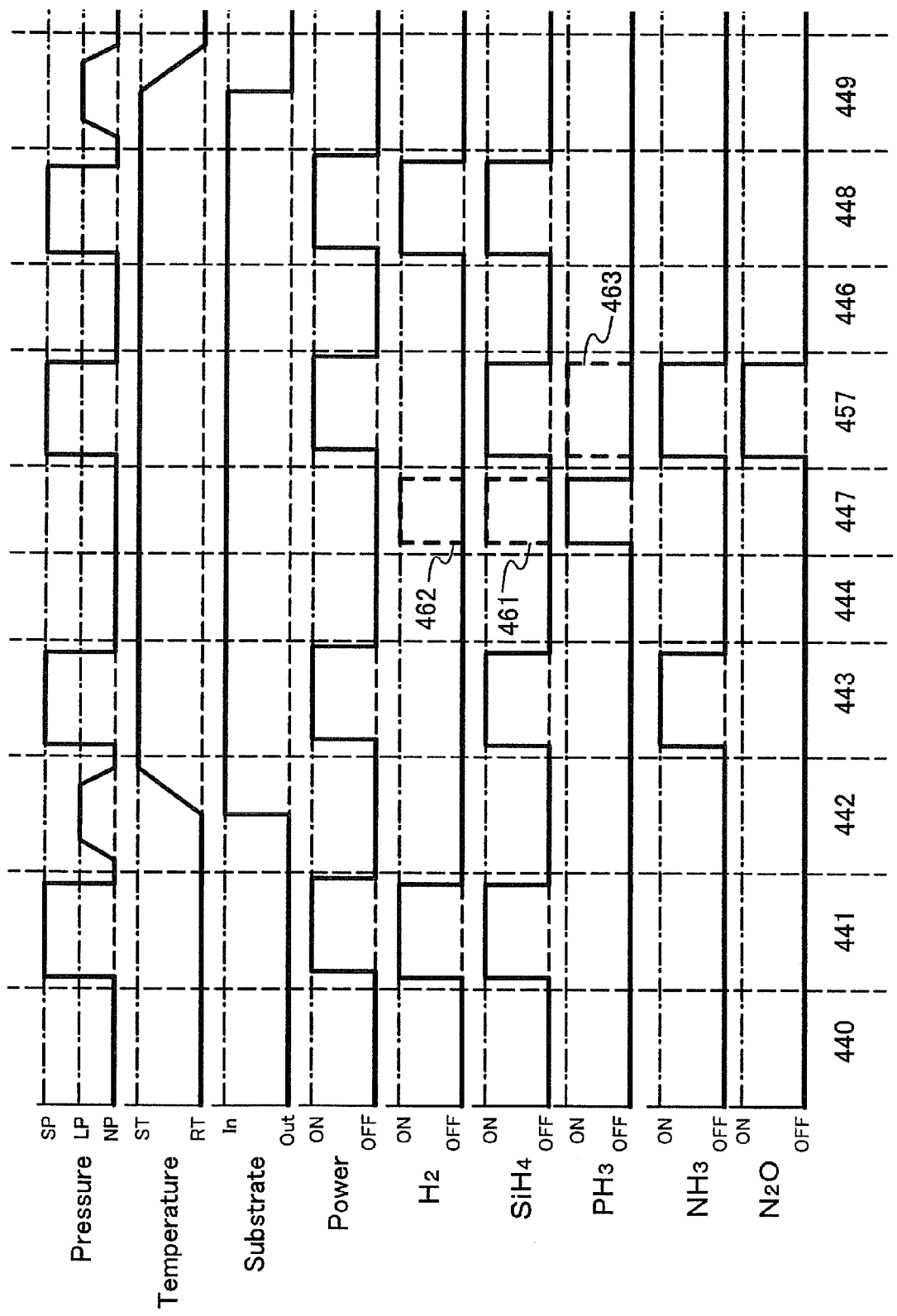
FIG. 20 is an example of a timing chart illustrating a process for forming gate insulating films and a microcrystalline semiconductor film.

FIG. 20 is a typical example of a timing chart for describing steps of forming the gate insulating film 52*a*, the gate insulating film 59*b* including the impurity element which serves as a donor, and the microcrystalline semiconductor film 57 including the impurity element which serves as a donor. FIG. 20 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52*a*, a vacuum evacuation treatment 444, a flush treatment 447, a film formation treatment (2) 457 for forming the gate insulating film 59*b* including the impurity element which serves as a donor, a vacuum evacuation treatment 446, a film formation treatment (3) 448 for forming the microcrystalline semiconductor film 57 including the impurity element which serves as a donor, and substrate carrying-out 449.

Note that the precoating treatment 441, the substrate carrying-in 442, the film formation treatment (1) 443 for forming the gate insulating film 52*a*, the vacuum evacuation treatment 444, the film formation treatment (3) 448 for forming the microcrystalline semiconductor film 57 including the impurity element which serves as a donor, and the substrate carrying-out 449 are the same as in FIG. 10, and the flush treatment 447, the film formation treatment (2) 457 for forming the gate insulating film 59*b* including the impurity element which serves as a donor, and the vacuum evacuation treatment 446 are carried out between the substrate carrying-in 442 and the film formation treatment (3) 448 for forming the microcrystalline semiconductor film 57 including the impurity element which serves as a donor.

In the flush treatment 447, a gas including the impurity element which serves as a donor is introduced to the reaction chamber, and the impurity element which serves as a donor is adsorbed onto the surface of the gate insulating film 52*a*, furthermore, onto the inner wall of the reaction chamber. In this mode, 0.001 to 1% phosphine (diluted with hydrogen or silane) is introduced to the reaction chamber. In addition to the gas including the impurity element which serves as a donor, hydrogen may be introduced as denoted by a dashed line 462, or a deposition gas including silicon or germanium may be introduced as denoted by a dashed line 461, to the reaction chamber.

In the film formation treatment (2) 457 for forming the gate insulating film 59*b* including the impurity element which serves as a donor, a source gas, here, hydrogen, silane, and dinitrogen monoxide are mixed, and a silicon oxynitride film is formed by glow discharge plasma which is generated by application of high-frequency power. At this time, the silicon oxynitride film is deposited while taking in the impurity element which serves as a donor and is deposited over the surface of the gate insulating film 52*a* and adsorbed onto the surface of the inner wall of the reaction chamber, which is phosphorus here. Thus, a silicon oxynitride film including phosphorus can be formed. After formation of the gate insulating film 59*b* including the impurity element which serves as a donor, introduction of the above source gas is stopped, the power is turned off, and then, generation of plasma is stopped.

Next, the microcrystalline semiconductor film 57 including the impurity element which serves as a donor shown in FIG. 19 is formed. At this time, by use of a fluoride of hydrogen, silicon, germanium, or the like, or fluorine having an etching effect as a part of a source gas, an amorphous semiconductor which is formed in formation of the microcrystalline semiconductor film can be selectively etched, and the microcrystallization rate can be enhanced, whereby crystallinity at the interface between the gate insulating film and the microcrystalline semiconductor film can be improved. Then, the buffer layer and the semiconductor film to which the impurity element imparting one conductivity type is added are formed.

Then, through the steps shown in FIGS. 11B and 11C and FIGS. 12A to 12C, the thin film transistor as shown in FIG. 8A can be manufactured. In addition, through the steps shown in FIGS. 13A and 13B, an element substrate which can be used for a display device can be formed.

Further, after formation of a microcrystalline semiconductor film not including the impurity element which serves as a donor at a higher concentration than the detection limit of SIMS between the microcrystalline semiconductor film 57 including the impurity element which serves as a donor and the buffer layer 54, through the steps shown in FIGS. 11B and 11C and FIGS. 12A to 12C, a thin film transistor can be manufactured. In addition, through the steps shown in FIGS. 13A and 13B, an element substrate which can be used for a display device can be formed.

Next, a manufacturing process of the thin film transistor shown in FIG. 9A will be described below.

Figure 22:
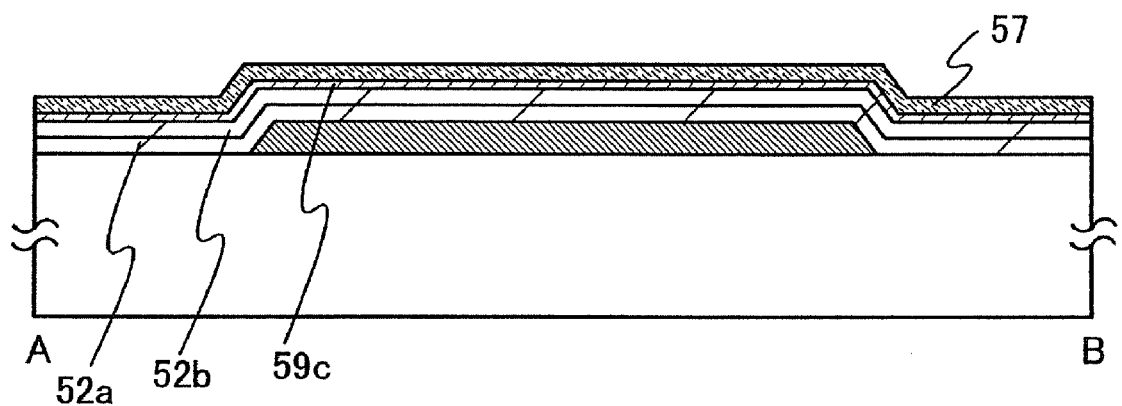
FIG. 22 is a cross-sectional view illustrating a method for manufacturing a display device of the present invention.

As in the step shown in FIG. 11A, a gate electrode 51 is formed over a substrate 50. Then, as shown in FIG. 22, gate insulating films 52a and 52b and a gate insulating film 59c including an impurity element which serves a donor are formed over the substrate 50 and the gate electrode 51. Next, a microcrystalline semiconductor film 57 including the impurity element which serves as a donor is formed over the gate insulating film 59c including the impurity element which serves as a donor.

As the gate insulating films 52a and 52b, which are first and second layers, a silicon nitride film, a silicon nitride oxide film, a silicon oxide film, or a silicon oxynitride film can be formed by a plasma CVD method or a sputtering method. As the gate insulating film 59c including the impurity element which serves as a donor, which is a third layer, a silicon nitride film or a silicon nitride oxide film with a thickness of from 1 to 5 nm approximately which includes phosphorus, arsenic, or antimony can be formed.

As a typical example of a method for forming the gate insulating films 52a and 52b, the gate insulating film 59c including the impurity element which serves as a donor, and the microcrystalline semiconductor film 57 including the impurity element which serves as a donor, steps of forming a silicon nitride film, a silicon oxynitride film, a silicon nitride film including phosphorus, and a microcrystalline silicon film including phosphorus will be described in chronological order with reference to FIG. 21.

Figure 21:
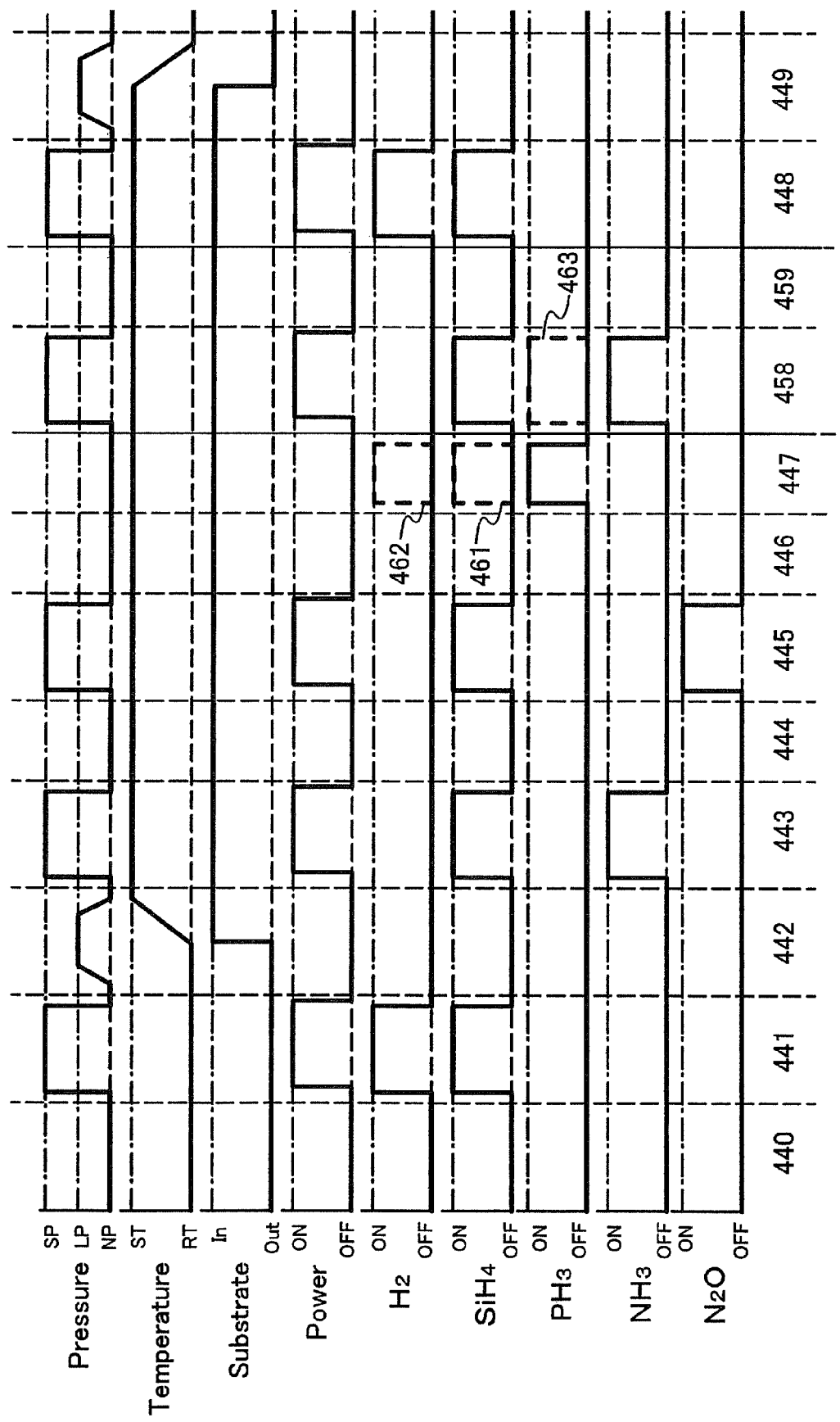
FIG. 21 is an example of a timing chart illustrating a process for forming gate insulating films and a microcrystalline semiconductor film.

FIG. 21 is a typical example of a timing chart for describing steps of forming the gate insulating films 52a and 52b, the gate insulating film 59c including the impurity element which serves as a donor, and the microcrystalline semiconductor film 57 including the impurity element which serves as a donor. FIG. 21 shows a procedure starting from a step of vacuum evacuation 440 from atmospheric pressure in a reaction chamber. Then, the following treatments, which are carried out after the vacuum evacuation 440, are shown in chronological order: a precoating treatment 441, substrate carrying-in 442, a film formation treatment (1) 443 for forming the gate insulating film 52a, a vacuum evacuation treatment 444, a film formation treatment (2) 445 for forming the gate insulating film 52b, a vacuum evacuation treatment 446, a flush treatment 447, a film formation treatment (4) 458 for forming the gate insulating film 59c including the impurity element which serves as a donor, a vacuum evacuation treatment 459, a film formation treatment (3) 448 for forming the microcrystalline semiconductor film 57 including the impurity element which serves as a donor, and substrate carrying-out 449.

Note that the precoating treatment 441, the substrate carrying-in 442, the film formation treatment (1) 443 for forming the gate insulating film 52a, the vacuum evacuation treatment 444, the film formation treatment (2) 445 for forming the gate insulating film 52b, the vacuum evacuation treatment 446, the film formation treatment (3) 448 for forming the microcrystalline semiconductor film 57 including the impurity element which serves as a donor, and the substrate carrying-out 449 are the same as in FIG. 10, and the flush treatment 447, the film formation treatment (2) 458 for forming the gate insulating film 59c including the impurity element which serves as a donor, and the vacuum evacuation treatment 459 are carried out between the vacuum evacuation treatment 446 and the film formation treatment (3) 448 for forming the microcrystalline semiconductor film 57 including the impurity element which serves as a donor.

In the flush treatment 447, a gas including the impurity element which serves as a donor is introduced to the reaction chamber, and the impurity element which serves as a donor is adsorbed onto the surface of the gate insulating film 52b, furthermore, onto the inner wall of the reaction chamber. In this mode, 0.001 to 1% phosphine (diluted with hydrogen or silane) is introduced to the reaction chamber In addition to the gas including the impurity element which serves as a donor, hydrogen may be introduced as denoted by a dashed line 462, or a deposition gas including silicon or germanium may be introduced as denoted by a dashed line 461, to the reaction chamber.

In the film formation treatment (2) 458 for forming the gate insulating film 59c including the impurity element which serves as a donor, a source gas of the gate insulating film, here, hydrogen, silane, and dinitrogen monoxide are introduced and mixed, and a silicon nitride film is formed by glow discharge plasma which is generated by application of high-frequency power. At this time, the silicon nitride film is deposited while taking in the impurity element which serves as a donor and is deposited over the surface of the gate insulating film 52b and adsorbed onto the surface of the inner wall of the reaction chamber, which is phosphorus here. Thus, a silicon nitride film including phosphorus can be formed. After formation of the gate insulating film 59c including the impurity element which serves as a donor, introduction of the above source gas is stopped, the power is turned off, and then, generation of plasma is stopped.

In the vacuum evacuation treatment 459, vacuum evacuation is performed in the reaction chamber to a predetermined degree of vacuum.

After that, the microcrystalline semiconductor film 57 including the impurity element which serves as a donor is formed over the gate insulating film 59c including the impurity element which serves as a donor.

As a method for forming the gate insulating film 59c including the impurity element which serves as a donor, after the flush treatment 447, the gate insulating film 52b may be nitrided with high-density plasma, whereby a silicon nitride layer including the impurity element which serves as a donor can be formed over the surface of the gate insulating film 52b. High-density plasma is produced by using a microwave with a high frequency, for example, 2.45 GHz. Since high-density plasma having the low electron temperature has a low kinetic energy of active species, a layer having fewer defects can be formed with less plasma damage, compared to a conventional plasma treatment. In addition, because the surface of the gate insulating film 52b can be less rough, carrier mobility can be increased.

Further, the gate insulating film 59c including the impurity element which serves as a donor can also be formed by using a gas including the impurity element which serves as a donor as denoted by a dashed line 463 shown in FIG. 21 in addition to the source gas for forming the gate insulating film, without performing the flush treatment 447 shown in FIG. 21.

Further, in formation of the microcrystalline semiconductor film 57 including the impurity element which serves as a donor, by use of a fluoride of hydrogen, silicon, germanium, or the like, or fluorine having an etching effect as a part of a source gas, an amorphous semiconductor which is formed in formation of the microcrystalline semiconductor film can be selectively etched, and the microcrystallization rate can be enhanced, whereby crystallinity at the interface between the gate insulating film and the microcrystalline semiconductor film can be improved.

After that, through the steps shown in FIGS. 11B and 11C and FIGS. 12A to 12C and a process as in Embodiment Mode 1, the thin film transistor as shown in FIG. 9A can be manufactured.

Further, after formation of a microcrystalline semiconductor film not including the impurity element which serves as a donor at a higher concentration than the detection limit of SIMS between the microcrystalline semiconductor film 57 including the impurity element which serves as a donor and the buffer layer 54, through the steps shown in FIGS. 11B and 11C and FIGS. 12A to 12C, a thin film transistor can be manufactured. After that, through the steps shown in FIGS. 13A and 13B, an element substrate which can be used for a display device can be formed.

In the process of this embodiment mode, glow discharge plasma is generated by applying high-frequency power with a frequency of 1 to 20 MHz, typically 13.56 MHz, or high-frequency power with a frequency in the VHF band of 20 to about 120 MHz, typically 27.12 or 60 MHz. Further, glow discharge plasma is generated by applying microwaves with a frequency in the UHF band of 120 MHz to 3 GHz, typically 1 GHz, or microwaves with a frequency of 2.45 GHz.

In the film formation treatment of the microcrystalline semiconductor film, helium may be added as a rare gas to a reaction gas, in addition to silane and hydrogen. Since helium has an ionization energy of 24.5 eV that is the largest among all gases, and has a metastable state in the level of about 20 eV that is a little lower than the ionization energy, only the difference of about 4 eV is necessary for ionization while keeping discharge. Therefore, the discharge starting voltage also shows the lowest value among all gases. By such characteristics, plasma can be held stably with helium. Further, since uniform plasma can be formed with helium, even if the area of a substrate over which a microcrystalline silicon film is deposited is large, an effect of making plasma density uniform can be obtained.

In the thin film transistor manufactured in this embodiment mode, the microcrystalline semiconductor film and/or the gate insulating film includes the impurity element which serves as a donor. Thus, crystallinity of the microcrystalline semiconductor film at the interface with the gate insulating film is high and crystallinity of the microcrystalline semiconductor film can be improved. Accordingly, a thin film transistor using the microcrystalline semiconductor film has higher field effect mobility and higher on current than a thin film transistor using an amorphous semiconductor film or a conventional microcrystalline semiconductor film. Thus, with the use of a thin film transistor, a channel formation region of which is formed of the microcrystalline semiconductor film, for switching of a display element, the area of the channel formation region, that is, the area of the thin film transistor can be decreased. Accordingly, the area of the thin film transistor in a single pixel is reduced, and thus, the aperture ratio of the pixel can be increased. Accordingly, the display device can have high definition.

Since the channel formation region of the thin film transistor manufactured in this embodiment mode is formed using a microcrystalline semiconductor film, resistivity thereof is lower than that of the channel formation region formed using an amorphous semiconductor film. Therefore, a thin film transistor using the microcrystalline semiconductor film 57 has current-voltage characteristics represented by a curve with a steep slope in a rising portion, has an excellent response as a switching element, and can be operated at high speed. With the use of the microcrystalline semiconductor film in a channel formation region of a thin film transistor, fluctuation of a threshold voltage of a thin film transistor can be suppressed. Therefore, a display device with less variation of electric characteristics can be manufactured.

Further, in the thin film transistor manufactured in this embodiment mode, an amorphous semiconductor film with high resistivity is formed as the buffer layer between the microcrystalline semiconductor film which serves as a channel formation region and the semiconductor films to which the impurity element imparting one conductivity type is added and which serve as source and drain regions. Off current flows through the buffer region. However, because the buffer layer is a high-resistance region, off current can be suppressed, and furthermore, the microcrystalline semiconductor film can be prevented from being oxidized. Accordingly, off current can be suppressed, and increase in on current can be realized because defects in the channel formation region are reduced.

Next, as an example of a plasma CVD apparatus to which the above-mentioned reaction chamber is applied, a structure which is suitable for deposition of a gate insulating film and a microcrystalline semiconductor film is described.

Figure 23:
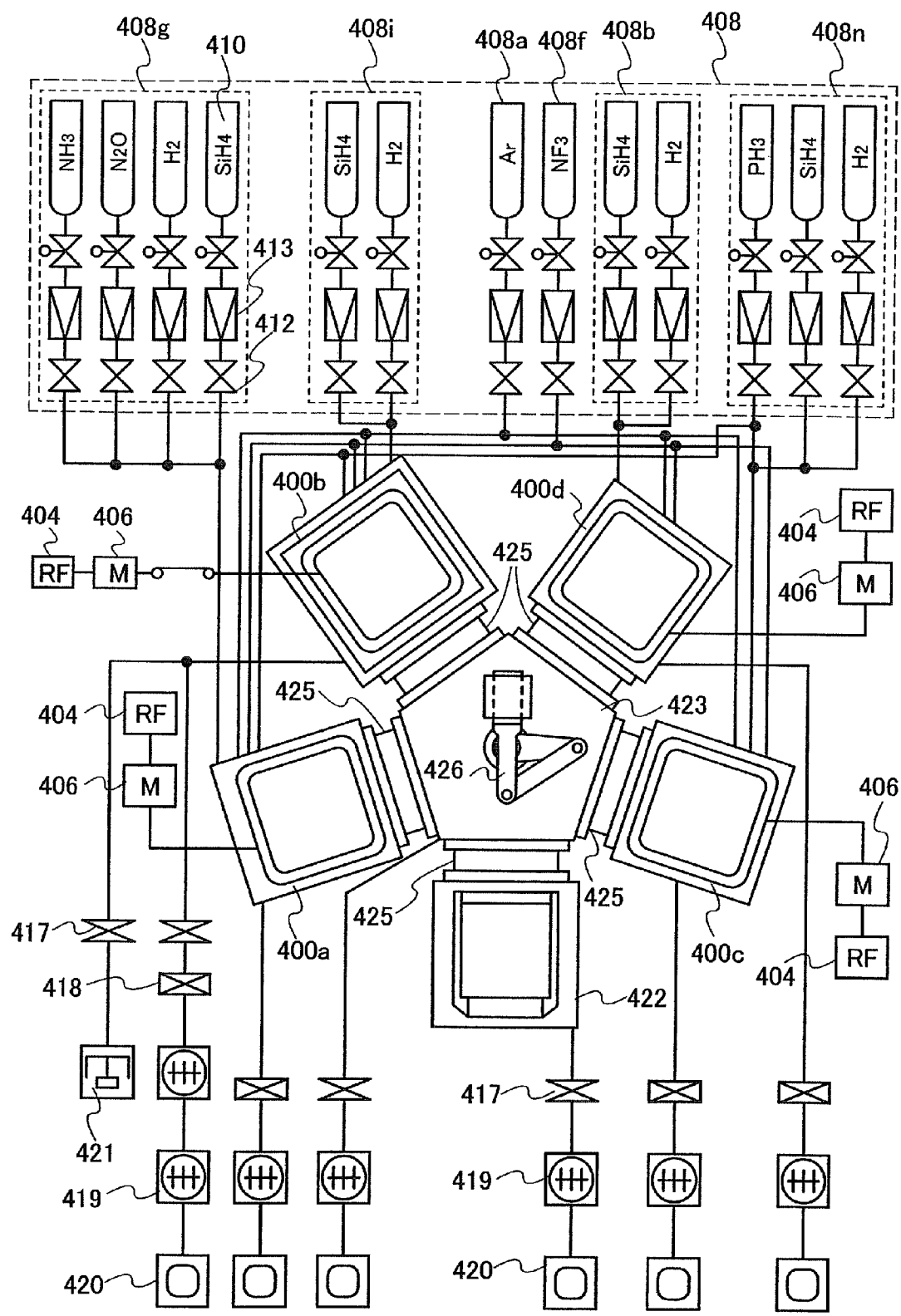
FIG. 23 is a drawing showing a structure of a plasma CVD apparatus applicable to the present invention.

FIG. 23 shows an example of a multi-chamber plasma CVD apparatus including a plurality of reaction chambers. The apparatus is provided with a common chamber 423, a load/unload chamber 422, a first reaction chamber 400a, a second reaction chamber 400b, a third reaction chamber 400c, and a fourth reaction chamber 400d. This apparatus is a single wafer-processing type in which a substrate set in a cassette in the load/unload chamber 422 is transferred to/from each reaction chamber by a transfer unit 426 in the common chamber 423. A gate valve 425 is provided between the common chamber 423 and each chamber such that treatments performed in different reaction chambers do not interfere each other.

Each reaction chamber is used for a different purpose, depending on the kinds of thin films to be formed. For example, an insulating film such as a gate insulating film is formed in the first reaction chamber 400a, a microcrystalline semiconductor film which forms a channel is formed in the second reaction chamber 400b, a buffer layer is formed in the third reaction chamber 400c, and a semiconductor film to which an impurity element imparting one conductivity type is added and which forms a source and a drain is formed in the fourth reaction chamber 400d. Of course, the number of the reaction chambers is not limited to four, and can be increased or decreased as needed. One film may be formed in one reaction chamber, or a plurality of films may be formed in one reaction chamber.

A turbo-molecular pump 419 and a dry pump 420 are connected to each reaction chamber as exhaust units. The exhaust units are not limited to a combination of these vacuum pumps and can employ other vacuum pumps as long as they can evacuate the reaction chamber to a degree of vacuum of about $10^{-1}$ to $10^{-5}$ Pa. A butterfly valve 417 is provided between the exhaust units and each reaction chamber, which can interrupt vacuum evacuation, and a conductance valve 418 can control exhaust velocity to adjust the pressure in each reaction chamber.

Note that the second reaction chamber 400b in which a microcrystalline semiconductor film is formed may be connected to a cryopump 421 which performs vacuum evacuation to an ultra-high vacuum. By use of the cryopump 421, the reaction chamber can be evacuated to an ultra-high vacuum with a pressure of lower than $10^{-5}$ Pa. In this embodiment mode, with an ultra-high vacuum with a pressure of lower than $10^{-5}$ Pa in the reaction chamber, the oxygen concentration in the microcrystalline semiconductor film can be effectively reduced. Consequently, the oxygen concentration in the microcrystalline semiconductor film 53 can be set at less than or equal to $1 \times 10^{16}$ atoms/cm$^3$. With the reduced oxygen concentration in the microcrystalline semiconductor film, defects in the film can be reduced, whereby crystallinity can be improved and thus carrier mobility can be improved.

A gas supply unit 408 includes a cylinder 410 filled with a gas used for the process, such as a rare gas or a semiconductor source gas typified by silane, a stop valve 412, a mass flow controller 413, and the like. A gas supply unit 408g is connected to the first reaction chamber 400a and supplies a gas for forming a gate insulating film. A gas supply unit 408i is connected to the second reaction chamber 400b and supplies a gas for forming a microcrystalline semiconductor film. A gas supply unit 408b is connected to the third reaction chamber 400c and supplies a gas for forming a buffer layer. A gas supply unit 408n is connected to the fourth reaction chamber 400d and supplies a gas for forming an n-type semiconductor film, for example. In addition, phosphine which is one of gases including an impurity element which serves as a donor is connected and supplied to the first reaction chamber 400a and the second reaction chamber 400b. A gas supply unit 408a supplies argon, and a gas supply unit 408f supplies an etching gas used for cleaning of the inside of the reaction chambers. Thus, the gas supply units 408a and 408f are provided in common for each reaction chamber.

A high-frequency power supply unit for generating plasma is connected to each reaction chamber. The high-frequency power supply unit includes a high-frequency power source 404 and a matching box 406.

Each reaction chamber can be used for a different purpose, depending on the kinds of thin films to be formed. Since each thin film has an optimum temperature for being formed, each thin film is formed in a different reaction chamber, so that film formation temperatures can be easily controlled. Further, the same kind of films can be repeatedly formed, so that an influence of a residual impurity due to a film which has been formed can be eliminated. In particular, it is possible to prevent the impurity element which serves as a donor and is included in the microcrystalline semiconductor film from mixing into the buffer layer. Consequently, the concentration of the impurity element which serves as a donor in the buffer layer can be decreased, so that off current of the thin film transistor can be decreased.

A microcrystalline semiconductor film, a buffer layer, and a semiconductor film to which an impurity element imparting one conductivity type is added may be formed successively in one reaction chamber. Specifically, a substrate provided with a gate insulating film is carried into a reaction chamber, and a microcrystalline semiconductor film, a buffer layer, and a semiconductor film to which an impurity element imparting one conductivity type is added are formed therein successively. Then, after the substrate is taken out of the reaction chamber, the inside of the reaction chamber is cleaned with fluorine radicals. However, even when the inside of the reaction chamber is cleaned, an impurity element which serves as a donor is left in the reaction chamber in some cases. When a substrate provided with a gate insulating film is carried into such a reaction chamber and a microcrystalline semiconductor film is formed, the microcrystalline semiconductor film includes the impurity element which serves as a donor. Accordingly, a microcrystalline semiconductor film which has high crystallinity at the interface with a gate insulating film and includes the impurity element which serves as a donor can be formed. In formation of the buffer layer, the concentration of the impurity element which serves as a donor in the buffer layer is desirably reduced as much as possible; thus, the inside of the reaction chamber is cleaned such that the impurity element which serves as a donor is not left therein.

Next, a method for manufacturing a thin film transistor, which is different from that in the above modes, is described with reference to FIGS. 24A and 24B, FIGS. 25A to 25D, FIGS. 26A to 26C, FIGS. 27A and 27B, FIGS. 28A and 28B, FIGS. 29A to 29C, and FIGS. 30A to 30C. Here, a process is shown through which the number of photomasks can be smaller than in the above modes and through which a thin film transistor can be manufactured. A manufacturing process of the thin film transistor shown in FIG. 1A is described here; however, the following mode can be applied to the manufacturing processes of the thin film transistors shown in FIGS. 4A and 4B, FIG. 5, FIGS. 6A and 6B, FIGS. 7A and 7B, FIGS. 8A and 8B, and FIGS. 9A and 9B.

Figure 24A:
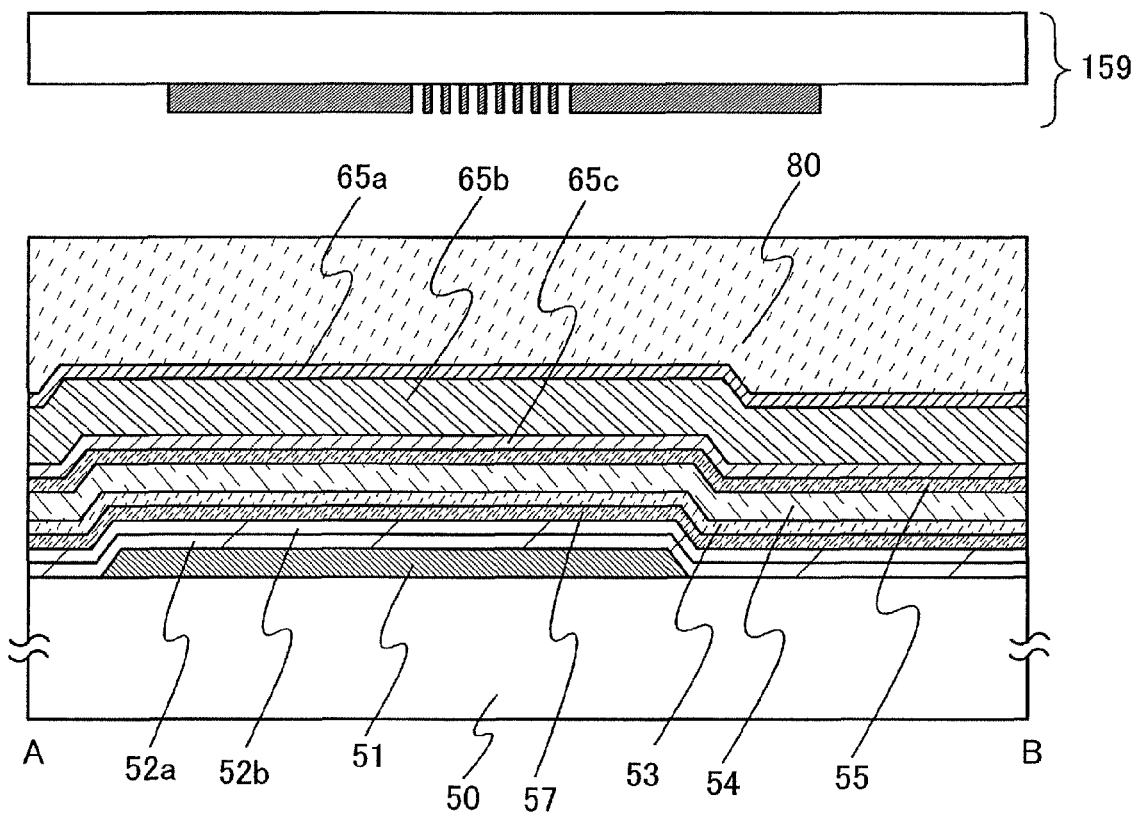
FIGS. 24A and 24B are cross-sectional views illustrating a method for manufacturing a display device of the present invention.

In a similar manner to FIG. 1A, a conductive film is formed over a substrate 50, a resist is applied on the conductive film, and a part of the conductive film is etched using a resist mask which is formed by a photolithography process using a first photomask, so that a gate electrode 51 is formed. Then, as shown in FIG. 24A, gate insulating films 52a and 52b are formed over the gate electrode 51. In a similar manner to FIG. 11A, a microcrystalline semiconductor film 57 including an impurity element which serves as a donor is formed. Then, a microcrystalline semiconductor film 53, a buffer layer 54, a semiconductor film 55 to which an impurity element imparting one conductivity type is added, and conductive films 65a to 65c are formed in order over the microcrystalline semiconductor film 57 including the impurity element which serves as a donor. Then, a resist 80 is applied on the conductive film 65a.

The resist 80 can be a positive type resist or a negative type resist. In this case, a positive type resist is used.

Next, a multi-tone mask 159 is used as a second photomask and the resist 80 is irradiated with light, whereby the resist 80 is exposed to light.

Now, light exposure using the multi-tone mask 159 is described with reference to FIGS. 25A to 25D.

A multi-tone mask can achieve three levels of light exposure, an exposed portion, a half-exposed portion, and an unexposed portion, and one-time light exposure and development process allows a resist mask with regions of plural thicknesses (typically, two kinds of thicknesses) to be formed. Thus, the use of the multi-tone mask can reduce the number of photomasks.

Figure 25A:
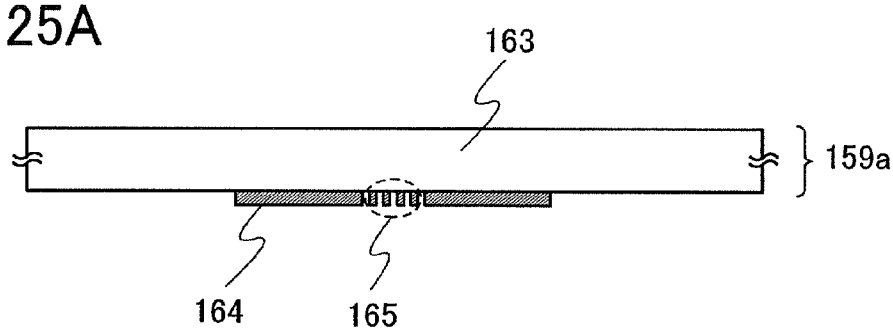
FIGS. 25A to 25D are drawings illustrating multi-tone masks applicable to the present invention.
Figure 25B:
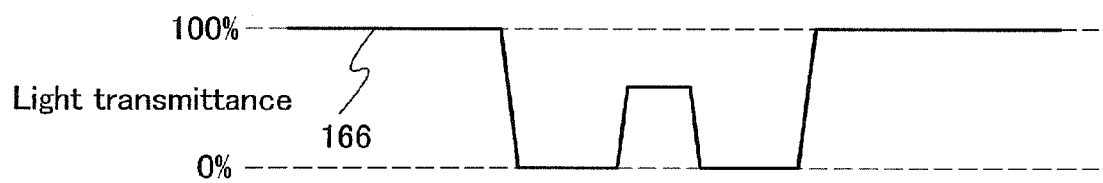
Figure 25C:
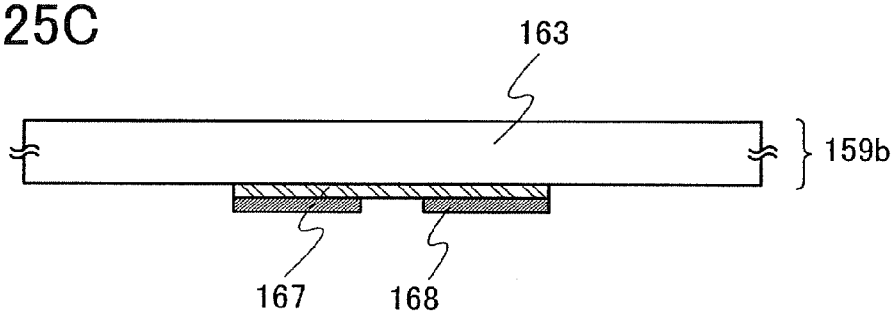

Typical examples of a multi-tone mask include a gray-tone mask 159a shown in FIG. 25A and a half-tone mask 159b shown in FIG. 25C.

As shown in FIG. 25A, the gray-tone mask 159a includes a light-transmitting substrate 163 provided with a light-blocking portion 164 and a diffraction grating 165. The light transmittance of the light-blocking portion 164 is 0%. The diffraction grating 165 has a light-transmitting portion in a slit form, a dot form, a mesh form, or the like with intervals which are less than or equal to the resolution limit of light used for the exposure; thus, the light transmittance can be controlled. The diffraction grating 165 can be in a slit form, a dot form, or a mesh form with regular intervals; or in a slit form, a dot form, or a mesh form with irregular intervals.

For the light-transmitting substrate 163, a substrate having a light-transmitting property, such as a quartz substrate, can be used. The light-blocking portion 164 and the diffraction grating 165 can be formed using a light-blocking material such as chromium or chromium oxide, which absorbs light.

When the gray-tone mask 159a is irradiated with light for exposure, a light transmittance 166 of the light-blocking portion 164 is 0% and that of a region where neither the light-blocking portion 164 nor the diffraction grating 165 is provided is 100%, as shown in FIG. 25B. The light transmittance of the diffraction grating 165 can be controlled in a range of 10 to 70%. The light transmittance of the diffraction grating 165 can be controlled with an interval or a pitch of slits, dots, or meshes of the diffraction grating 165.

As shown in FIG. 25C, the half-tone mask 159b includes a light-transmitting substrate 163 provided with a semi-light-transmitting portion 167 and a light-blocking portion 168. MoSiN, MoSi, MoSiO, MoSiON, CrSi, or the like can be used for the semi-light-transmitting portion 167. The light-blocking portion 168 can be formed using a light-blocking material such as chromium or chromium oxide, which absorbs light.

Figure 25D:
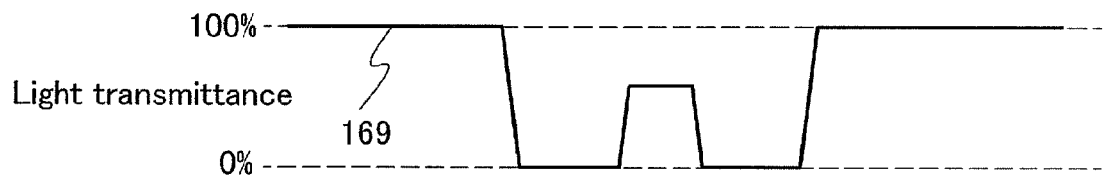

When the half-tone mask 159b is irradiated with light for exposure, a light transmittance 169 of the light-blocking portion 168 is 0% and that of a region where neither the light-blocking portion 168 nor the semi-light-transmitting portion 167 is provided is 100%, as shown in FIG. 25D. The light transmittance of the semi-light-transmitting portion 167 can be controlled in a range of 10 to 70%. The light transmittance of the semi-light-transmitting portion 167 can be controlled with the material of the semi-light-transmitting portion 167.

Figure 24B:
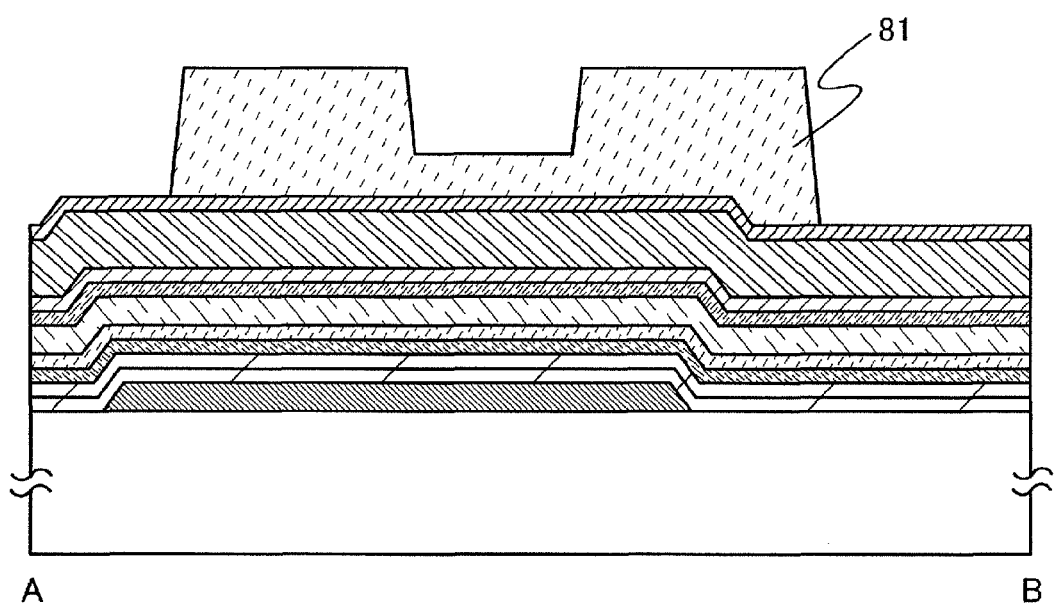

After the light exposure using the multi-tone mask is performed, development is carried out, whereby a resist mask 81 having regions with different thicknesses can be formed, as shown in FIG. 24B.

Figure 26A:
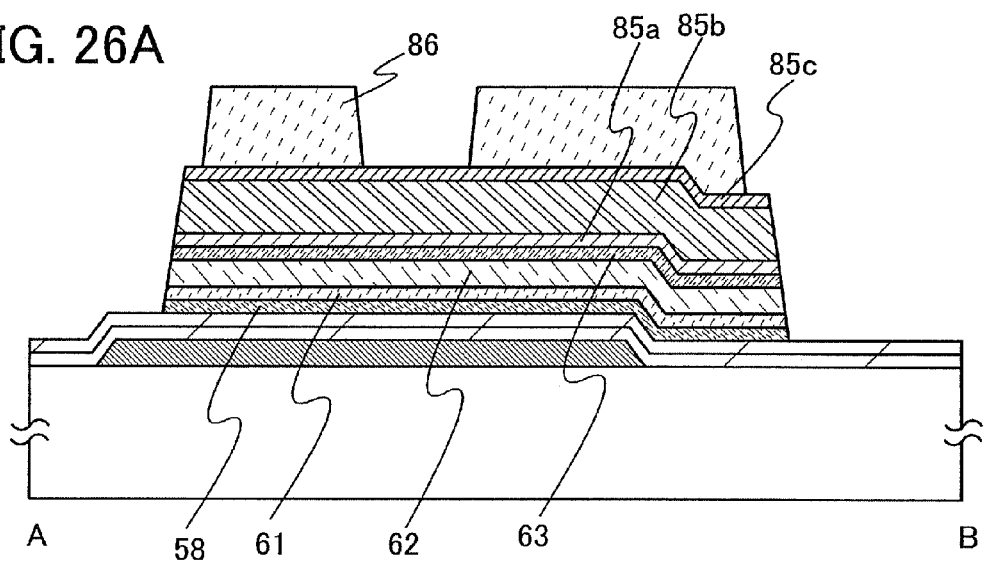
FIGS. 26A to 26C are cross-sectional views illustrating a method for manufacturing a display device of the present invention.

Next, with the resist mask 81, the microcrystalline semiconductor film 57 including the impurity element which serves as a donor, the microcrystalline semiconductor film 53, the buffer layer 54, the semiconductor film 55 to which the impurity element imparting one conductivity type is added, and the conductive films 65a to 65c are etched. As a result, a microcrystalline semiconductor film 61 including the impurity element which serves as a donor, a microcrystalline semiconductor film 58 not including the impurity element which serves as a donor at a higher concentration than the detection limit of SIMS, a buffer layer 62, a semiconductor film 63 to which the impurity element imparting one conductivity type is added, and conductive films 85a to 85c can be formed, as shown in FIG. 26A. FIG. 26A shows a cross section taken along the line A-B of FIG. 30A (except for the resist mask 81).

Next, ashing is conducted on the resist mask 81. As a result, the area and the thickness of the resist are reduced. At this time, the resist in a region with a small thickness (a region overlapping with part of the gate electrode 51) is removed to form a separated resist mask 86, as shown in FIG. 26A.

Figure 26B:
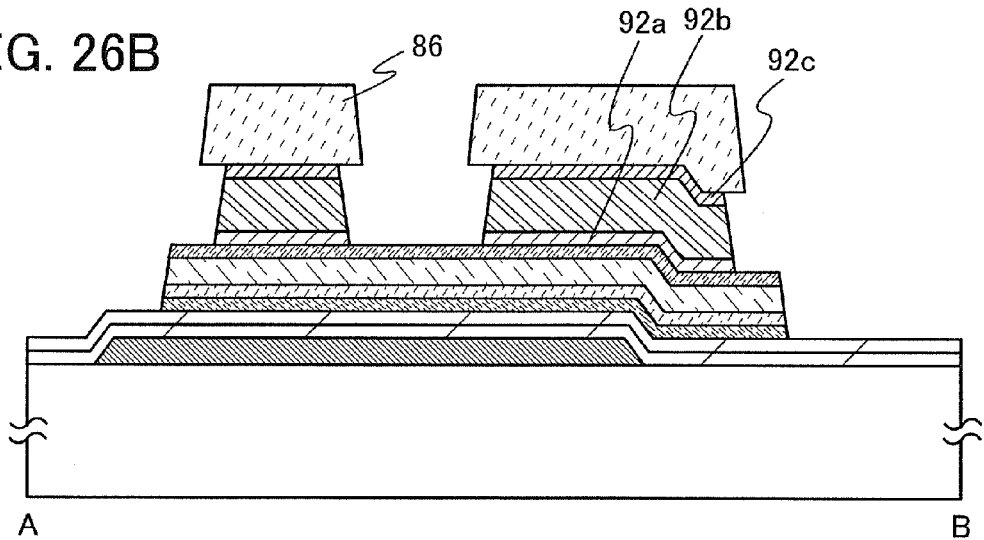

Next, the conductive films 85a to 85c are etched to be separated using the resist mask 86. As a result, pairs of wirings 92a to 92c can be formed as shown in FIG. 26B. Here, by wet etching of the conductive films 85a to 85c with use of the resist mask 86, the conductive films 85a to 85c are selectively etched. And, since the conductive films 85a to 85c are isotropically etched, the wirings 92a to 92c with smaller areas than the resist mask 86 can be formed.

Next, the semiconductor film 63 to which the impurity element imparting one conductivity type is added is etched using the resist mask 86, so that a pair of source and drain regions 88 are formed. Note that, in this etching step, a part of the buffer layer 62 is also etched. The buffer layer which is partly etched is referred to as a buffer layer 87. The buffer layer 87 has a recessed portion. The source and drain regions and the recessed portion of the buffer layer can be formed in the same process. Here, the buffer layer 62 is partly etched with use of the resist mask 86 having a smaller area than the resist mask 81, so that end portions of the buffer layer 87 are located outside those of the source and drain regions 88. In addition, the end portions of the wirings 92a to 92c are not aligned with those of the source and drain regions 88, and the end portions of the source and drain regions 88 are formed outside those of the wirings 92a to 92c. After that, the resist mask 86 is removed.

Next, dry etching is performed under such a condition that the buffer layer which is exposed is not damaged and an etching rate with respect to the buffer layer is low. Through this dry etching step, an etching residue on the buffer layer between the source region and the drain region, a residue of the resist mask, and a contamination source in the apparatus used for removal of the resist mask can be removed, whereby the source region and the drain region can be certainly insulated. As a result, leak current of the thin film transistor can be reduced, so that a thin film transistor with small off current and high withstand voltage can be manufactured. A chlorine gas can be used for an etching gas, for example.

Figure 26C:
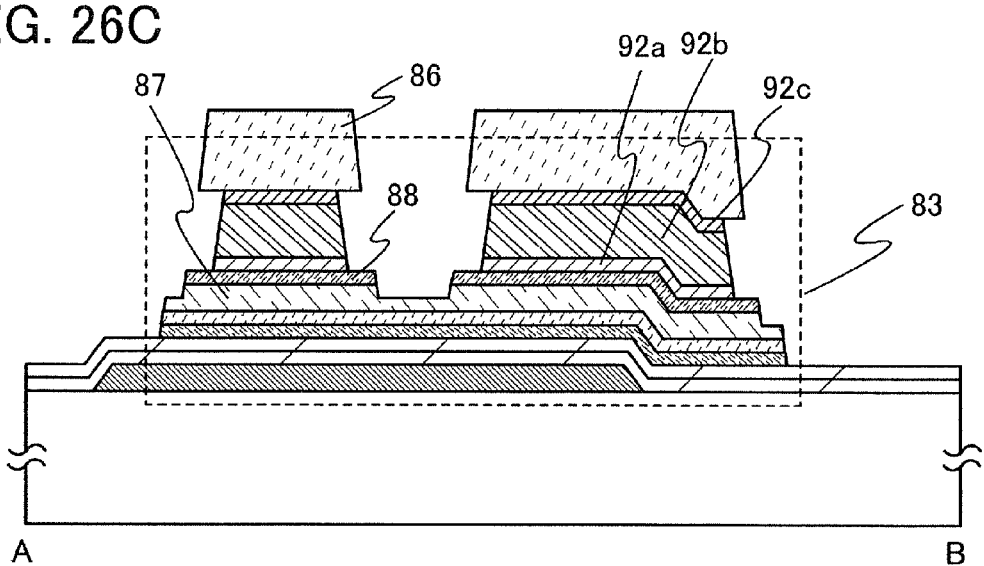

As shown in FIG. 26C, the end portions of the wirings 92a to 92c are not aligned with those of the source and drain regions 88, whereby the end portions of the wirings 92a to 92c can have a larger distance therebetween; thus, leak current or short-circuit between the wirings can be prevented. Accordingly, an inverted staggered thin film transistor can be manufactured.

Through the above-described process, a channel-etched thin film transistor 83 can be formed. In addition, the thin film transistor can be formed using two photomasks.

Figure 27A:
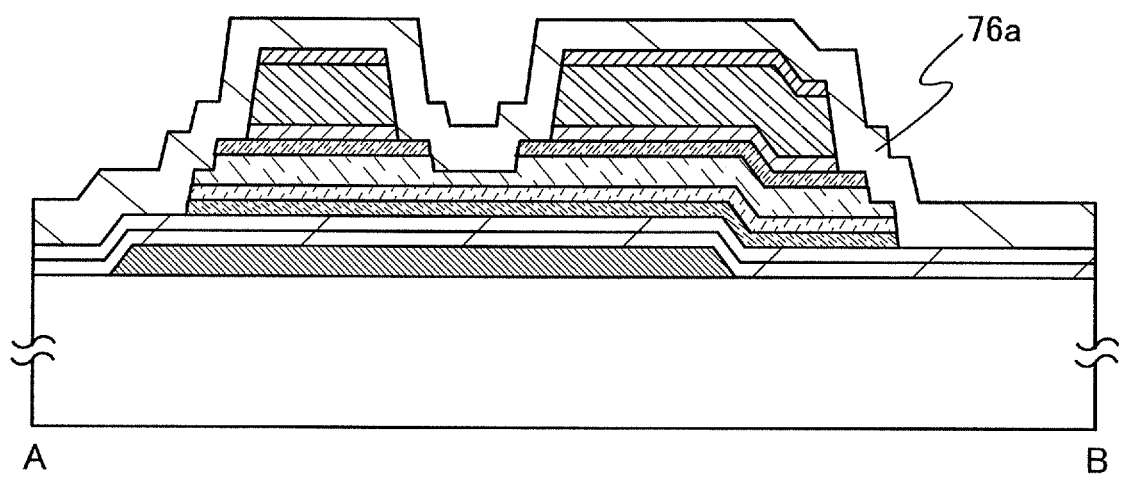
FIGS. 27A and 27B are cross-sectional views illustrating a method for manufacturing a display device of the present invention.

Next, as shown in FIG. 27A, a protective insulating film 76a is formed over the wirings 92a to 92c, the source and drain regions 88, the buffer layer 87, the microcrystalline semiconductor film 61, the microcrystalline semiconductor film 58 including the impurity element which serves as a donor, and the gate insulating film 52b. The protective insulating film 76a can be formed in a similar manner to the gate insulating films 52a and 52b.

Figure 27B:
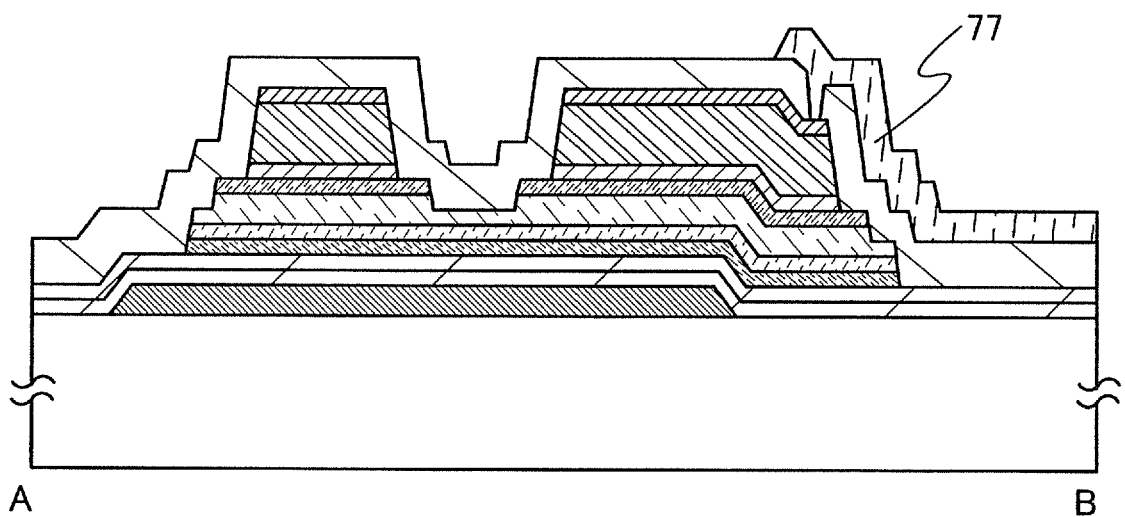

Next, a part of the protective insulating film 76a is etched using a resist mask formed using a third photomask, so that a contact hole is formed. Next, a pixel electrode 77 is formed in the contact hole to be in contact with the wiring 92c. In this example, as the pixel electrode 77, an ITO film is formed by a sputtering method, and then, a resist is applied on the ITO film. Then, the resist is exposed to light and developed using a fourth photomask, thereby forming a resist mask, and the ITO film is etched using the resist mask to form the pixel electrode 77. FIG. 27B shows a cross section taken along the line A-B in FIG. 30C.

Through the above process, a thin film transistor and an element substrate which includes the thin film transistor and can be used for a display device can be formed.

Figure 30A:
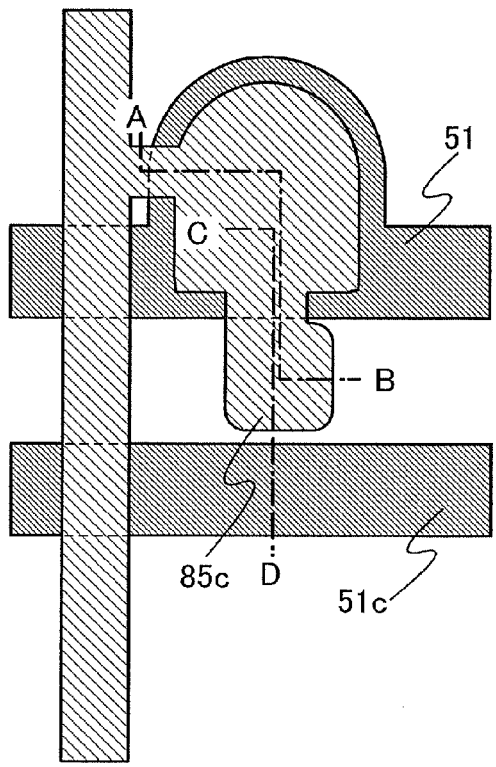
FIGS. 30A to 30C are top views illustrating a method for manufacturing a display device of the present invention.
Figure 30B:
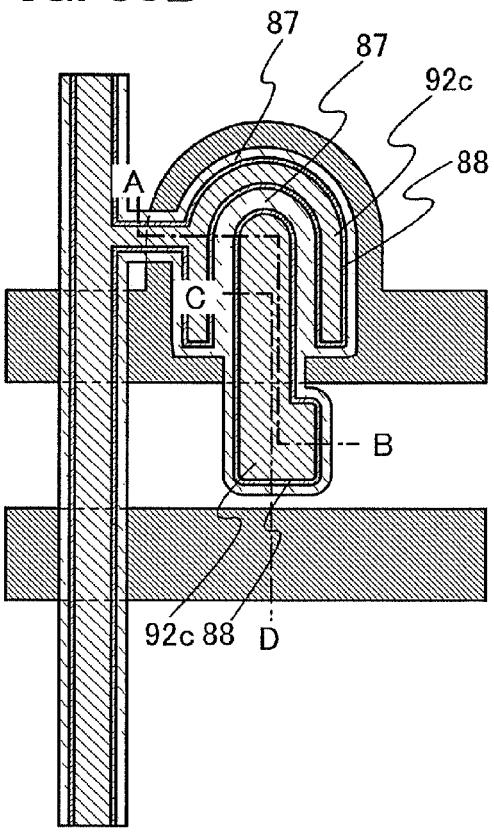
Figure 30C:
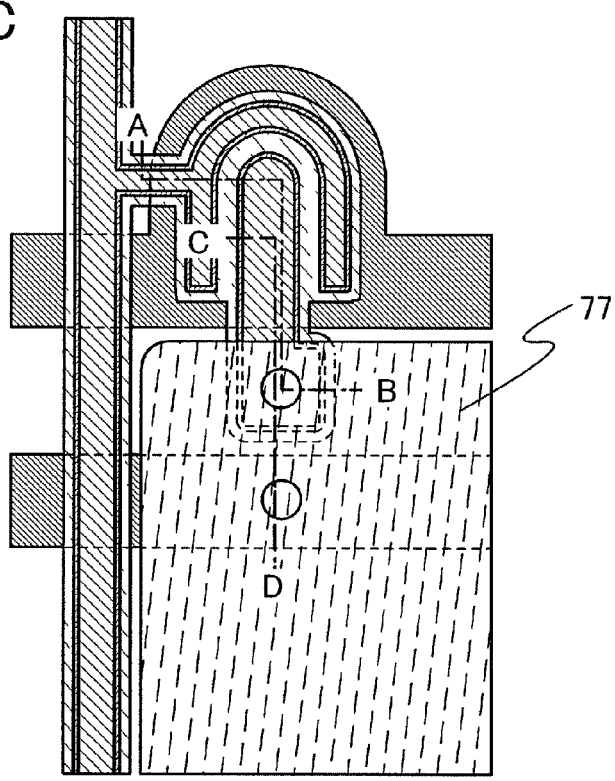

Next, a process capable of forming a contact hole and a capacitor element with one photomask will be described below. Cross-sectional views taken along lines C-D in FIGS. 30A to 30C are used here.

Figure 28A:
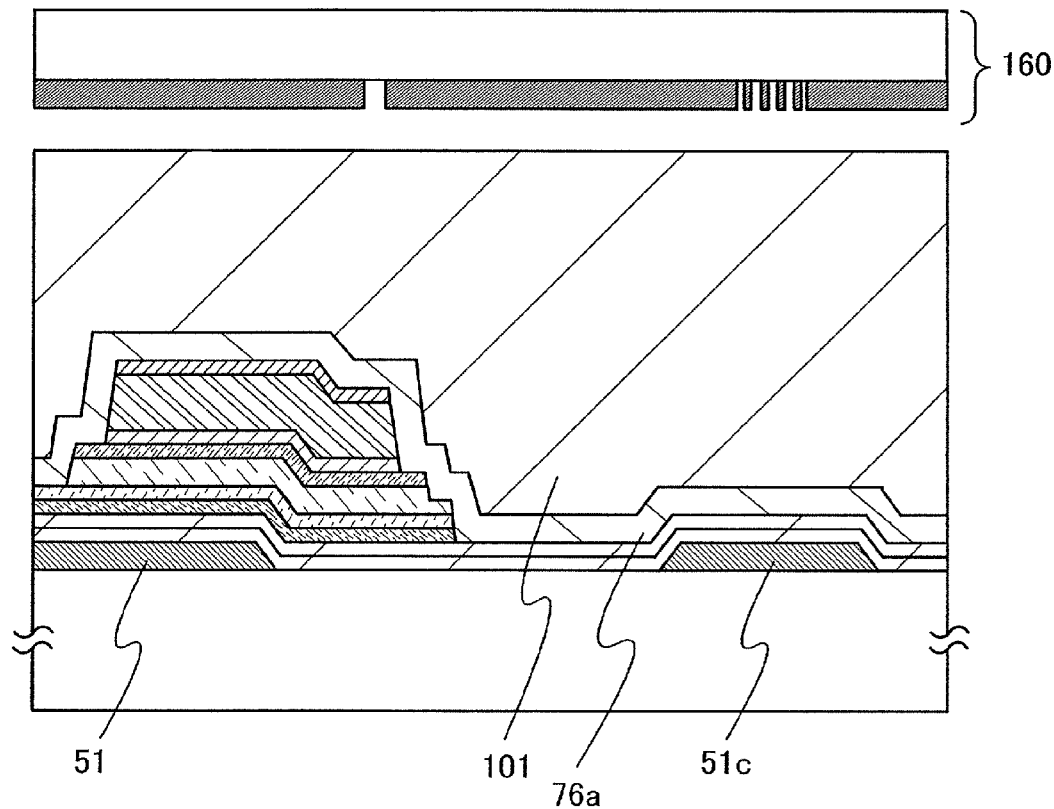
FIGS. 28A and 28B are cross-sectional views illustrating a method for manufacturing a display device of the present invention.
Figure 28B:
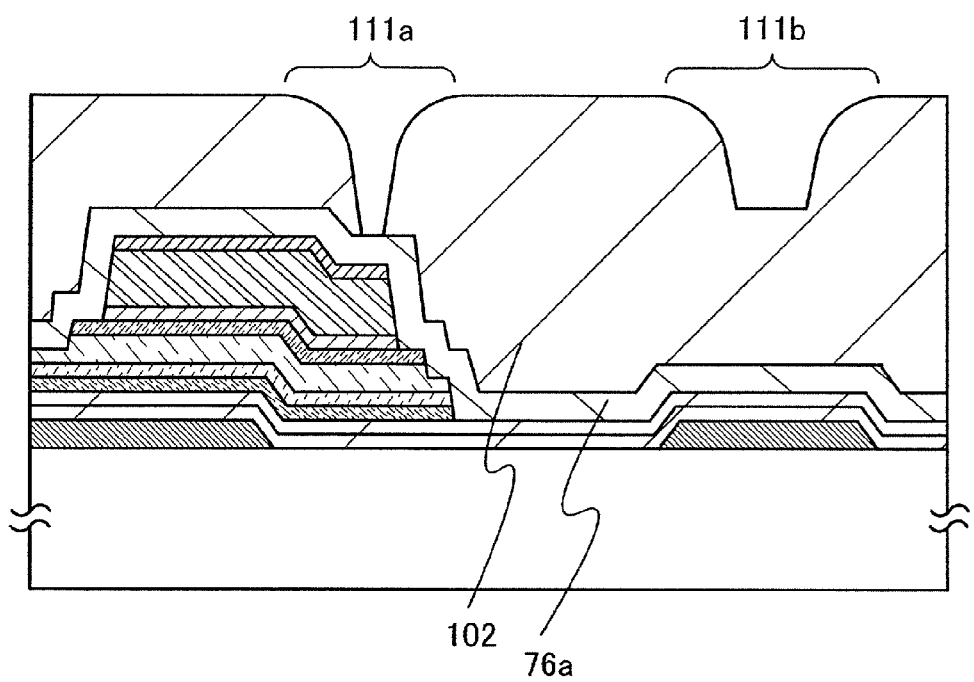

After the step shown in FIG. 27A, an insulating film 101 is formed over the protective insulating film 76a as shown in FIG. 28A. The insulating film 101 is formed using a photo-sensitive organic resin here. Then, the insulating film 101 is exposed to light using a multi-tone mask 160 and developed, whereby an insulating film 102 having a recessed portion 111a which exposes the protective insulating film 76a covering the wiring of the thin film transistor and a recessed portion 111b over a capacitor wiring 51c is formed as shown in FIG. 28B. Here, by use of the multi-tone mask 160, the insulating film 101 can be exposed to 100% transmitting light over the wiring of the thin film transistor, and the insulating film 101 can be exposed to transmitting light which is attenuated to 10 to 70% over the capacitor wiring 51c.

Figure 29A:
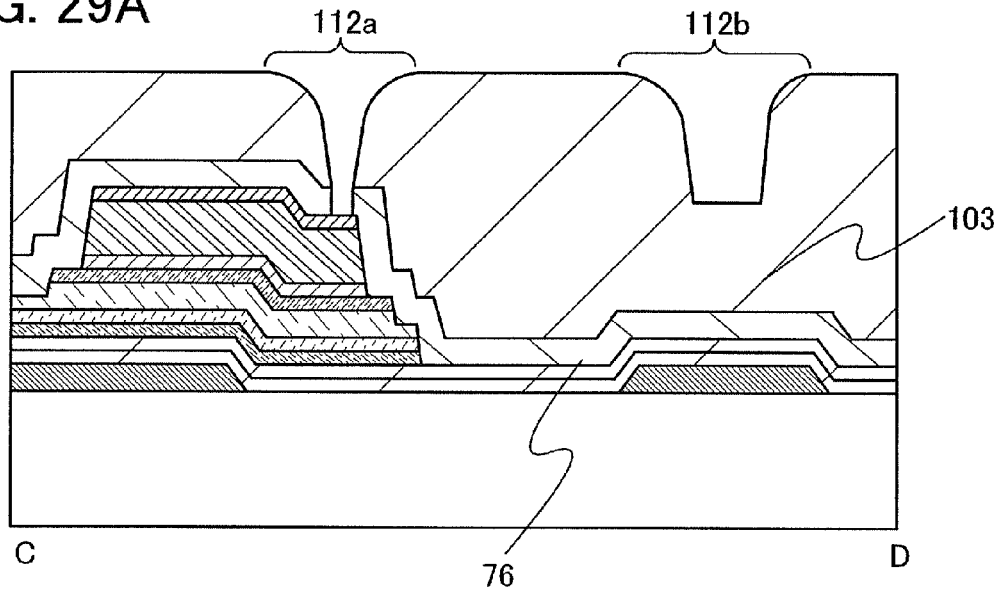
FIGS. 29A to 29C are cross-sectional views illustrating a method for manufacturing a display device of the present invention.
Figure 29B:
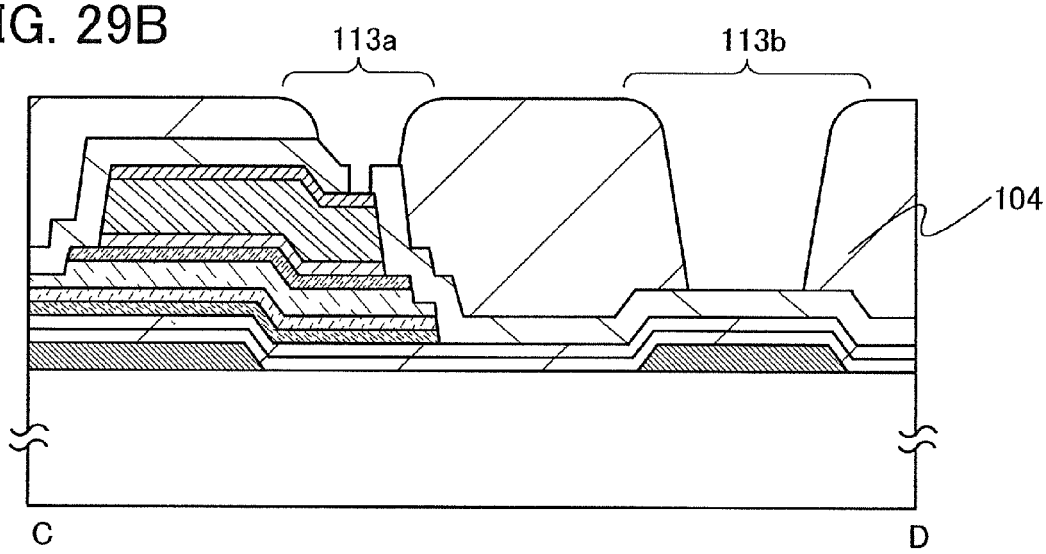
Figure 29C:
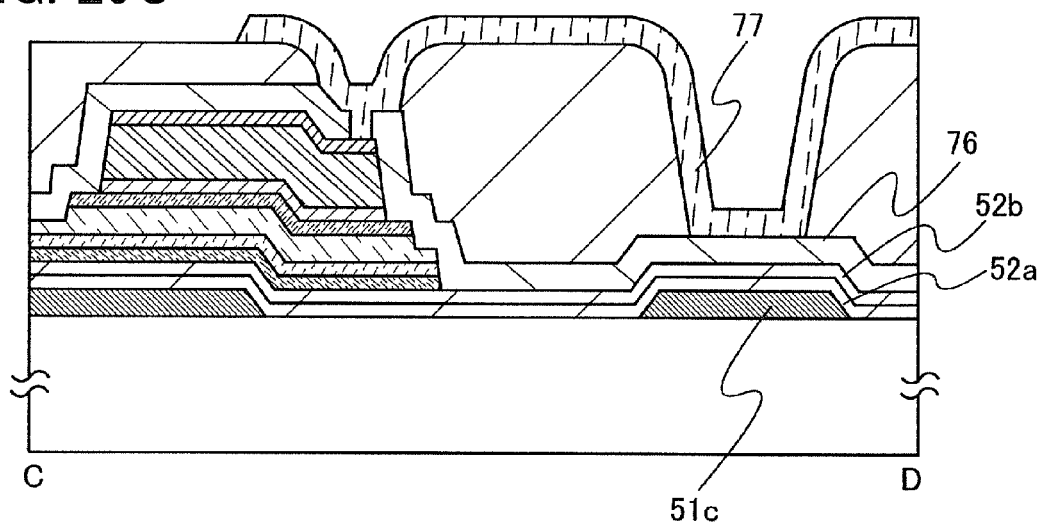

Next, the insulating film 102 having the recessed portions is etched (etch back), then, a part of the protective insulating film 76a is etched. As a result, an insulating film 103 having a contact hole 112a which exposes the wiring and a recessed portion 112b over the capacitor wiring 51c is formed as shown in FIG. 29A.

Next, ashing is conducted on the insulating film 103, and the areas of the contact hole 112a and the recessed portion 112b are widened, so that an insulating film 104 having a contact hole 113a and a recessed portion 113b is formed. Since the protective insulating film 76 is not formed of a photosensitive organic resin but formed of an inorganic insulating film, it is not processed by ashing. Therefore, the contact hole 113a over the wirings has a top shape with double circles.

After that, a pixel electrode 77 is formed, and a capacitor element including the capacitor wiring 51c, the gate insulating films 52a and 52b, the protective insulating film 76, and the pixel electrode 77 can be formed.

Through the above process, the contact hole connecting the pixel electrode and the wiring, and the capacitor element can be formed by using only one multi-tone mask.

Figure 31:
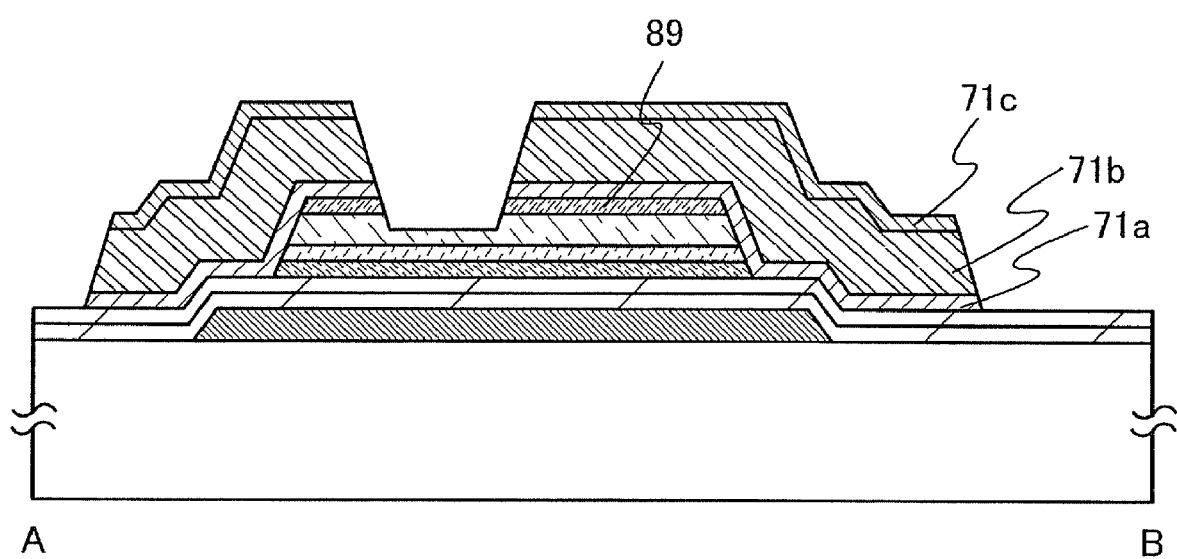
FIG. 31 is a cross-sectional view illustrating a method for manufacturing a display device of the present invention.

Further, in FIG. 12B or FIG. 26B, after forming the wirings 71a to 71c or 92a to 92c, the resist mask 66 or 86 may be removed, and the semiconductor film 63 to which the impurity element imparting one conductivity type is added may be etched using the wirings 71a to 71c or 92a to 92c as masks. As a result, a thin film transistor in which end portions of the wirings 71a to 71c or 92a to 92c are aligned with those of the semiconductor films 72 or 88 which serve source and drain regions can be formed. Here, after removing the resist mask 66 shown in FIG. 12B, the semiconductor film 63 to which the impurity element imparting one conductivity type is added is etched using the wirings 71a to 71c as masks, so that a thin film transistor in which end portions of source and drain regions 89 are aligned with those of the wirings 71a to 71c can be formed as shown in FIG. 31. The mode in which the end portions of the source and drain regions 89 and those of the wirings 71a to 71c are aligned with each other is applied to the thin film transistor shown in FIG. 4A here, but this mode can also be applied to the thin film transistors shown in FIG. 1A, FIG. 5, FIG. 6A, FIG. 7A, FIG. 8A, and FIG. 9A.

Although this embodiment mode describes a channel-etched thin film transistor, a microcrystalline semiconductor film can also be used for a channel formation region of a channel protective thin film transistor.

Specifically, as shown in FIG. 11A, a gate electrode 51 is formed over a substrate 50, and gate insulating films 52a and 52 are formed over the gate electrode 51. Then, a microcrystalline semiconductor film 57 including an impurity element which serves as a donor is formed thereover a microcrystalline semiconductor film 53 not including the impurity element which serves as a donor at a higher concentration than the detection limit of SIMS may be formed thereover.

Figure 32:
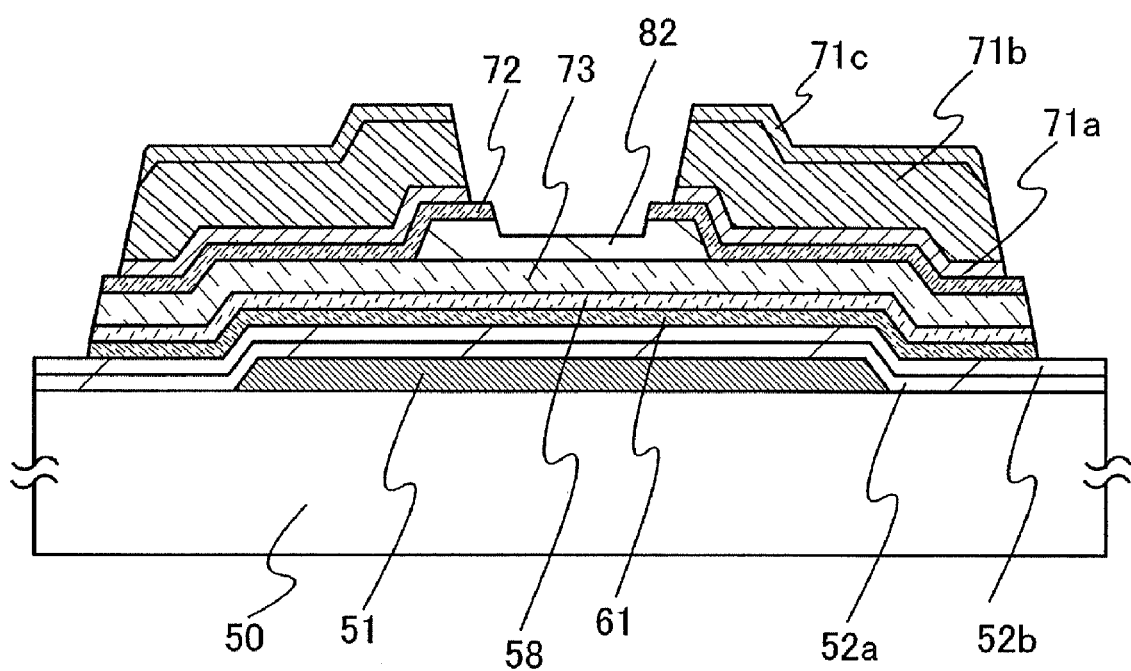
FIG. 32 is a cross-sectional view illustrating a method for manufacturing a display device of the present invention.

As shown in FIG. 11B, a buffer layer 54 is formed over the microcrystalline semiconductor film 57 including the impurity element which serves as a donor or the microcrystalline semiconductor film 53 not including the impurity element which serves as a donor at a higher concentration than the detection limit of SIMS. Then, a channel protective film is formed in a region which is over the buffer layer 54 and which overlaps with the gate electrode 51. The channel protective film is formed by forming a silicon nitride film, a silicon oxide film, a silicon nitride oxide film, or a silicon oxynitride film and selectively etching the film through a photolithography process. Alternatively, the channel protective film can be formed by discharging a composition including polyimide, acrylic, or siloxane and baking it. Next, a semiconductor film to which an impurity element imparting one conductivity type is added and conductive films are formed in this order. Then, using a resist mask which is formed through a photolithography process, the conductive films, the semiconductor film to which the impurity element imparting one conductivity type is added, the buffer layer 54, the microcrystalline semiconductor film 53 not including the impurity element which serves as a donor at a higher concentration than the detection limit of SIMS, and the microcrystalline semiconductor film 57 including the impurity element which serves as a donor are etched. Consequently, a microcrystalline semiconductor film 61 including the impurity element which serves as a donor, a microcrystalline semiconductor film 58 not including the impurity element which serves as a donor at a higher concentration than the detection limit of SIMS, a buffer layer 73, semiconductor films 72 which serve as source and drain regions, and wirings 71a to 71c which serve as source and drain electrodes are formed as shown in FIG. 32. Further, a channel protective film 82 having a recessed portion in a part thereof is formed.

Through the above process, a channel protective thin transistor can be formed.

Although a mode in which a channel protective film is applied to the thin film transistor shown in FIG. 4A is described here, the channel protective film can also be applied to the thin film transistors shown in FIG. 1A, FIG. 5, FIG. 6A, FIG. 7A, FIG. 8A, and FIG. 9A.

In accordance with this embodiment mode, an inverted staggered thin film transistor with excellent electric characteristics and an element substrate provided with the inverted staggered thin film transistor can be manufactured.

This embodiment mode describes an inverted staggered thin film transistor as a thin film transistor, but the present invention is not limited thereto and can also be applied to a staggered thin film transistor, a top gate thin film transistor, and the like. Specifically, a microcrystalline semiconductor film and/or an insulating film functioning as a base film is made to include an impurity element which serves as a donor, and a gate insulating film and a gate electrode are formed over the microcrystalline semiconductor film, whereby a thin film transistor having a microcrystalline semiconductor film with high crystallinity at the interface with the insulating film can be manufactured. Accordingly, a thin film transistor with excellent electric characteristics can be formed.

Embodiment Mode 3

In this embodiment mode, a liquid crystal display device including the thin film transistor described in Embodiment Mode 1 will be described below as one mode of a display device. Here, a vertical alignment (VA) liquid crystal display device will be described with reference to FIG. 33, FIG. 34, and FIG. 35. The VA liquid crystal display device employs one mode for controlling alignment of liquid crystal molecules of a liquid crystal panel. The VA liquid crystal display device employs a mode in which liquid crystal molecules are vertical to a panel surface when voltage is not applied. In particular, in this embodiment mode, it is devised that a pixel is divided into several regions (sub-pixels) so that molecules are aligned in different directions in different regions. This is referred to as multi-domain or multi-domain design. In the following description, a liquid crystal display device with multi-domain design is described.

Figure 33:
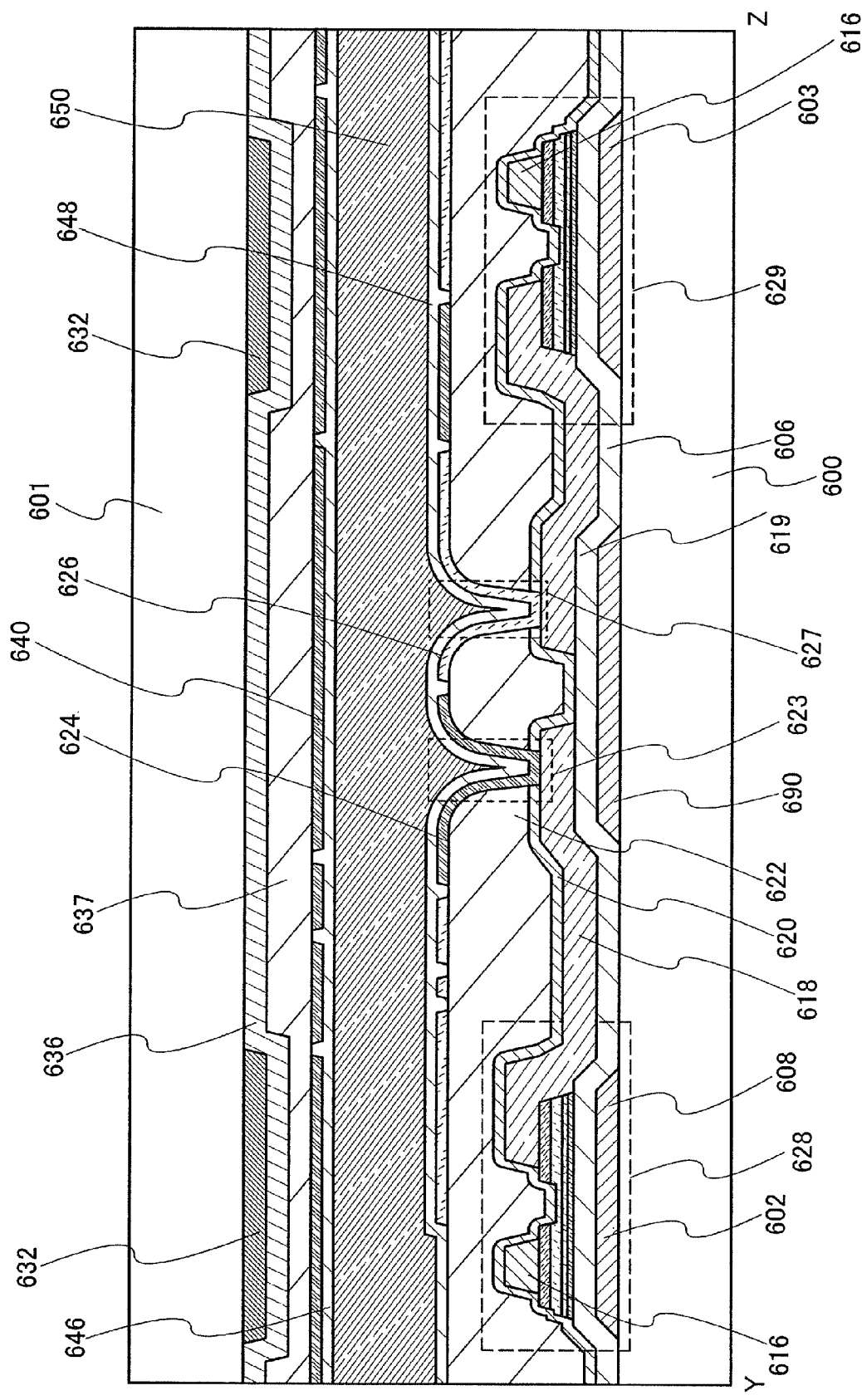
FIG. 33 is a cross-sectional view illustrating a display device of the present invention.
Figure 34:
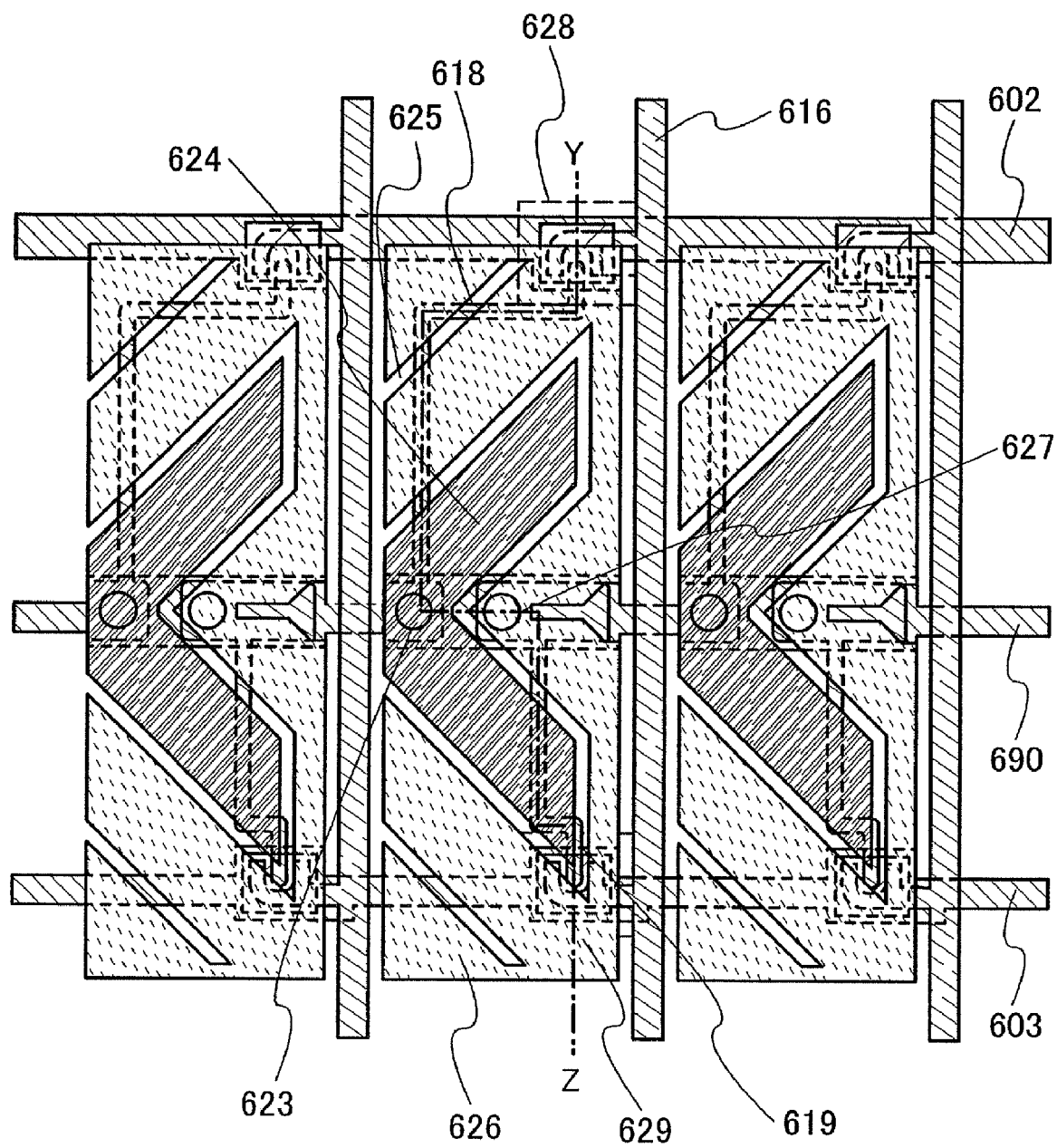
FIG. 34 is a top view illustrating a display device of the present invention.

FIG. 33 and FIG. 34 show a pixel structure of a VA liquid crystal panel. FIG. 34 is a plan view of a substrate 600. FIG. 33 shows a cross-sectional structure along a line Y-Z in FIG. 34. The following description will be made with reference to both the drawings.

In this pixel structure, a plurality of pixel electrodes 624 and 626 are included in one pixel, and thin film transistors 628 and 629 are connected to the pixel electrodes 624 and 626, respectively, through a planarization film 622. The thin film transistors 628 and 629 are driven by different gate signals. That is, a pixel of multi-domain design has a structure in which a signal applied to each of the pixel electrodes 624 and 626 is independently controlled.

The pixel electrode 624 is connected to the thin film transistor 628 through a wiring 618 in a contact hole 623. In a contact hole 627, the pixel electrode 626 is connected to the thin film transistor 629 through a wiring 619. A gate wiring 602 of the thin film transistor 628 and a gate wiring 603 of the thin film transistor 629 are separated so that different gate signals can be given thereto. In contrast, a wiring 616 functioning as a data line is used in common for the thin film transistors 628 and 629. The thin film transistors 628 and 629 can be manufactured by the methods described in Embodiment Mode 2.

The pixel electrodes 624 and 626 have different shapes and are separated by a slit 625. The pixel electrode 626 surrounds the pixel electrode 624, which has a V-shape. Timings of voltage application are varied between the pixel electrode 624 and the pixel electrode 626 by the thin film transistor 628 and the thin film transistor 629, so that alignment of liquid crystals is controlled. When different gate signals are supplied to the gate wiring 602 and the gate wiring 603, operation timings of the thin film transistor 628 and the thin film transistor 629 can be varied. An alignment film 648 is formed over the pixel electrodes 624 and 626.

Figure 35:
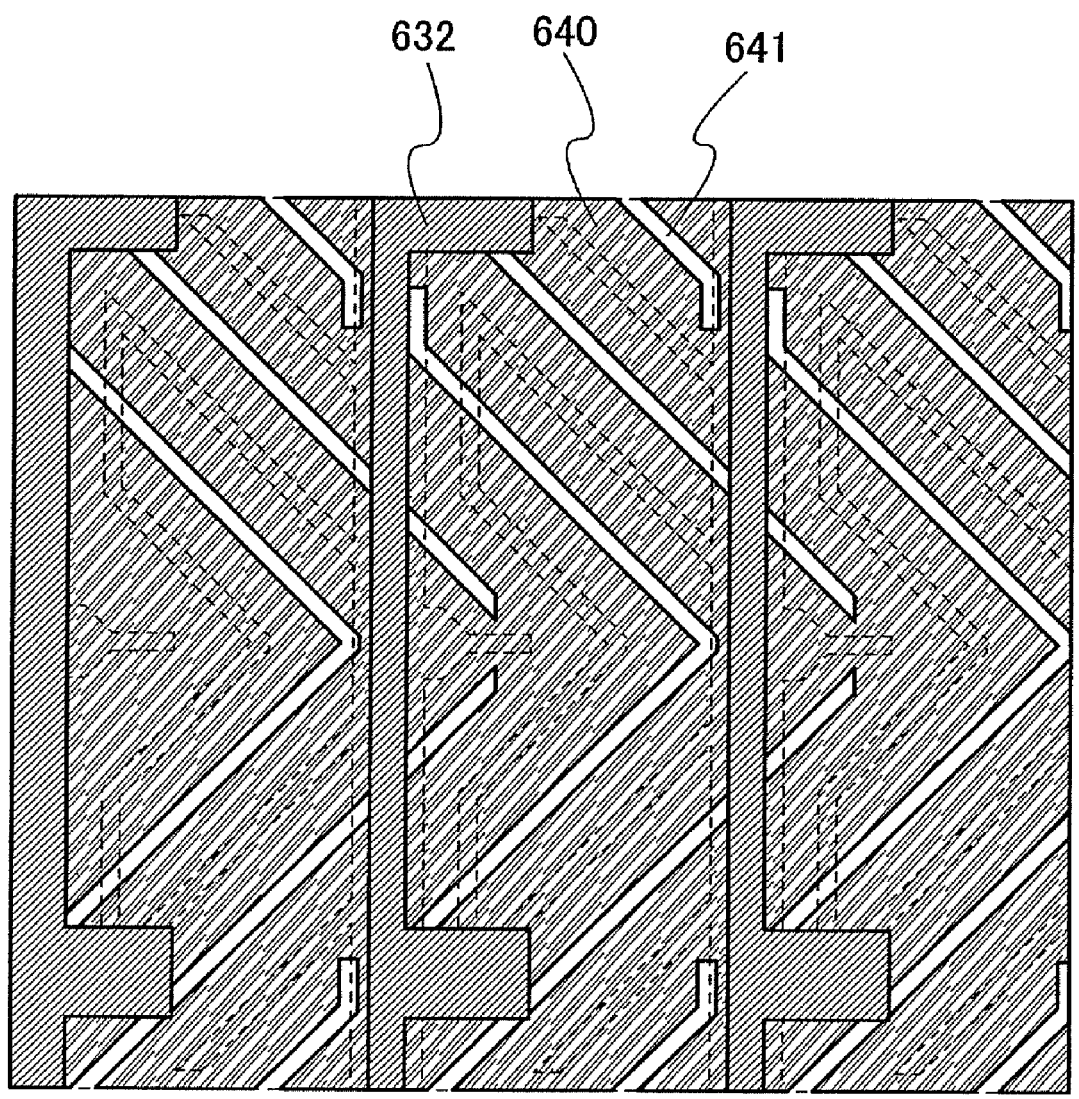
FIG. 35 is a top view illustrating a display device of the present invention.

A counter substrate 601 is provided with a light-blocking film 632, a coloring film 636, and a counter electrode 640. In addition, a planarization film 637 is formed between the coloring film 636 and the counter electrode 640 so that alignment disorder of liquid crystals is prevented. Further, an alignment film 646 is formed on the counter electrode 640. FIG. 35 shows a structure of the counter substrate side. A slit 641 is formed in the counter electrode 640 which is used in common between different pixels. The slit 641 and the slit 625 on the side of the pixel electrodes 624 and 626 are alternately arranged in an engaging manner; thus, an oblique electric field is effectively generated, and the alignment of liquid crystals can be controlled. Accordingly, a direction of alignment of the liquid crystals can be made different depending on location and the viewing angle is widened.

In this specification, a substrate, a coloring film, a light-blocking film, and a planarization film form a color filter. Note that either the light-blocking film or the planarization film, or both of them are not necessarily formed over the substrate.

The coloring film has a function of preferentially transmitting light of a predetermined wavelength range, among light of the wavelength range of visible light. In general, a coloring film which preferentially transmits light of a wavelength range of red light, a coloring film which preferentially transmits light of a wavelength range of blue light, and a coloring film which preferentially transmits light of a wavelength range of green light are combined to be used for the color filter. However, the combination of the coloring films is not limited to the above combination.

The pixel electrode 624, a liquid crystal layer 650, and the counter electrode 640 overlap with each other to form a first liquid crystal element. Further, a second liquid crystal element is formed by overlapping of the pixel electrode 626, the liquid crystal layer 650, and the counter electrode 640. Furthermore, the multi-domain structure is employed in which the first liquid crystal element and the second liquid crystal element are provided for one pixel.

Although a vertical alignment (VA) liquid crystal display device is described here, the element substrate formed in accordance with Embodiment Mode 1 can also be applied to an FFS mode liquid crystal display device, an IPS mode liquid crystal display device, a TN mode liquid crystal display device, and the like.

The liquid crystal display device can be manufactured through the above-described process. Since an inverted staggered thin film transistor with small off current and excellent electric characteristics is used for the liquid crystal display device of this embodiment mode, the liquid crystal display device can have high contrast and high visibility.

Embodiment Mode 4

Figure 36A:
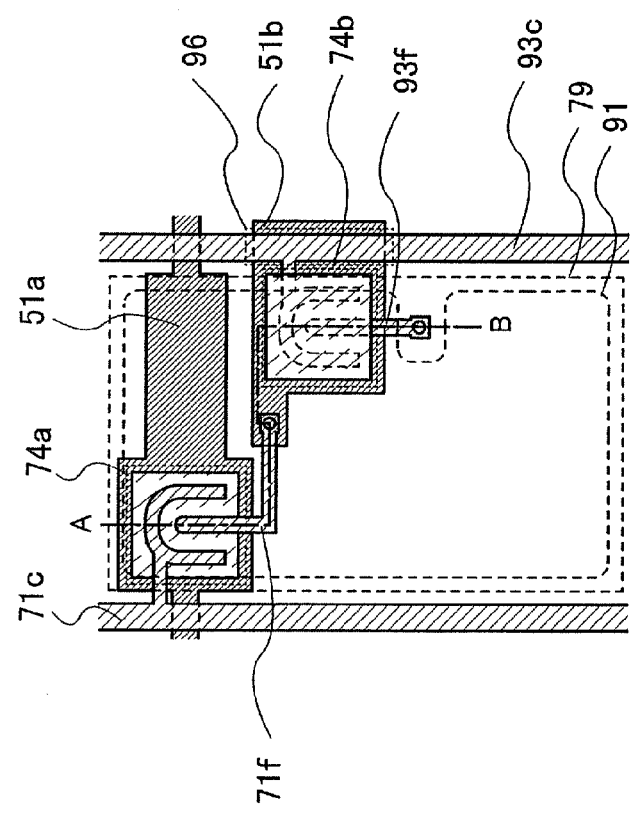
FIGS. 36A and 36B are a top view and a cross-sectional view, respectively, illustrating a display device of the present invention.
Figure 36B:
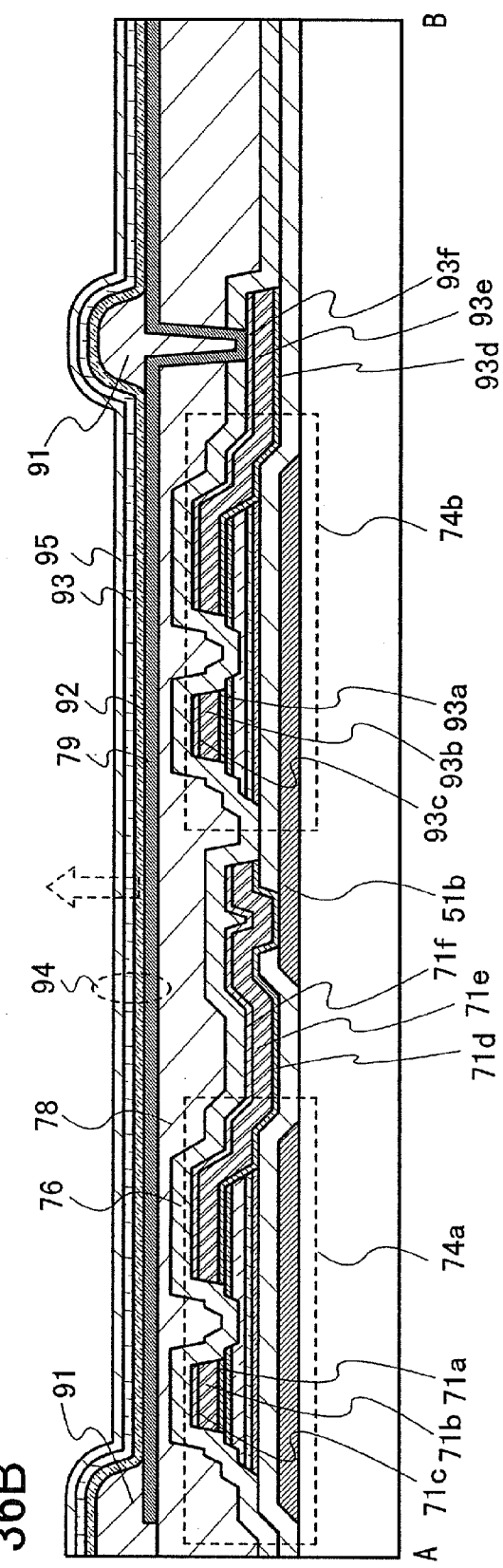

In this embodiment mode, a light-emitting display device including the thin film transistor in accordance with Embodiment Modes 1 and 2 will be described as one mode of a display device, and a structure of a pixel included in the light-emitting display device will be described. FIG. 36A shows one mode of a top view of a pixel. FIG. 36B shows one mode of a cross-sectional structure of the pixel along a line A-B in FIG. 36A.

A display device including a light-emitting element utilizing electroluminescence is shown as a light-emitting device. Light-emitting elements utilizing electroluminescence are classified according to whether a light-emitting material is an organic compound or an inorganic compound. In general, the former is referred to as an organic EL element, and the latter as an inorganic EL element. In this embodiment mode, the manufacturing process of the thin film transistor in accordance with Embodiment Mode 2 can be used.

In the case of an organic EL element, by applying voltage to a light-emitting element, electrons and holes are injected from a pair of electrodes into a layer including an organic compound with a light-emitting property to cause a current flow. Then, by recombination of these carriers (electrons and holes), the organic compound with a light-emitting property forms an excited state, and light is emitted when the excited state returns to a ground state. Due to such a mechanism, such a light-emitting element is called a current excitation type light-emitting element.

Inorganic EL elements are classified according to their element structures, into a dispersion type inorganic EL element and a thin-film type inorganic EL element. The dispersion type inorganic EL element has a light-emitting layer in which particles of a light-emitting material are dispersed in a binder. The mechanism of light emission of the dispersion type inorganic EL element is donor acceptor recombination light emission, which utilizes a donor level and an acceptor level. The thin-film type inorganic EL element has a structure in which a light-emitting layer is interposed between dielectric layers and the light-emitting layer interposed between the dielectric layers is further interposed between electrodes and adopts local emission in which inner shell electron transition of a metal ion is utilized. Note that the description is made here using an organic EL element as a light-emitting element. In addition, the description is made using channel-etched thin film transistors as a switching thin film transistor for controlling input of a signal to a first electrode and a driving thin film transistor which controls driving of a light-emitting element, but a channel protective thin film transistor can also be used as appropriate.

In FIGS. 36A and 36B, a first thin film transistor 74a is a switching thin film transistor for controlling input of a signal to a first electrode, and a second thin film transistor 74b is a driving thin film transistor for controlling current or voltage supply to a light-emitting element 94.

A gate electrode of the first thin film transistor 74a is connected to a wiring 51a functioning as a scanning line, one of a source and a drain is connected to wirings 71a to 71c which function as signal lines, and the other of the source and the drain is electrically connected to a gate electrode 51b of the second thin film transistor 74b. One of a source and a drain of the second thin film transistor 74b is connected to power source lines 93a to 93c, and the other of the source and the drain is electrically connected to a first electrode 79 of a display device. A gate electrode, a gate insulating film, and the power source line 93a of the second thin film transistor 74b form a capacitor element 96, and the other of the source and the drain of the first thin film transistor 74a is connected to the capacitor element 96.

The capacitor element 96 corresponds to a capacitor element for holding a voltage between the gate and the source or between the gate and the drain (hereinafter referred to as a gate voltage) of the second thin film transistor 74b when the first thin film transistor 74a is turned off, and is not necessarily provided.

In this embodiment mode, the first thin film transistor 74a and the second thin film transistor 74b can be each formed using the thin film transistor described in Embodiment Mode 1. In addition, although each of the first thin film transistor 74a and the second thin film transistor 74b is an n-channel thin film transistor, the first thin film transistor 74a and the second thin film transistor 74b may also be formed using an n-channel thin film transistor and a p-channel thin film transistor, respectively. Furthermore, both the first thin film transistor 74a and the second thin film transistor 74b may be formed using p-channel thin film transistors.

A protective insulating film 76 is formed over the first thin film transistor 74a and the second thin film transistor 74b, and a planarization film 78 is formed over the protective insulating film 76, and then the first electrode 79 is formed to be connected to a wiring 93f in a contact hole formed in the planarization film 78 and the protective insulating film 76. The planarization film 78 is preferably formed using an organic resin such as acrylic, polyimide, or polyamide, or a siloxane polymer. Since the first electrode 79 is uneven in the contact hole, a partition wall 91 having an opening and covering the uneven portion of the first electrode 79 is provided. In the opening of the partition wall 91, an EL layer 92 is formed so as to be in contact with the first electrode 79, and a second electrode 93 is formed so as to cover the EL layer 92. A protective insulating film 95 is formed so as to cover the second electrode 93 and the partition wall 91.

The light-emitting element 94 having a top emission structure is shown as a light-emitting element. Note that the light-emitting element 94 with a top emission structure can emit light even in the case where it is over the first thin film transistor 74a or the second thin film transistor 74b; thus, a light emission area can be increased. However, if a base film of the EL layer 92 is uneven, the thickness is nonuniform due to unevenness, and the second electrode 93 and the first electrode 79 are short-circuited, so that a display defect is caused. Therefore, it is preferable to provide the planarization film 78.

The light-emitting element 94 corresponds to a region where the first electrode 79 and the second electrode 93 sandwich the EL layer 92. In the case of the pixel shown in FIG. 36A, light from the light-emitting element 94 is emitted to the second electrode 93 side as shown by an outline arrow.

As the first electrode 79 functioning as a cathode, a known conductive film can be used as long as it has a low work function and reflects light. For example, Ca, Al, CaF, MgAg, AlLi, or the like is preferably used. The EL layer 92 may be formed using a single layer or by stacking a plurality of layers. When the EL layer 92 is formed using a plurality of layers, an electron-injection layer, an electron-transporting layer, a light-emitting layer, a hole-transporting layer, and a hole-injecting layer are stacked in this order over the first electrode 79. It is not necessary to form all of these layers. The second electrode 93 functioning as an anode is formed using a light-transmitting conductive material such as a film of indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

A light-emitting element having a top emission structure, in which light is extracted from a side opposite to a substrate, is described here; however, a light-emitting element having a bottom emission structure, in which light is extracted from the substrate side, or a light-emitting element having a dual emission structure, in which light is extracted from both the substrate side and the side opposite to the substrate, can also be employed.

Although an organic EL element is described here as a light-emitting element, an inorganic EL element can also be provided as a light-emitting element.

Note that, in this embodiment mode, an example in which a thin film transistor for controlling the driving of a light-emitting element (the driving thin film transistor) is electrically connected to the light-emitting element is described; however, a thin film transistor for controlling current may be connected between the driving thin film transistor and the light-emitting element.

Through the above-described process, a light-emitting display device can be manufactured. The light-emitting display device of this embodiment mode can have high contrast and high visibility because an inverted staggered thin film transistor with small off current and excellent electric characteristics is used.

Embodiment Mode 5

In this embodiment mode, a structure of a display panel, which is one mode of a display device of the present invention, will be described.

Figure 37A:
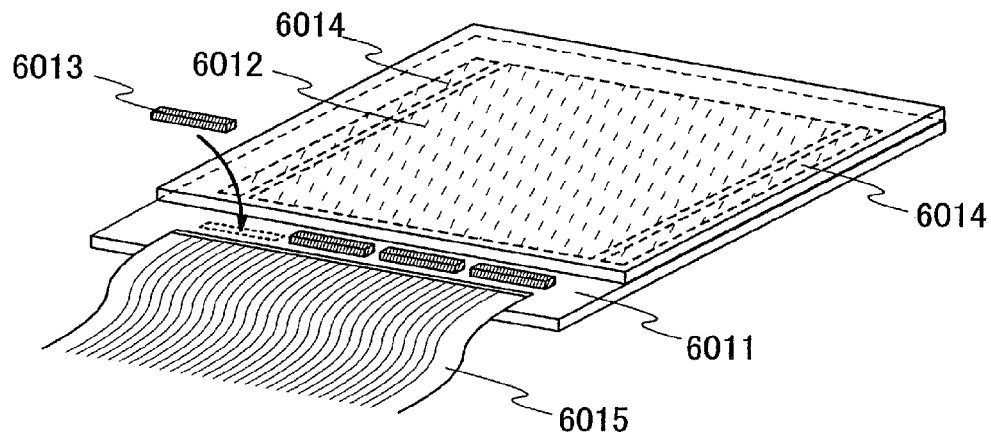
FIGS. 37A to 37C are perspective views illustrating display panels of the present invention.

FIG. 37A shows a mode of a display panel in which a pixel portion 6012 formed over a substrate 6011 is connected to a signal line driver circuit 6013 that is formed separately. The pixel portion 6012 and a scanning line driver circuit 6014 are each formed using a thin film transistor in accordance with Embodiment Modes 1 and 2. By forming the signal line driver circuit using a transistor which has higher field effect mobility than a thin film transistor in which a microcrystalline semiconductor film is used for a channel formation region, an operation of the signal line driver circuit which demands a higher driving frequency than the scanning line driver circuit can be stabilized. The signal line driver circuit 6013 may be formed using a transistor in which a single crystal semiconductor is used for a channel formation region, a thin film transistor in which a polycrystalline semiconductor is used for a channel formation region, or a transistor in which SOI is used for a channel formation region. The pixel portion 6012, the signal line driver circuit 6013, and the scanning line driver circuit 6014 are each supplied with potential of a power source, a variety of signals, and the like through an FPC 6015. Further, a protection circuit may be provided between the signal line driver circuit 6013 and the FPC 6015 or between the signal line driver circuit 6013 and the pixel portion 6012. The protection circuit includes one or more elements selected from a thin film transistor, a diode, a resistor element, a capacitor element, and the like. For example, a diode obtained by connecting the thin film transistor in accordance with Embodiment Mode 1 or 2 as a diode can be used.

Note that both the signal line driver circuit and the scanning line driver circuit may be formed over the same substrate as that of the pixel portion.

Figure 37B:
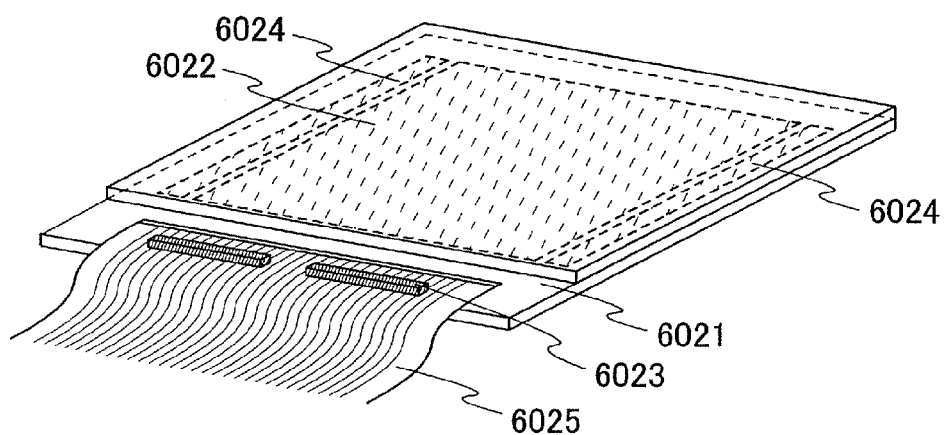

Also, when a driver circuit is separately formed, a substrate provided with the driver circuit is not always required to be attached to a substrate provided with a pixel portion, and may be attached to, for example, an FPC. FIG. 37B shows a mode of a display panel in which a signal line driver circuit 6023 is formed separately and is connected to a pixel portion 6022 and a scanning line driver circuit 6024 that are formed over a substrate 6021. The pixel portion 6022 and the scanning line driver circuit 6024 are each formed using a thin film transistor in which a microcrystalline semiconductor film is used for a channel formation region. The signal line driver circuit 6023 is connected to the pixel portion 6022 through an FPC 6025. The pixel portion 6022, the signal line driver circuit 6023, and the scanning line driver circuit 6024 are each supplied with potential of a power source, a variety of signals, and the like through the FPC 6025. Further, a protection circuit may be provided between the signal line driver circuit 6023 and the FPC 6025 or between the signal line driver circuit 6023 and the pixel portion 6022.

Figure 37C:
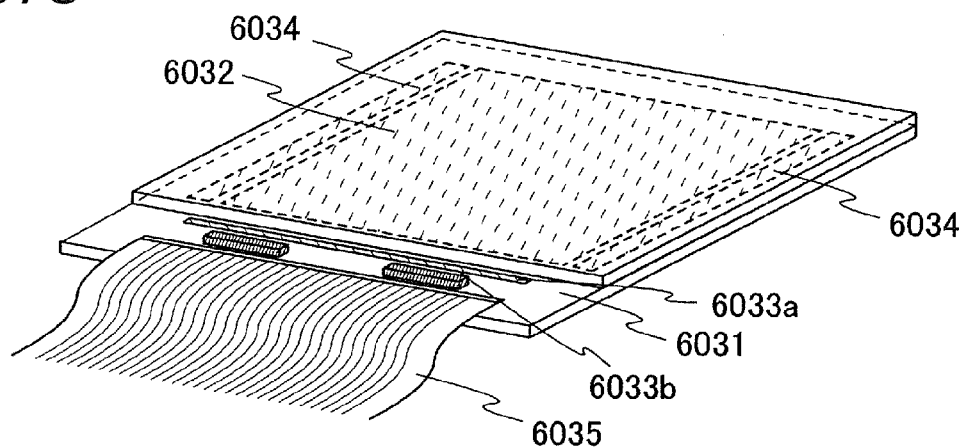

Furthermore, only a part of the signal line driver circuit or only a part of the scanning line driver circuit may be formed over the same substrate as that of the pixel portion with use of a thin film transistor in which a microcrystalline semiconductor film is used for a channel formation region, and the rest may be formed separately and electrically connected to the pixel portion. FIG. 37C shows a mode of a display panel in which an analog switch 6033a included in a signal driver circuit is formed over a substrate 6031, over which a pixel portion 6032 and a scanning line driver circuit 6034 are formed, and a shift register 6033b included in the signal line driver circuit is formed separately over a different substrate and then attached to the substrate 6031. The pixel portion 6032 and the scanning line driver circuit 6034 are each formed using a thin film transistor in which a microcrystalline semiconductor film is used for a channel formation region. The shift register 6033b included in the signal line driver circuit is connected to the pixel portion 6032 through an FPC 6035. The pixel portion 6032, the signal line driver circuit, and the scanning line driver circuit 6034 are each supplied with potential of a power source, a variety of signals, and the like through the FPC 6035. Further, a protection circuit may be provided between the signal line driver circuit and the FPC 6035 or between the signal line driver circuit and the pixel portion 6032.

As shown in FIGS. 37A to 37C, in the display device of this embodiment mode, an entire driver circuit or a part thereof can be formed over the same substrate as that of a pixel portion, using a thin film transistor in which a microcrystalline semiconductor films is used for a channel formation region.

Note that there is no particular limitation on a connection method of the substrate which is formed separately, and a known method such as a COG method, a wire bonding method, or a TAB method can be used. Further, a connection position is not limited to the position illustrated in FIGS. 37A to 37C, as long as electrical connection is possible. Furthermore, a controller, a CPU, a memory, and/or the like may be formed separately and connected.

Note that the signal line driver circuit used in the present invention includes a shift register and an analog switch. In addition to the shift register and the analog switch, another circuit such as a buffer, a level shifter, or a source follower may be included. Moreover, the shift register and the analog switch are not necessarily provided. For example, a different circuit such as a decoder circuit by which a signal line can be selected may be used instead of the shift register, or a latch or the like may be used instead of the analog switch.

Embodiment Mode 6

The display device obtained by the present invention and the like can be used for an active matrix display panel. That is, the present invention can be applied to all electronic devices in which the display panel is incorporated into a display portion.

Examples of such electronic devices include cameras such as video cameras and digital cameras, head-mounted displays (goggle-type displays), car navigation systems, projectors, car stereo sets, personal computers, and portable information terminals (e.g., mobile computers, mobile phones, and e-book readers). Examples of these devices are shown in FIGS. 38A to 38C.

Figure 38A:
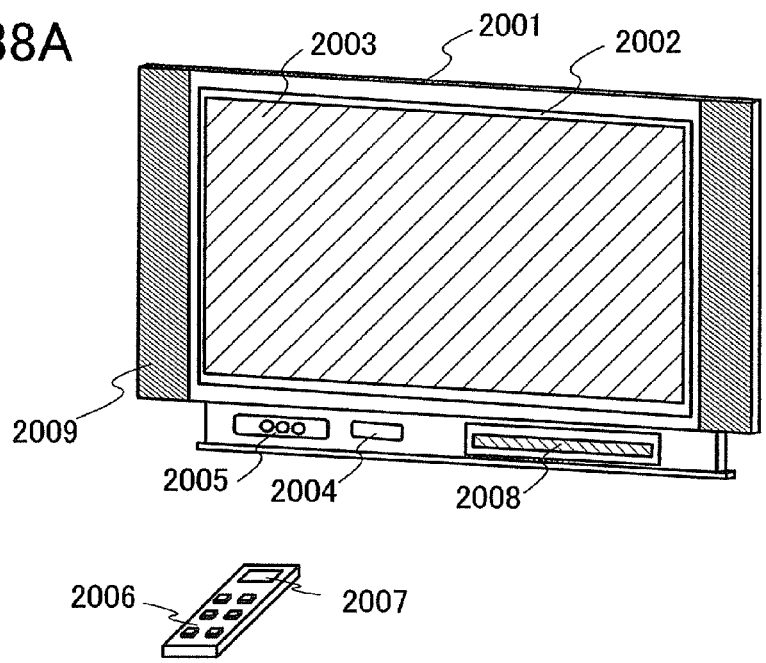
FIGS. 38A to 38C are perspective views illustrating electronic devices including display devices of the present invention.
Figure 38B:
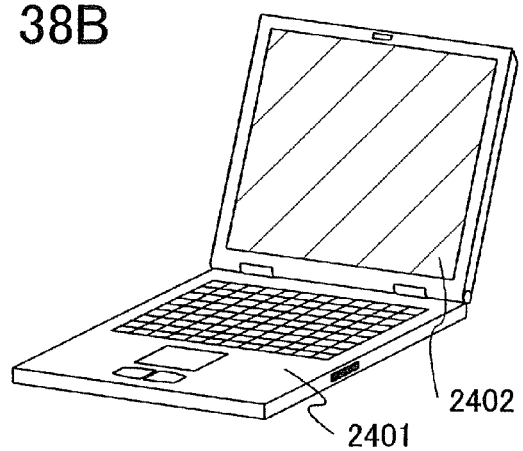
Figure 38C:
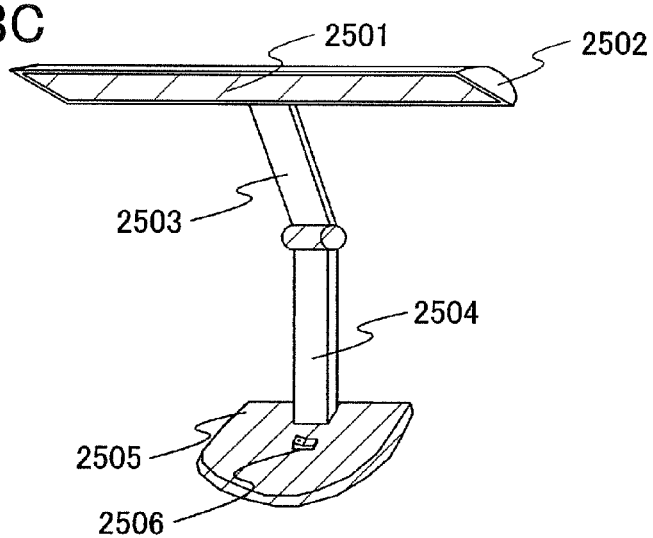

FIG. 38A shows a television device. A television device can be completed by incorporating a display panel into a housing as shown in FIG. 38A. A main screen 2003 is formed using the display panel, and a speaker portion 2009, operation switches, and the like are provided as other additional accessories. In such a manner, a television device can be completed.

As shown in FIG. 38A, a display panel 2002 using display elements is incorporated into a housing 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. Operation of the television device can be carried out using switches that are incorporated into the housing or by a remote control device 2006 provided separately. A display portion 2007 that displays information output may be provided for the remote control device 2006.

Further, the television device may include a sub-screen 2008 formed using a second display panel for displaying channels, volume, and the like, in addition to the main screen 2003. In this structure, the main screen 2003 may be formed with a liquid crystal display panel, and the sub-screen 2008 may be formed with a light-emitting display panel. In addition, in order to prioritize low power consumption, the main screen 2003 and the sub-screen 2008 may be each formed with a light-emitting display panel and the sub-screen 2008 may be set to be turned on and off.

Figure 39:
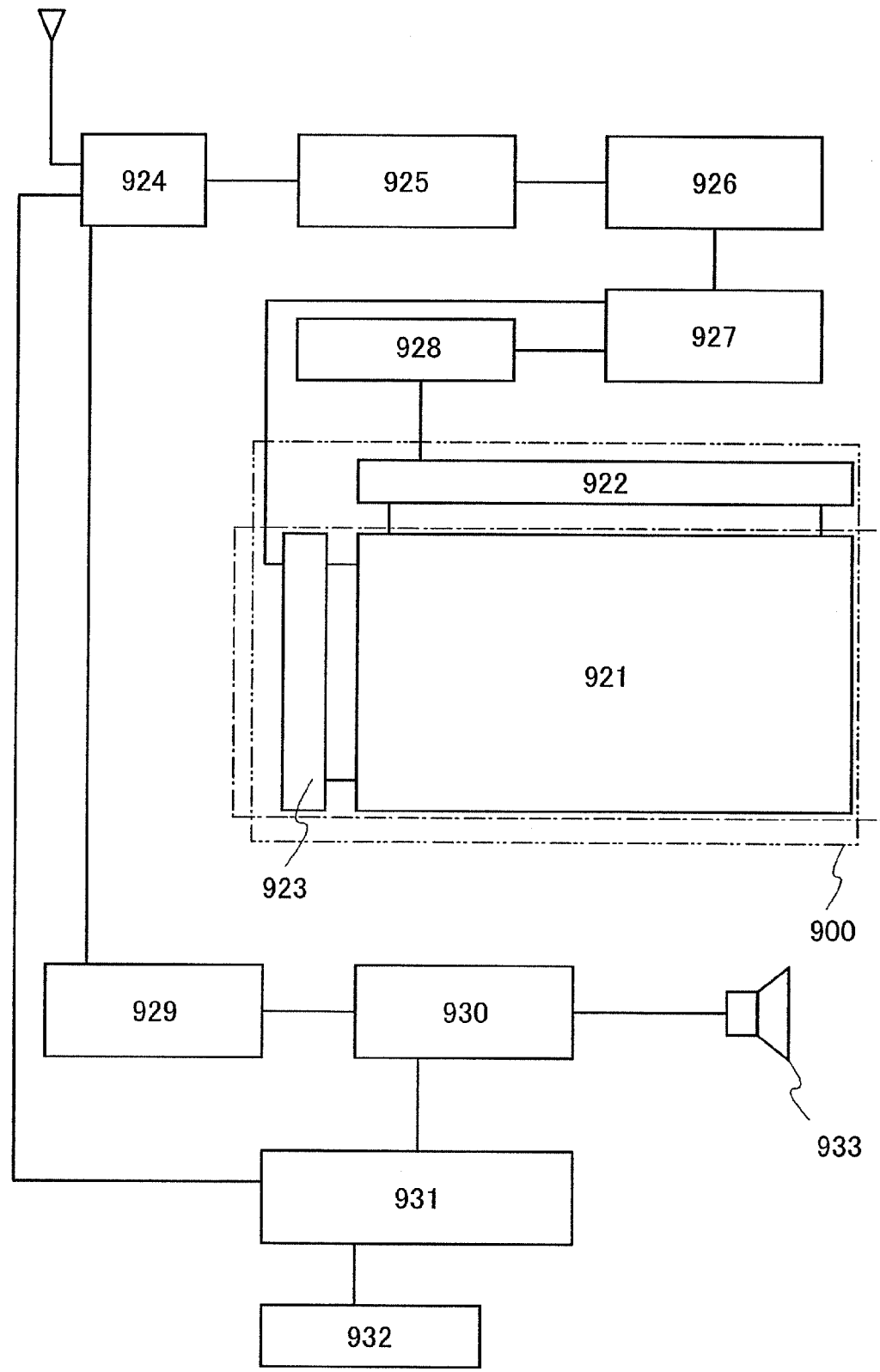
FIG. 39 is a diagram illustrating an electronic device including a display device of the present invention.

FIG. 39 is a block diagram showing the main structure of a television device. A display panel 900 is provided with a pixel portion 921. A signal line driver circuit 922 and a scanning line driver circuit 923 may be mounted on the display panel 900 by a COG method.

As structures of other external circuits, a video signal amplifier circuit 925 amplifying a video signal among signals received by a tuner 924, a video signal processing circuit 926 converting signals output from the video signal amplifier circuit 925 into chrominance signals corresponding to red, green, and blue, a control circuit 927 for converting the video signal into a signal which meets input specifications of a driver IC, and the like are provided on an input side of the video signal. The control circuit 927 outputs signals to the scanning line side and the signal line side. When digital driving is performed, a structure may be adopted in which a signal dividing circuit 928 is provided on the signal line side and an input digital signal is divided into m signals to be supplied.

An audio signal among signals received by the tuner 924 is sent to an audio signal amplifier circuit 929, and output from the audio signal amplifier circuit 929 is supplied to a speaker 933 through an audio signal processing circuit 930. A control circuit 931 receives control information on receiving station (receiving frequency) and volume from an input portion 932 and transmits a signal to the tuner 924 and the audio signal processing circuit 930.

It is needless to say that the present invention is not limited to a television device and can be applied to a variety of uses, such as a monitor of a personal computer, a large display medium such as an information display board at the train station, the airport, or the like, or an advertisement display board on the street.

The display device described in the above embodiment mode is applied to the main screen 2003 and the sub-screen 2008, so that mass productivity of the television device can be increased.

A portable computer shown in FIG. 38B includes a main body 2401, a display portion 2402, and the like. The display device described in the above embodiment mode is applied to the display portion 2402, so that mass productivity of the computer can be increased.

FIG. 38C shows a desk lamp including a lighting portion 2501, a shade 2502, an adjustable arm 2503, a support 2504, a base 2505, and a power source switch 2506. The desk lamp is manufactured using the light-emitting device of the present invention for the lighting portion 2501. Note that the lighting equipment includes a ceiling light, a wall light, and the like. Use of the display device shown in the above embodiment mode can increase mass productivity and provide inexpensive desk lamps.

Figure 40A:
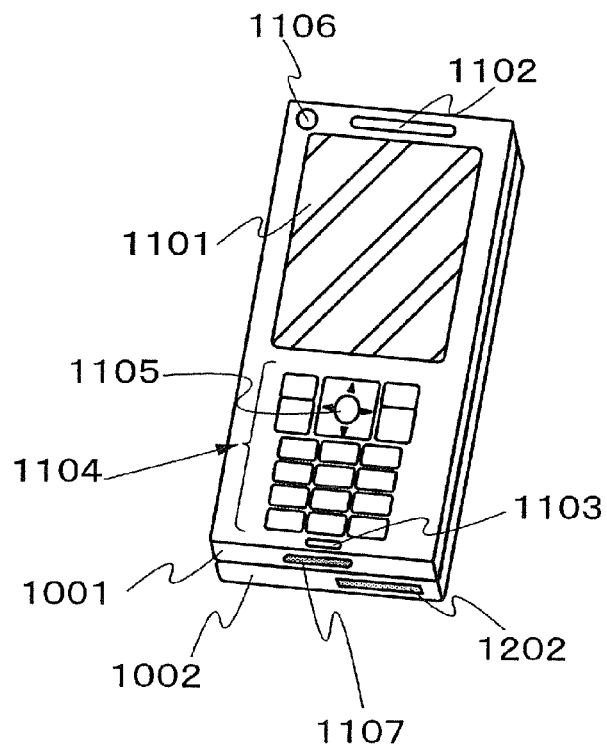
FIGS. 40A to 40C are drawings illustrating an electronic device including a display device of the present invention.
Figure 40B:
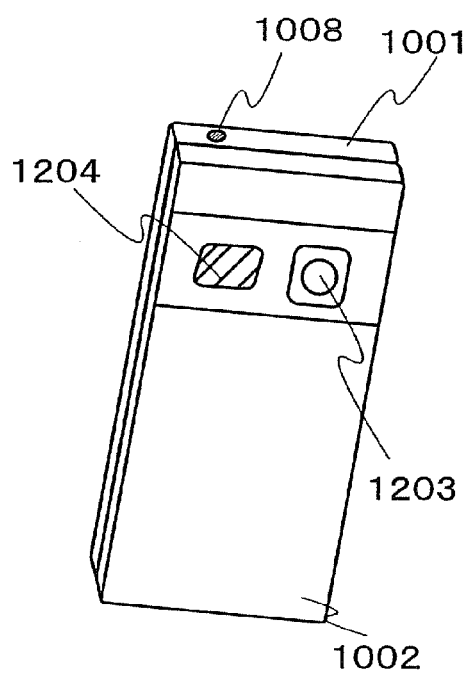
Figure 40C:
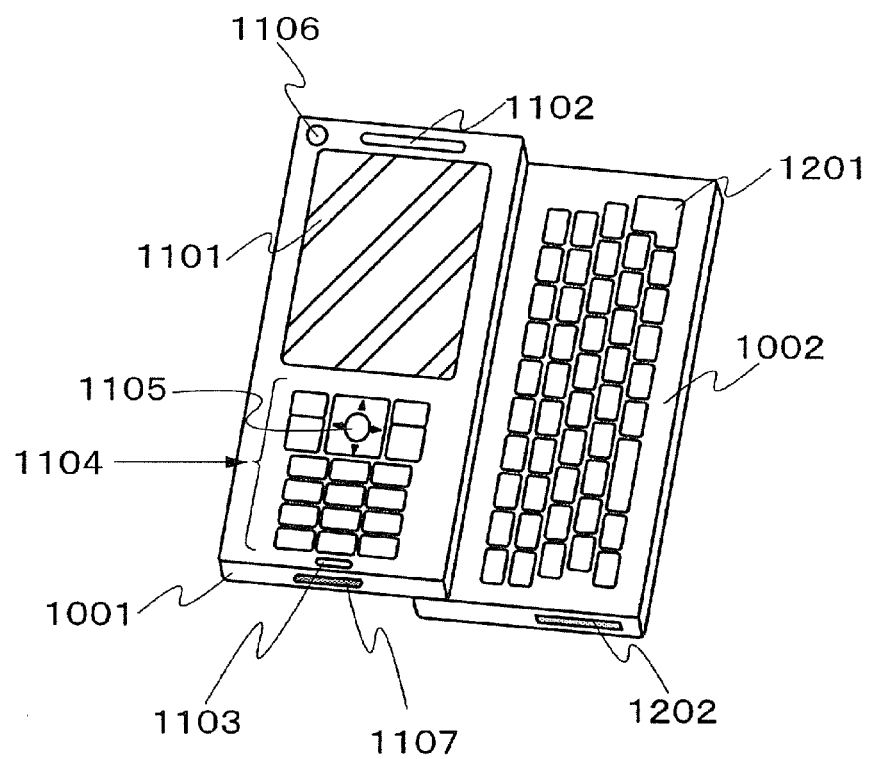

FIGS. 40A to 40C illustrate an example of a structure of a smartphone 1000 to which the present invention is applied. FIG. 40A is a front view, FIG. 40B is a rear view, and FIG. 40C is a development view. The smartphone 1000 has two housings 1001 and 1002. The smartphone 1000 has both a function of a mobile phone and a function of a portable information terminal, and incorporates a computer that is provided to conduct a variety of data processing in addition to verbal communication (voice calls); therefore, it is called a smartphone.

The smartphone 1000 has the two housings 1001 and 1002. The housing 1001 includes a display portion 1101, a speaker 1102, a microphone 1103, operation keys 1104, a pointing device 1105, a front camera lens 1106, a jack 1107 for an external connection terminal, an earphone terminal 1108, and the like, while the housing 1002 includes a keyboard 1201, an external memory slot 1202, a rear camera 1203, a light 1204, and the like. In addition, an antenna is incorporated in the housing 1001.

Further, in addition to the above structure, the smartphone may incorporate a non-contact IC chip, a small size memory device, or the like.

The housing 1001 and the housing 1002 which are put together to be lapped with each other (FIG. 40A) are developed by sliding as illustrated in FIG. 40C. In the display portion 1101, the display device described in the above embodiment mode can be incorporated, and a display direction can be changed depending on a use mode. Because the front camera lens 1106 is provided in the same plane as the display portion 1101, the smartphone can be used as a videophone. A still image and a moving image can be taken by the rear camera 1203 and the light 1204 by using the display portion 1101 as a viewfinder.

The speaker 1102 and the microphone 1103 can be used for videophone, recording, playback, and the like without being limited to verbal communication. With use of the operation keys 1104, operation of incoming and outgoing of calls, simple information input such as electronic mail, scrolling of a screen, cursor motion, and the like are possible.

If much information is needed to be treated, such as documentation, use as a portable information terminal, and the like, the use of the keyboard 1201 is convenient. When the housing 1001 and the housing 1002 which are put together to be lapped with each other (FIG. 40A) are developed by sliding as illustrated in FIG. 40C and the smartphone is used as a portable information terminal, smooth operation can be conducted by using the keyboard 1201 and the pointing device 1105. To the jack 1107 for an external connection terminal, an AC adaptor and various types of cables such as a USB cable can be connected, and charging and data communication with a personal computer or the like are possible. Moreover, by inserting a storage medium into the external memory slot 1202, a large amount of data can be stored and moved.

In the rear surface of the housing 1002 (FIG. 40B), the rear camera 1203 and the light 1204 are provided, and a still image and a moving image can be taken by using the display portion 1101 as a viewfinder.

Further, the smartphone may have an infrared communication function, a USB port, a function of receiving one segment television broadcast, a non-contact IC chip, an earphone jack, or the like, in addition to the above-described functions and structures.

By employing the display device described in the above embodiment mode, mass productivity of the smartphone can be increased.

Embodiment 1

A gate insulating film was formed over a glass substrate, a flush treatment was performed using phosphine, which is a gas including an impurity element which serves as a donor, and then, a microcrystalline silicon film was formed. A result of measuring peak concentrations of phosphorus by SIMS is shown below.

As the gate insulating film, a silicon oxynitride film with a thickness of 100 nm was formed over a glass substrate with a thickness of 0.7 mm by a plasma CVD method under the following condition: the RF power source frequency was 13.56 MHz, the power of the RF power source was 50 W, the film formation temperature was 280° C., the flow rates of silane and dinitrogen monoxide were 30 sccm and 1200 sccm, respectively, and the pressure was 40 Pa.

Then, a gas including phosphine was introduced to a reaction chamber to perform a flush treatment. The conditions at this time were as follows:
(Condition 1)
flow rate of 0.1% $PH_3$ (diluted with Ar): 500 sccm
(Condition 2)
flow rate of $SiH_4$: 100 sccm, flow rate of 0.5% $PH_3$ (diluted with $H_2$):170 sccm
(Condition 3)
flow rate of SiH: 100 sccm, flow rate of $H_2$: 153 sccm, flow rate of 0.5% $PH_3/H_2$: 17 sccm Next, a microcrystalline silicon film with a thickness of 50 nm was formed over the gate insulating film by a plasma CVD method under the following condition: the RF power source frequency was 13.56 MHz, the power of the RF power source was 50 W, the film formation temperature was 280° C., the flow rates of silane and hydrogen were 10 sccm and 1500 sccm, respectively, and the pressure was 280 Pa.

The substrate was carried out of the reaction chamber and the inside of the reaction chamber was cleaned with fluorine radicals. Then, the substrate was carried into the reaction chamber again.

Figure 41:
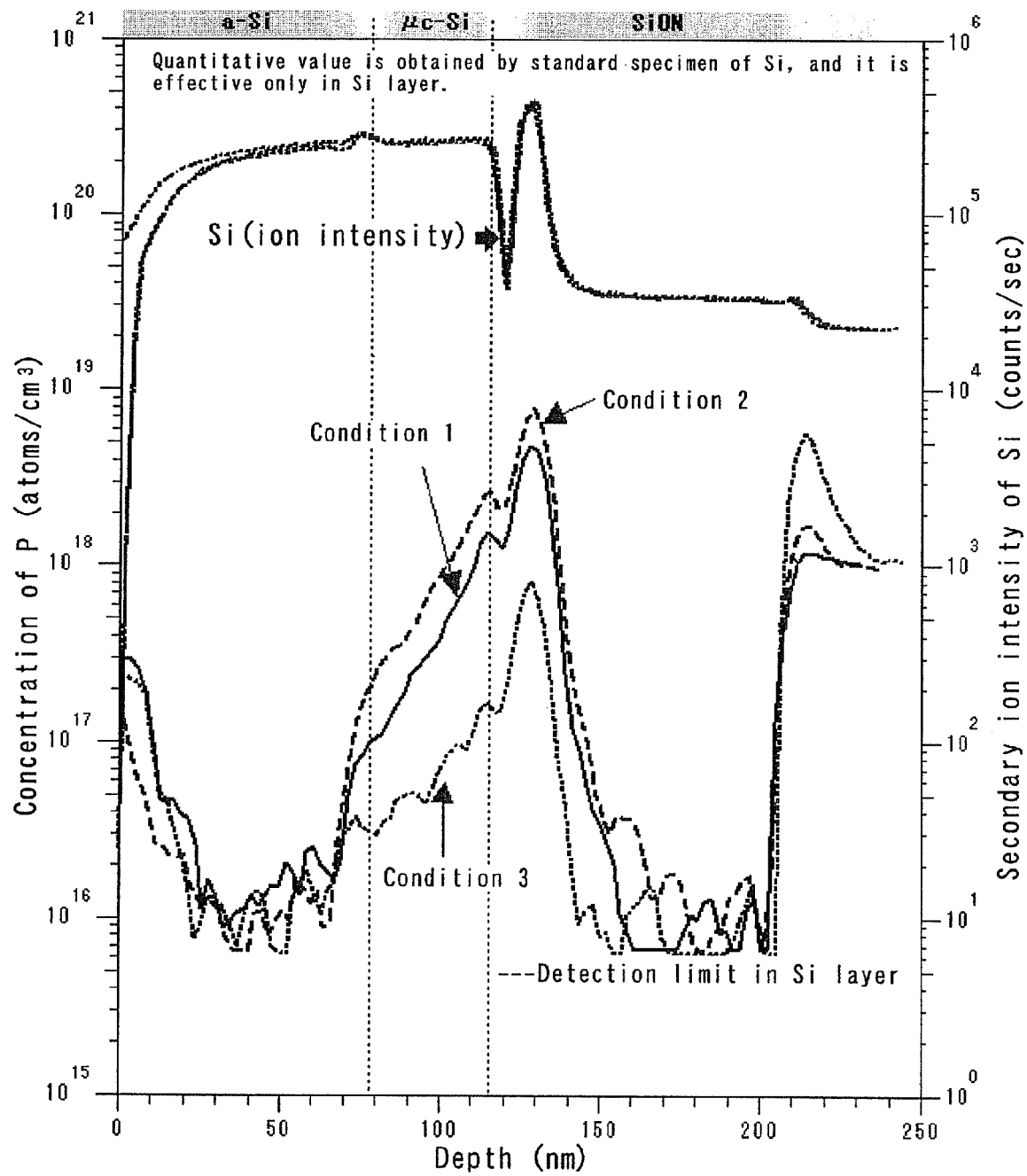
FIG. 41 is a graph illustrating a result of measuring phosphorus concentrations in microcrystalline silicon films of the present invention with SIMS.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz, the power of the RF power source was 60 W, the film formation temperature was 280° C., the flow rates of silane and hydrogen were 280 sccm and 300 sccm, respectively, and the pressure was 170 Pa. At this time, on each of the substrates which had undergone the flush treatments under the conditions 1 to 3, SIMS was performed in a direction of the depth from a surface of the substrate. FIG. 41 shows the measurement result. Here, values at a measurement point, three points before the measurement point, and three points behind the measurement point (seven points in total) are averaged and used to show an approximate curve schematically.

In FIG. 41, the vertical axis represents a concentration (atoms/cm$^3$) of phosphorus and the horizontal axis represents a depth (nm) to which a sample was etched. The layer from the surface to a depth of approximately 70 to 80 nm was the amorphous silicon film, which was the buffer layer; the layer from a depth of approximately 80 nm to a depth of approximately 120 nm was the microcrystalline silicon film; and the layer from a depth of approximately 120 nm to a depth of approximately 220 nm was the silicon oxynitride film, which was the gate insulating film.

The phosphorus concentrations in the microcrystalline silicon films in FIG. 41 are shown below. The layer from a depth of approximately 80 nm to a depth of approximately 115 nm is defined as a microcrystalline silicon film, and the phosphorus concentrations in the microcrystalline silicon films are shown below. Note that the phosphorus concentration at depths of from 115 to 130 nm approximately is excluded here because the secondary ionic strength of silicon is not in a normal condition due to the influence of the interface between the microcrystalline silicon film and the silicon oxynitride film.

| Sample under Condition 1: | $9.94 \times 10^{16}$ to $1.58 \times 10^{18}$ atoms/cm$^3$ |
| Sample under Condition 2: | $1.89 \times 10^{17}$ to $2.56 \times 10^{18}$ atoms/cm$^3$ |
| Sample under Condition 3: | $3.17 \times 10^{16}$ to $1.74 \times 10^{17}$ atoms/cm$^3$ |

In addition, a proportion of the thickness of when the concentration is changed (decreased) by one digit in the straight line passing through the concentration at depths of approximately 80 nm and the concentration at depths of approximately 115 nm ($\Delta$ thickness/log ($\Delta$ concentration)) is shown as for each sample.

| Sample under Condition 1: | 31 nm/dec |
| Sample under Condition 2: | 33 nm/dec |
| Sample under Condition 3: | 50 nm/dec |

As is seen from the above, by forming a microcrystalline silicon film after a phosphine flush treatment, a microcrystalline silicon film including phosphorus can be formed. In addition, the phosphorus concentration in the microcrystalline silicon film is decreased from the gate insulating film side toward the buffer layer.

Embodiment 2

A gate insulating film including phosphorus, which is an impurity element which serves as a donor, was formed over a glass substrate, and then a microcrystalline silicon film was formed. A result of measuring peak concentrations of phosphorus by SIMS is shown below. Here, a silicon oxynitride film was formed as a first gate insulating film so as to include phosphorus, and a silicon oxynitride film was formed as a second gate insulating film.

As the first gate insulating film, a silicon oxynitride film including phosphorus with a thickness of 10 nm was formed over a glass substrate with a thickness of 0.7 mm by a plasma CVD method under the following condition: the RF power source frequency was 13.56 MHz, the power of the RF power source was 50 W, the film formation temperature was 280° C., and the pressure was 40 Pa. The conditions of the flow rates of source gases are shown below.
(Condition 4)
flow rate of $SiH_4$: 30 sccm, flow rate of $N_2O$: 1200 sccm, flow rate of 0.5% $PH_3$ (diluted with $H_2$): 60 sccm
(Condition 5)
flow rate of $SiH_4$: 30 sccm, flow rate of $N_2O$: 1200 sccm, flow rate of 0.5% $PH_3$ (diluted with $H_2$): 6 sccm Next, the second gate insulating film was formed over the first gate insulating film. As the second gate insulating film, a silicon oxynitride film with a thickness of 100 nm was formed over the glass substrate by a plasma CVD method under the following condition: the RF power source frequency was 13.56 MHz, the power of the RF power source was 50 W, the film formation temperature was 280° C., the flow rates of silane and dinitrogen monoxide were 30 sccm and 1200 sccm, respectively, and the pressure was 40 Pa.

Next, a microcrystalline silicon film with a thickness of 50 nm was formed over the gate insulating films by a plasma CVD method under the following condition: the RF power source frequency was 13.56 MHz, the power of the RF power source was 50 W, the film formation temperature was 280° C., the flow rates of silane and hydrogen were 10 sccm and 1500 sccm, respectively, and the pressure was 280 Pa.

The substrate was carried out of a reaction chamber and the inside of the reaction chamber was cleaned with fluorine radicals. Then, the substrate was carried into the reaction chamber again.

Figure 42:
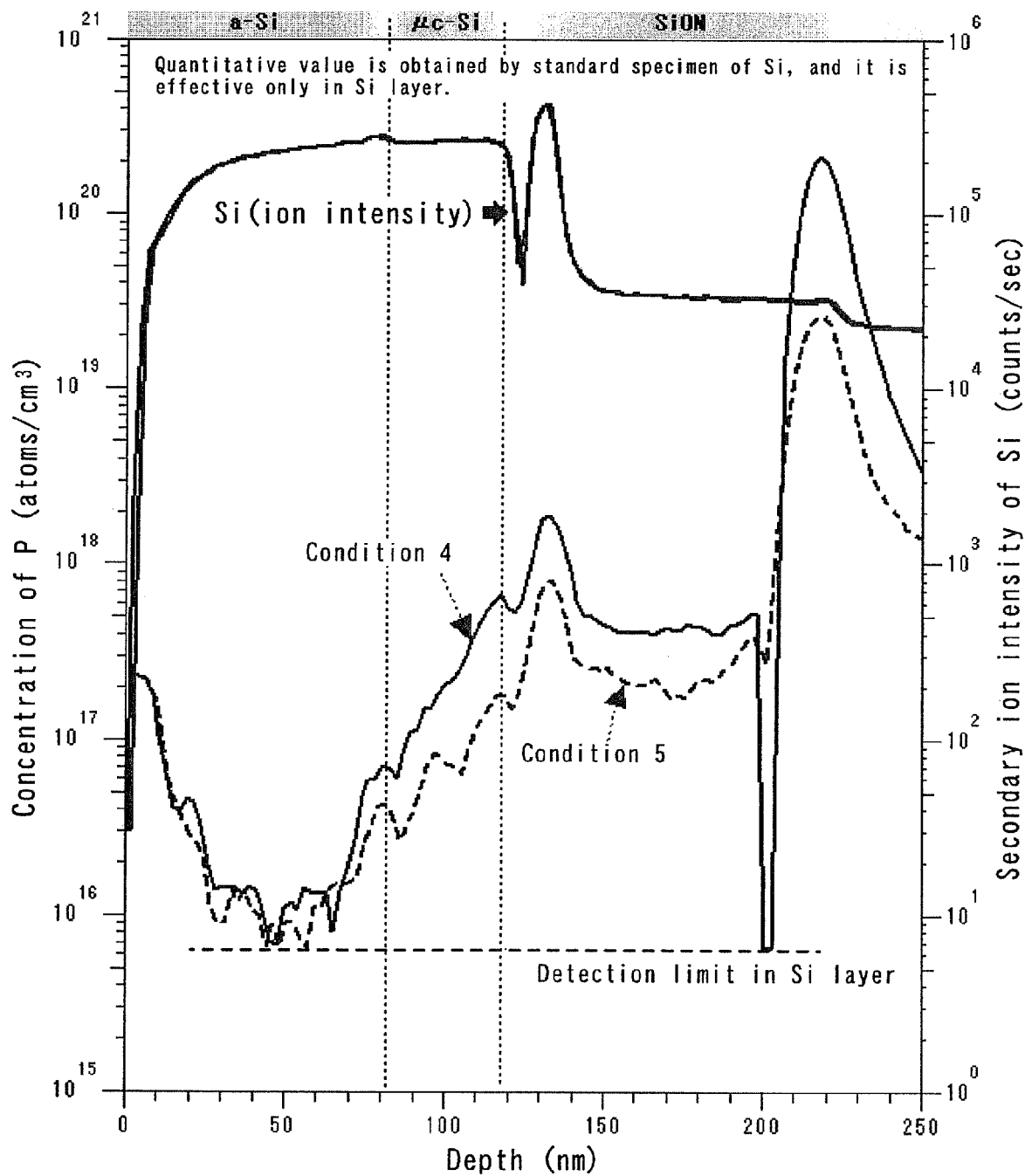
FIG. 42 is a graph illustrating a result of measuring phosphorus concentrations in microcrystalline silicon films of the present invention with SIMS.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz, the power of the RF power source was 60 W, the film formation temperature was 280° C., the flow rates of silane and hydrogen were 280 sccm and 300 sccm, respectively, and the pressure was 170 Pa. At this time, on each of the substrates over which the first gate insulating films had been formed under the conditions 4 and 5, SIMS was performed in a direction of the depth from a surface of the substrate. FIG. 42 shows the measurement result. Here, values at a measurement point, three points before the measurement point, and three points behind the measurement point (seven points in total) are averaged and used to show an approximate curve.

In FIG. 42, the vertical axis represents a concentration (atoms/cm$^3$) of phosphorus and the horizontal axis represents a depth (nm) to which a sample was etched. The layer from the surface to a depth of approximately 80 to 90 nm was the amorphous silicon film, which was the buffer layer; the layer from a depth of approximately 80 nm to a depth of approximately 130 nm was the microcrystalline silicon film; and the layer from a depth of approximately 120 nm to a depth of approximately 220 nm was the silicon oxynitride film, which was the gate insulating film.

FIG. 42 shows the phosphorus concentrations in the microcrystalline silicon films. The layer from a depth of approximately 85 nm to a depth of approximately 120 nm is defined as a microcrystalline silicon film, and the phosphorus concentrations in the microcrystalline silicon films are shown below. Note that the phosphorus concentration at depths of from 120 to 130 nm approximately is excluded here because the secondary ionic strength of silicon is not in a normal condition due to the influence of the interface between the microcrystalline silicon film and the silicon oxynitride film.

| | |
|---|---|
| Sample under Condition 4: | 7.17 × 10$^{16}$ to 6.72 × 10$^{17}$ atoms/cm$^3$ |
| Sample under Condition 5: | 4.24 × 10$^{16}$ to 1.82 × 10$^{17}$ atoms/cm$^3$ |

In addition, a proportion of the thickness of when the concentration is changed (decreased) by one digit in the straight line passing through the concentration at depths of 85 nm approximately and the concentration at depths of 120 nm approximately (Δ thickness/log (Δ concentration)) is shown as for each sample.

| | |
|---|---|
| Sample under Condition 4: | 38 nm/dec |
| Sample under Condition 5: | 58 nm/dec |

Although the concentration of phosphorus in the silicon oxynitride film cannot be measured accurately in FIG. 42 because it was quantified with a silicon standard sample, the peak form makes it possible to estimate whether phosphorus was included or not. There is a large peak of the phosphorus concentration also at depths of from 200 to 230 nm, which shows that the gate insulating film, which was not in contact with the microcrystalline silicon film, included phosphorus.

As is seen from the above, by forming a microcrystalline silicon film after forming a gate insulating film including phosphorus, the microcrystalline silicon film and the gate insulating film include phosphorus; in other words, a gate insulating film and a microcrystalline silicon film that include phosphorus can be formed. In addition, the phosphorus concentration in the microcrystalline silicon film is decreased from the gate insulating film side toward the buffer layer.

Embodiment 3

Figure 43:
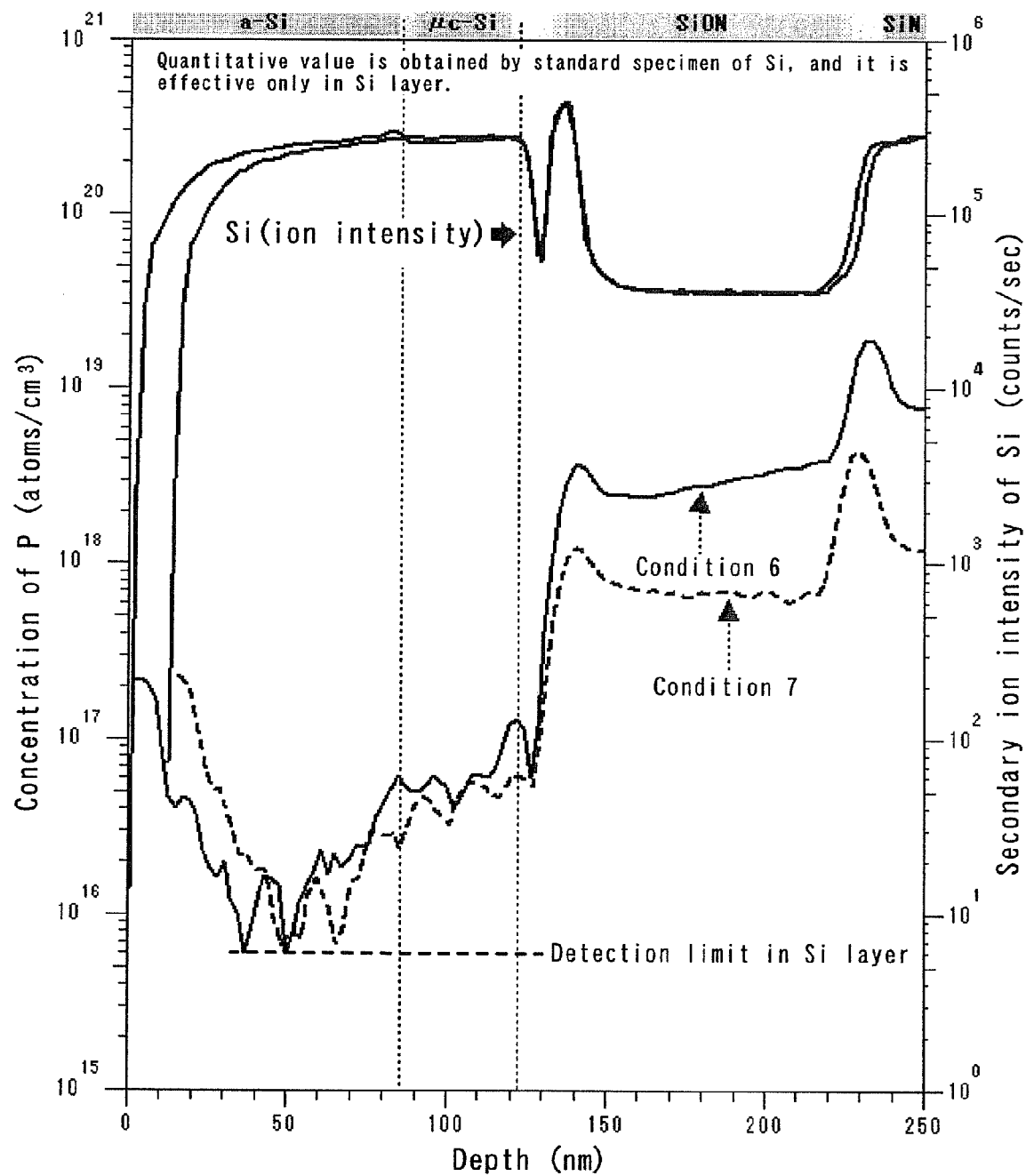
FIG. 43 is a graph illustrating a result of measuring phosphorus concentrations in microcrystalline silicon films of the present invention with SIMS.

After precoating the inner wall of a reaction chamber of a plasma CVD apparatus with a protective film, a glass substrate was carried into the reaction chamber, and a first gate insulating film, a second gate insulating film, a microcrystalline silicon film, and an amorphous silicon film functioning as a buffer layer were formed. FIG. 43 shows a result of measuring peak concentrations of phosphorus by SIMS. Here, a silicon nitride film was formed as the first gate insulating film, and a silicon oxynitride film was formed as the second gate insulating film.

The inner wall of the reaction chamber was precoated with the protective film. The condition at this time is described below.

(Condition 6)

An amorphous silicon film including phosphorus with a thickness of 50 nm was formed as the protective film on the inner wall of the reaction chamber under the following condition: the RF power source frequency was 13.56 MHz, the power of the RF power source was 60 W, and the pressure was 170 Pa. Further, the conditions of the flow rates of source gases are shown below.

flow rate of SiH$_4$: 100 sccm, flow rate of 0.5% PH$_3$ (diluted with H$_2$): 170 sccm (Condition 7)

A silicon nitride film, a silicon oxynitride film, and an amorphous silicon film were stacked as the protective film. At this time, the silicon nitride film was formed with a thickness of 110 nm on the inner wall of the reaction chamber under the following condition: the RF power source frequency was 13.56 MHz, the power of the RF power source was 370 W, the flow rates of silane, hydrogen, nitrogen, and ammonia were 10 sccm, 500 sccm, 550 sccm, and 140 sccm, respectively, and the pressure was 100 Pa. Further, the silicon oxynitride film was formed with a thickness of 110 nm over the silicon nitride film by a plasma CVD method under the following condition: the RF power source frequency was 13.56 MHz, the power of the RF power source was 50 W, the film formation temperature was 280° C., the flow rates of silane and dinitrogen monoxide were 30 sccm and 1200 sccm, respectively, and the pressure was 40 Pa. Furthermore, the amorphous silicon film was formed with a thickness of 200 nm over the silicon oxynitride film by a plasma CVD method under the following condition: the RF power source frequency was 13.56 MHz, the power of the RF power source was 120 W, the film formation temperature was 280° C., the flow rate of silane was 300 sccm, and the pressure was 170 Pa.

Next, a glass substrate with a thickness of 0.7 mm was carried into the reaction chamber, and then as the first gate insulating film, a silicon nitride film with a thickness of 100 nm was formed over the glass substrate by a plasma CVD method under the following condition: the RF power source frequency was 13.56 MHz, the power of the RF power source was 370 W, the film formation temperature was 280° C., the flow rates of silane, hydrogen, nitrogen, and ammonia were 10 sccm, 500 sccm, 550 sccm, and 140 sccm, respectively, and the pressure was 100 Pa.

Then, the second gate insulating film was formed over the first gate insulating film. As the second gate insulating film, a silicon oxynitride film with a thickness of 100 nm was formed over the glass substrate by a plasma CVD method under the following condition: the RF power source frequency was 13.56 MHz, the power of the RF power source was 50 W, the film formation temperature was 280° C., the flow rates of silane and dinitrogen monoxide were 30 sccm and 1200 sccm, respectively, and the pressure was 40 Pa.

Next, a microcrystalline silicon film with a thickness of 50 nm was formed over the gate insulating films by a plasma CVD method under the following condition: the RF power source frequency was 13.56 MHz, the power of the RF power source was 50 W, the film formation temperature was 280° C., the flow rates of silane and hydrogen were 10 sccm and 1500 sccm, respectively, and the pressure was 280 Pa.

The substrate was carried out of the reaction chamber and the inside of the reaction chamber was cleaned with fluorine radicals. Then, the substrate was carried into the reaction chamber again.

Next, an amorphous silicon film was formed as a buffer layer over the microcrystalline silicon film. The amorphous silicon film was formed with a thickness of 100 nm over the microcrystalline silicon film by a plasma CVD method under the following condition: the RF power source frequency was 13.56 MHz, the power of the RF power source was 60 W, the film formation temperature was 280° C., the flow rates of silane and hydrogen were 280 sccm and 300 sccm, respectively, and the pressure was 170 Pa. At this time, on each of the substrates which had undergone precoating of the inner wall of the reaction chamber under the conditions 6 and 7, SIMS was performed in a direction of the depth from a surface of the substrate. FIG. 43 shows the measurement result. Here, values at a measurement point, three points before the measurement point, and three points behind the measurement point (seven points in total) are averaged and used to show an approximate curve.

In FIG. 43, the vertical axis represents a concentration (atoms/cm$^3$) of phosphorus and the horizontal axis represents a depth (nm) to which a sample was etched. Further, the layer from the surface to a depth of approximately 85 nm was the amorphous silicon film, which was the buffer layer; the layer from a depth of approximately 85 nm to a depth of approximately 135 nm was the microcrystalline silicon film; and the layer from a depth of approximately 135 nm to a depth of approximately 220 nm was the silicon oxynitride film, which was the gate insulating film.

FIG. 43 shows the phosphorus concentrations in the microcrystalline silicon films. The layer from a depth of approximately 85 nm to a depth of approximately 122 nm is defined as a microcrystalline silicon film, and the phosphorus concentrations in the microcrystalline silicon films are shown below. Note that the phosphorus concentration at depths of from 122 to 135 nm approximately is excluded here because the secondary ionic strength of silicon is not in a normal condition due to the influence of the interface between the microcrystalline silicon film and the silicon oxynitride film.

| Sample under Condition 6: | 6.09 × 10$^{16}$ to 1.29 × 10$^{17}$ atoms/cm$^3$ |
| --- | --- |
| Sample under Condition 7: | 2.30 × 10$^{16}$ to 5.94 × 10$^{16}$ atoms/cm$^3$ |

In addition, a proportion of the thickness of when the concentration is changed (decreased) by one digit in the straight line passing through the concentration at depths of approximately 85 nm and the concentration at depths of approximately 122 nm (Δ thickness/log (Δ concentration)) is shown as for each sample.

| Sample under Condition 6: | 114 nm/dec |
| --- | --- |
| Sample under Condition 7: | 90 nm/dec |

As is seen from the above, by forming a gate insulating film and a microcrystalline silicon film after precoating the inner wall of a reaction chamber of a plasma CVD apparatus with an amorphous silicon film including phosphorus as a protective film, the microcrystalline silicon film includes phosphorus. In addition, by forming a gate insulating film and a microcrystalline silicon film after precoating the inner wall of a reaction chamber of a plasma CVD apparatus with an amorphous silicon film as a protective film, the microcrystalline silicon film includes phosphorus. This is probably because a residue of phosphine which is introduced to the reaction chamber before precoating the inner wall with the amorphous silicon film as a protective film is mixed into the protective film, and consequently, the microcrystalline silicon film includes phosphorus. Further, the phosphorus concentration in the microcrystalline silicon film is decreased from the gate insulating film side toward the buffer layer.

This application is based on Japanese Patent Application Serial No. 2007-275736 filed with Japan Patent Office on Oct. 23, 2007, the entire contents of which are hereby incorporated by reference.

What is claimed is:

1. A microcrystalline semiconductor film formed over an insulating film and including an impurity element serving as a donor,
    wherein a concentration of the impurity element decreases from the insulating film side toward an upper surface of the microcrystalline semiconductor film with a slope of from 5 to 120 nm/dec.

2. The microcrystalline semiconductor film according to claim 1, wherein the concentration of the impurity element has a peak at or around an interface between the insulating film and the microcrystalline semiconductor film.

3. The microcrystalline semiconductor film according to claim 1, wherein a peak concentration of the impurity element in the microcrystalline semiconductor film, which is obtained by secondary ion mass spectrometry (SIMS), is greater than or equal to 6×10$^{15}$ atoms/cm$^3$ and less than or equal to 3×10$^{18}$ atoms/cm$^3$.

4. The microcrystalline semiconductor film according to claim 1, wherein the impurity element is one selected from the group consisting of phosphorus, arsenic and antimony.

5. A thin film transistor comprising:
    a gate insulating film formed over a gate electrode;
    a first microcrystalline semiconductor film including an impurity element formed over the gate insulating film;
    a second microcrystalline semiconductor film formed over the first microcrystalline semiconductor film;
    a buffer layer formed over the second microcrystalline semiconductor film; and
    a pair of semiconductor films formed over the buffer layer,
    wherein the impurity element serves as a donor,
    wherein a concentration of the impurity element in the first microcrystalline semiconductor film decreases from the gate insulating film side toward the buffer layer, and
    wherein the second microcrystalline semiconductor film does not include the impurity element at a higher concentration than a detection limit of secondary ion mass spectrometry (SIMS).

6. The thin film transistor according to claim 5, wherein the buffer layer does not include the impurity element at a higher concentration than a detection limit of secondary ion mass spectrometry (SIMS).

7. The thin film transistor according to claim 5, wherein a peak concentration of the impurity element in the first microcrystalline semiconductor film, which is obtained by secondary ion mass spectrometry (SIMS), is greater than or equal to $6 \times 10^{15}$ atoms/cm$^3$ and less than or equal to $3 \times 10^{18}$ atoms/cm$^3$.

8. The thin film transistor according to claim 5, wherein the gate insulating film includes the impurity element which serves as the donor.

9. The thin film transistor according to claim 5, wherein the impurity element is one selected from the group consisting of phosphorus, arsenic and antimony.

10. A thin film transistor comprising:
a gate insulating film formed over a gate electrode;
a first microcrystalline semiconductor film including an impurity element formed over the gate insulating film;
a second microcrystalline semiconductor film formed over the first microcrystalline semiconductor film;
a buffer layer formed over the second microcrystalline semiconductor film; and
a pair of semiconductor films formed over the buffer layer, wherein the impurity element serves as a donor,
wherein a concentration of the impurity element has a peak at or around an interface between the gate insulating film and the first microcrystalline semiconductor film, and decreases from the gate insulating film side toward the buffer layer, and
wherein the second microcrystalline semiconductor film does not include the impurity element at a higher concentration than a detection limit of secondary ion mass spectrometry (SIMS).

11. The thin film transistor according to claim 10, wherein the buffer layer does not include the impurity element at a higher concentration than a detection limit of secondary ion mass spectrometry (SIMS).

12. The thin film transistor according to claim 10, wherein a peak concentration of the impurity element in the first microcrystalline semiconductor film, which is obtained by secondary ion mass spectrometry (SIMS), is greater than or equal to $6 \times 10^{15}$ atoms/cm$^3$ and less than or equal to $3 \times 10^{18}$ atoms/cm$^3$.

13. The thin film transistor according to claim 10, wherein the gate insulating film includes the impurity element which serves as the donor.

14. The thin film transistor according to claim 10, wherein the impurity element is one selected from the group consisting of phosphorus, arsenic and antimony.

15. A thin film transistor comprising:
a gate insulating film formed over a gate electrode;
a first microcrystalline semiconductor film including an impurity element formed over the gate insulating film;
a buffer layer formed over the first microcrystalline semiconductor film; and
a pair of semiconductor films formed over the buffer layer, wherein the impurity element serves as a donor, and
wherein a concentration of the impurity element in the first microcrystalline semiconductor film decreases from the gate insulating film side toward the buffer layer with a slope of from 5 to 120 nm/dec.

16. The thin film transistor according to claim 15, wherein the buffer layer does not include the impurity element at a higher concentration than a detection limit of secondary ion mass spectrometry (SIMS).

17. The thin film transistor according to claim 15, further comprising a second microcrystalline semiconductor film not including the impurity element at a higher concentration than a detection limit of secondary ion mass spectrometry (SIMS) between the first microcrystalline semiconductor film including the impurity element and the buffer layer.

18. The thin film transistor according to claim 15, wherein a peak concentration of the impurity element in the first microcrystalline semiconductor film, which is obtained by secondary ion mass spectrometry (SIMS), is greater than or equal to $6 \times 10^{15}$ atoms/cm$^3$ and less than or equal to $3 \times 10^{18}$ atoms/cm$^3$.

19. The thin film transistor according to claim 15, wherein the gate insulating film includes the impurity element which serves as the donor.

20. The thin film transistor according to claim 15, wherein the impurity element is one selected from the group consisting of phosphorus, arsenic and antimony.

21. A thin film transistor comprising:
a gate insulating film formed over a gate electrode;
a first microcrystalline semiconductor film including an impurity element formed over the gate insulating film;
a buffer layer formed over the first microcrystalline semiconductor film; and
a pair of semiconductor films formed over the buffer layer, wherein the impurity element serves as a donor, and
wherein a concentration of the impurity element has a peak at or around an interface between the gate insulating film and the first microcrystalline semiconductor film, and decreases from the gate insulating film side toward the buffer layer with a slope of from 5 to 120 nm/dec.

22. The thin film transistor according to claim 21, wherein the buffer layer does not include the impurity element at a higher concentration than a detection limit of secondary ion mass spectrometry (SIMS).

23. The thin film transistor according to claim 21, further comprising a second microcrystalline semiconductor film not including the impurity element at a higher concentration than a detection limit of secondary ion mass spectrometry (SIMS) between the first microcrystalline semiconductor film including the impurity element and the buffer layer.

24. The thin film transistor according to claim 21, wherein a peak concentration of the impurity element in the first microcrystalline semiconductor film, which is obtained by secondary ion mass spectrometry (SIMS), is greater than or equal to $6 \times 10^{15}$ atoms/cm$^3$ and less than or equal to $3 \times 10^{18}$ atoms/cm$^3$.

25. The thin film transistor according to claim 21, wherein the gate insulating film includes the impurity element which serves as the donor.

26. The thin film transistor according to claim 21, wherein the impurity element is one selected from the group consisting of phosphorus, arsenic and antimony.

27. A display device comprising the thin film transistor according to any one of claims 5, 10, 15 and 21 and a pixel electrode electrically connected to the thin film transistor.

28. A microcrystalline semiconductor film formed over an insulating film and including an impurity element serving as a donor,
wherein a concentration of the impurity element decreases from the insulating film side toward an upper surface of the microcrystalline semiconductor film, and
wherein a peak concentration of the impurity element in the microcrystalline semiconductor film, which is obtained by secondary ion mass spectrometry (SIMS), is greater than or equal to $6 \times 10^{15}$ atoms/cm$^3$ and less than or equal to $3 \times 10^{18}$ atoms/cm$^3$.

29. The microcrystalline semiconductor film according to claim 28, wherein the concentration of the impurity element has a peak at or around an interface between the insulating film and the microcrystalline semiconductor film.

30. The microcrystalline semiconductor film according to claim 28, wherein the impurity element is one selected from the group consisting of phosphorus, arsenic and antimony.

31. A thin film transistor comprising:
a gate insulating film formed over a gate electrode;
a first microcrystalline semiconductor film including an impurity element formed over the gate insulating film;
a second microcrystalline semiconductor film formed over the first microcrystalline semiconductor film;
a buffer layer formed over the second microcrystalline semiconductor film; and
a pair of semiconductor films formed over the buffer layer,
wherein the impurity element serves as a donor,
wherein a concentration of the impurity element in the first microcrystalline semiconductor film decreases from the gate insulating film side toward the buffer layer, and
wherein a peak concentration of the impurity element in the first microcrystalline semiconductor film, which is obtained by secondary ion mass spectrometry (SIMS), is greater than or equal to $6\times10^{15}$ atoms/cm$^3$ and less than or equal to $3\times10^{18}$ atoms/cm$^3$.

32. The microcrystalline semiconductor film according to claim 31, wherein the concentration of the impurity element has a peak at or around an interface between the insulating film and the microcrystalline semiconductor film.

33. The thin film transistor according to claim 31, wherein the gate insulating film includes the impurity element which serves as the donor.

34. The microcrystalline semiconductor film according to claim 31, wherein the impurity element is one selected from the group consisting of phosphorus, arsenic and antimony.

35. A thin film transistor comprising:
a gate insulating film formed over a gate electrode;
a first microcrystalline semiconductor film including an impurity element formed over the gate insulating film;
a second microcrystalline semiconductor film formed over the first microcrystalline semiconductor film;
a buffer layer formed over the second microcrystalline semiconductor film; and
a pair of semiconductor films formed over the buffer layer,
wherein the impurity element serves as a donor,
wherein a concentration of the impurity element in the first microcrystalline semiconductor film decreases from the gate insulating film side toward the buffer layer, and
wherein the gate insulating film includes the impurity element which serves as the donor.

36. The microcrystalline semiconductor film according to claim 35, wherein the concentration of the impurity element has a peak at or around an interface between the insulating film and the microcrystalline semiconductor film.

37. The microcrystalline semiconductor film according to claim 35, wherein the impurity element is one selected from the group consisting of phosphorus, arsenic and antimony.

38. A thin film transistor comprising:
a gate insulating film formed over a gate electrode;
a first microcrystalline semiconductor film including an impurity element formed over the gate insulating film;
a second microcrystalline semiconductor film formed over the first microcrystalline semiconductor film;
a buffer layer formed over the second microcrystalline semiconductor film; and
a pair of semiconductor films formed over the buffer layer,
wherein the impurity element serves as a donor, and
wherein a concentration of the impurity element has a peak at or around an interface between the gate insulating film and the first microcrystalline semiconductor film, and decreases from the gate insulating film side toward the buffer layer, and
wherein a peak concentration of the impurity element in the first microcrystalline semiconductor film, which is obtained by secondary ion mass spectrometry (SIMS), is greater than or equal to $6\times10^{15}$ atoms/cm$^3$ and less than or equal to $3\times10^{18}$ atoms/cm$^3$.

39. The thin film transistor according to claim 38, wherein the buffer layer does not include the impurity element at a higher concentration than a detection limit of secondary ion mass spectrometry (SIMS).

40. The thin film transistor according to claim 38, wherein the gate insulating film includes the impurity element which serves as the donor.

41. The thin film transistor according to claim 38, wherein the impurity element is one selected from the group consisting of phosphorus, arsenic and antimony.

42. A thin film transistor comprising:
a gate insulating film formed over a gate electrode;
a first microcrystalline semiconductor film including an impurity element formed over the gate insulating film;
a second microcrystalline semiconductor film formed over the first microcrystalline semiconductor film;
a buffer layer formed over the second microcrystalline semiconductor film; and
a pair of semiconductor films formed over the buffer layer,
wherein the impurity element serves as a donor, and
wherein a concentration of the impurity element has a peak at or around an interface between the gate insulating film and the first microcrystalline semiconductor film, and decreases from the gate insulating film side toward the buffer layer, and
wherein the gate insulating film includes the impurity element which serves as the donor.

43. The thin film transistor according to claim 42, wherein the buffer layer does not include the impurity element at a higher concentration than a detection limit of secondary ion mass spectrometry (SIMS).

44. The thin film transistor according to claim 42, wherein the impurity element is one selected from the group consisting of phosphorus, arsenic and antimony.

45. A device comprising:
a microcrystalline semiconductor film formed over an insulating film and including an impurity element serving as a donor;
wherein a concentration of the impurity element decreases from the insulating film side toward an upper surface of the microcrystalline semiconductor film with a slope of from 5 to 120 nm/dec.

46. The device according to claim 45, wherein the device is a display device.

47. A device comprising:
a microcrystalline semiconductor film formed over an insulating film and including an impurity element serving as a donor;
wherein a concentration of the impurity element decreases from the insulating film side toward an upper surface of the microcrystalline semiconductor film, and
wherein a peak concentration of the impurity element in the microcrystalline semiconductor film, which is obtained by secondary ion mass spectrometry (SIMS), is greater than or equal to $6\times10^{15}$ atoms/cm$^3$ and less than or equal to $3\times10^{18}$ atoms/cm$^3$.

48. The device according to claim 47, wherein the device is a display device.

* * * * *